(12) United States Patent
Kimura

(10) Patent No.: US 11,604,391 B2
(45) Date of Patent: Mar. 14, 2023

(54) LIQUID CRYSTAL DISPLAY DEVICE

(71) Applicant: SEMICONDUCTOR ENERGY LABORATORY CO., LTD., Atsugi (JP)

(72) Inventor: Hajime Kimura, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/116,731

(22) Filed: Dec. 9, 2020

(65) Prior Publication Data

US 2021/0088864 A1 Mar. 25, 2021

Related U.S. Application Data

(60) Continuation of application No. 16/519,110, filed on Jul. 23, 2019, now Pat. No. 10,901,283, which is a
(Continued)

(30) Foreign Application Priority Data

Nov. 14, 2008 (JP) ................. 2008-292197

(51) Int. Cl.
*G09G 3/3233* (2016.01)
*G02F 1/1362* (2006.01)
(Continued)

(52) U.S. Cl.
CPC .. *G02F 1/136286* (2013.01); *G02F 1/133528* (2013.01); *G09G 3/20* (2013.01);
(Continued)

(58) Field of Classification Search
CPC ......... G02F 1/136286; G02F 1/133528; G02F 1/133638; G09G 3/20; G09G 3/3233;
(Continued)

(56) References Cited

U.S. PATENT DOCUMENTS 3,939,644 A 2/1976 Woif
5,161,024 A 11/1992 Oishi
(Continued)

FOREIGN PATENT DOCUMENTS

EP 0801376 A 10/1997
EP 1445862 A 8/2004
(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Carolyn R Edwards
(74) *Attorney, Agent, or Firm* — Nixon Peabody LLP; Jeffrey L. Costellia

(57) ABSTRACT

To suppress a malfunction of a circuit due to deterioration in a transistor. In a transistor which continuously outputs signals having certain levels (e.g., L-level signals) in a pixel or a circuit, the direction of current flowing through the transistor is changed (inverted). That is, by changing the level of voltage applied to a first terminal and a second terminal (terminals serving as a source and a drain) every given period, the source and the drain are switched every given period. Specifically, in a portion which successively outputs signals having certain levels (e.g., L-level signals) in a circuit including a transistor, L-level signals having a plurality of different potentials (L-level signals whose potentials are changed every given period) are used as the signals having certain levels.

11 Claims, 28 Drawing Sheets

Related U.S. Application Data continuation of application No. 15/668,737, filed on Aug. 4, 2017, now Pat. No. 10,416,517, which is a continuation of application No. 13/488,475, filed on Jun. 5, 2012, now abandoned, which is a division of application No. 12/614,926, filed on Nov. 9, 2009, now Pat. No. 8,232,947.

(51) Int. Cl.
| | |
|---|---|
| *G09G 3/20* | (2006.01) |
| *G09G 3/36* | (2006.01) |
| *G11C 19/28* | (2006.01) |
| *G02F 1/1335* | (2006.01) |
| *H01L 51/05* | (2006.01) |
| *G02F 1/13363* | (2006.01) |

(52) U.S. Cl.
CPC ......... *G09G 3/3233* (2013.01); *G09G 3/3677* (2013.01); *G11C 19/28* (2013.01); *H01L 51/0554* (2013.01); *G02F 1/133638* (2021.01); *G09G 2300/0408* (2013.01); *G09G 2300/0417* (2013.01); *G09G 2300/0847* (2013.01); *G09G 2310/0254* (2013.01); *G09G 2310/0267* (2013.01); *G09G 2310/0286* (2013.01); *G09G 2310/0291* (2013.01); *G09G 2310/08* (2013.01); *G09G 2320/043* (2013.01); *H01L 51/0575* (2013.01)

(58) Field of Classification Search
CPC ......... G09G 3/3677; G09G 2300/0408; G09G 2300/0417; G09G 2300/0847; G09G 2310/0254; G09G 2310/0267; G09G 2310/0286; G09G 2310/0291; G09G 2310/08; G09G 2320/043; G09G 3/3648; G09G 2230/00; G11C 19/28; H01L 51/0554; H01L 51/0575
See application file for complete search history.

(56) References Cited

U.S. PATENT DOCUMENTS

| | | | |
|---|---|---|---|
| 5,666,133 A | 9/1997 | Matsuo et al. | |
| 5,731,856 A | 3/1998 | Kim et al. | |
| 5,744,864 A | 4/1998 | Cillessen et al. | |
| 5,825,343 A | 10/1998 | Moon | |
| 5,949,398 A | 9/1999 | Kim | |
| 6,052,426 A | 4/2000 | Maurice | |
| 6,084,580 A | 7/2000 | Takahashi et al. | |
| 6,294,274 B1 | 9/2001 | Kawazoe et al. | |
| 6,373,456 B1 | 4/2002 | Matsubara | |
| 6,462,725 B1 * | 10/2002 | Orisaka ................ | G09G 3/3688 345/98 |
| 6,529,178 B1 | 3/2003 | Kimura | |
| 6,563,174 B2 | 5/2003 | Kawasaki et al. | |
| 6,727,522 B1 | 4/2004 | Kawasaki et al. | |
| 7,038,653 B2 | 5/2006 | Moon | |
| 7,049,119 B2 | 5/2006 | Takeda et al. | |
| 7,061,014 B2 | 6/2006 | Hosono et al. | |
| 7,064,346 B2 | 6/2006 | Kawasaki et al. | |
| 7,078,275 B2 | 7/2006 | Hiroshima et al. | |
| 7,105,868 B2 | 9/2006 | Nause et al. | |
| 7,211,825 B2 | 5/2007 | Shih et al. | |
| 7,262,463 B2 | 8/2007 | Hoffman | |
| 7,282,782 B2 | 10/2007 | Hoffman et al. | |
| 7,289,593 B2 * | 10/2007 | Tobita ................ | G11C 19/28 377/79 |
| 7,297,977 B2 | 11/2007 | Hoffman et al. | |
| 7,317,779 B2 | 1/2008 | Moon et al. | |
| 7,323,356 B2 | 1/2008 | Hosono et al. | |
| 7,342,568 B2 * | 3/2008 | Wei ................ | G11C 19/28 326/97 |
| 7,365,725 B2 | 4/2008 | Nakayoshi et al. | |
| 7,385,224 B2 | 6/2008 | Ishii et al. | |
| 7,402,506 B2 | 7/2008 | Levy et al. | |
| 7,406,146 B2 * | 7/2008 | Yu ................ | G11C 19/28 377/64 |
| 7,411,209 B2 | 8/2008 | Endo et al. | |
| 7,436,923 B2 | 10/2008 | Tobita | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,486,269 B2 | 2/2009 | Moon | |
| 7,492,853 B2 | 2/2009 | Tobita | |
| 7,501,293 B2 | 3/2009 | Ito et al. | |
| 7,528,820 B2 | 5/2009 | Yoon et al. | |
| 7,633,477 B2 | 12/2009 | Jang et al. | |
| 7,636,412 B2 | 12/2009 | Tobita | |
| 7,646,841 B2 | 1/2010 | Moon et al. | |
| 7,674,650 B2 | 3/2010 | Akimoto et al. | |
| 7,724,864 B2 * | 5/2010 | Kim ................ | G09G 3/3677 377/64 |
| 7,732,819 B2 | 6/2010 | Akimoto et al. | |
| 7,859,511 B2 | 12/2010 | Umezaki | |
| 7,932,888 B2 | 4/2011 | Miyake | |
| 7,936,331 B2 | 5/2011 | Uh et al. | |
| 7,978,274 B2 | 7/2011 | Umezaki et al. | |
| 8,023,610 B2 | 9/2011 | Miyayama et al. | |
| 8,054,279 B2 | 11/2011 | Umezaki et al. | |
| 8,204,170 B2 | 6/2012 | Lin et al. | |
| 8,223,109 B2 * | 7/2012 | Chang ................ | G11C 19/28 345/100 |
| 8,232,941 B2 | 7/2012 | Yeo et al. | |
| 8,232,947 B2 | 7/2012 | Kimura | |
| 8,330,492 B2 | 12/2012 | Umezaki | |
| 8,458,396 B2 | 6/2013 | Umezaki | |
| 8,462,100 B2 | 6/2013 | Umezaki | |
| 8,508,459 B2 | 8/2013 | Miyake | |
| 8,520,159 B2 | 8/2013 | Umezaki et al. | |
| 8,531,376 B2 | 9/2013 | Shimoda | |
| 8,564,523 B2 | 10/2013 | Moon | |
| 8,605,027 B2 | 12/2013 | Pak et al. | |
| 8,643,586 B2 | 2/2014 | Umezaki | |
| 8,742,811 B2 | 6/2014 | Umezaki | |
| 8,743,044 B2 | 6/2014 | Umezaki et al. | |
| 8,766,901 B2 | 7/2014 | Miyake | |
| 8,902,145 B2 | 12/2014 | Umezaki et al. | |
| 8,908,115 B2 | 12/2014 | Umezaki et al. | |
| 9,064,753 B2 | 6/2015 | Miyake | |
| 9,263,468 B2 | 2/2016 | Umezaki et al. | |
| 9,406,699 B2 | 8/2016 | Umezaki | |
| 9,606,408 B2 | 3/2017 | Umezaki et al. | |
| 10,048,558 B2 | 8/2018 | Umezaki et al. | |
| 10,325,932 B2 | 6/2019 | Umezaki | |
| 10,416,517 B2 | 9/2019 | Kimura | |
| 10,527,902 B2 | 1/2020 | Umezaki et al. | |
| 10,901,283 B2 | 1/2021 | Kimura | |
| 11,133,335 B2 | 9/2021 | Umezaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0167026 A1 | 11/2002 | Azami | |
| 2003/0043104 A1 | 3/2003 | Lee et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0046729 A1 * | 3/2004 | Moon ................ | G11C 19/28 345/100 |
| 2004/0127038 A1 | 7/2004 | Carcia et al. | |
| 2004/0165692 A1 | 8/2004 | Moon et al. | |
| 2004/0178977 A1 | 9/2004 | Nakayoshi et al. | |
| 2005/0001805 A1 | 1/2005 | Jeon et al. | |
| 2005/0017302 A1 | 1/2005 | Hoffman | |
| 2005/0199059 A1 | 9/2005 | Chiang et al. | |
| 2005/0220262 A1 * | 10/2005 | Moon ................ | G11C 19/28 377/64 |
| 2005/0236650 A1 | 10/2005 | Edwards et al. | |
| 2006/0001637 A1 | 1/2006 | Pak et al. | |
| 2006/0035452 A1 | 2/2006 | Carcia et al. | |
| 2006/0043377 A1 | 3/2006 | Hoffman et al. | |

(56) References Cited

U.S. PATENT DOCUMENTS

| | | |
|---|---|---|
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0132182 A1 | 6/2006 | Kikuchi |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0220587 A1* | 10/2006 | Tobita .................. G11C 19/184 |
| | | 315/194 |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0264172 A1 | 12/2006 | Ishii |
| 2006/0284171 A1 | 12/2006 | Levy et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0046327 A1* | 3/2007 | Wei ........................ G11C 19/28 |
| | | 326/46 |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0248204 A1 | 10/2007 | Tobita |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296662 A1 | 12/2007 | Lee et al. |
| 2008/0006877 A1 | 1/2008 | Mardilovich et al. |
| 2008/0012818 A1 | 1/2008 | Lee et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0219401 A1 | 9/2008 | Tobita |
| 2008/0224133 A1 | 9/2008 | Park et al. |
| 2008/0238852 A1* | 10/2008 | Tsai ........................ G09G 3/20 |
| | | 345/98 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266234 A1 | 10/2008 | Ieong et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167741 A1* | 7/2009 | Tsai ...................... G09G 3/3674 |
| | | 345/211 |
| 2009/0278122 A1 | 11/2009 | Hosono et al. |
| 2009/0280600 A1 | 11/2009 | Hosono et al. |
| 2010/0026619 A1 | 2/2010 | Umezaki |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0122988 A1 | 5/2011 | Miyayama et al. |
| 2012/0236224 A1 | 9/2012 | Kimura |
| 2013/0107154 A1 | 5/2013 | Umezaki |
| 2014/0145187 A1 | 5/2014 | Umezaki |
| 2015/0137118 A1 | 5/2015 | Umezaki et al. |
| 2015/0206495 A1* | 7/2015 | Xu ....................... G09G 3/3677 |
| | | 345/94 |
| 2020/0150473 A1 | 5/2020 | Umezaki et al. |
| 2022/0005835 A1 | 1/2022 | Umezaki |

FOREIGN PATENT DOCUMENTS

| | | |
|---|---|---|
| EP | 1737044 A | 12/2006 |
| EP | 1895545 A | 3/2008 |
| EP | 1906414 A | 4/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-165431 A | 7/1993 |
| JP | 05-251705 A | 9/1993 |
| JP | 05-297826 A | 11/1993 |
| JP | 05-346571 A | 12/1993 |
| JP | 06-082753 A | 3/1994 |
| JP | 08-264794 A | 10/1996 |
| JP | 10-031202 A | 2/1998 |
| JP | 11-505377 | 5/1999 |
| JP | 2000-028992 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-078172 A | 3/2004 |
| JP | 2004-103226 A | 4/2004 |
| JP | 2004-103957 A | 4/2004 |
| JP | 2004-246358 A | 9/2004 |
| JP | 2004-271969 A | 9/2004 |
| JP | 2004-273614 A | 9/2004 |
| JP | 2004-273732 A | 9/2004 |
| JP | 2005-534971 | 11/2005 |
| JP | 2006-024350 A | 1/2006 |
| JP | 2006-189762 A | 7/2006 |
| JP | 2006-344306 A | 12/2006 |
| JP | 2006-351165 A | 12/2006 |
| JP | 2006-351171 A | 12/2006 |
| JP | 2007-004167 A | 1/2007 |
| JP | 2007-207413 A | 8/2007 |
| JP | 2007-250052 A | 9/2007 |
| JP | 2007-293995 A | 11/2007 |
| JP | 2008-009393 A | 1/2008 |
| JP | 2008-083692 A | 4/2008 |
| JP | 2008-089915 A | 4/2008 |
| JP | 2008-107807 A | 5/2008 |
| JP | 2008-122939 A | 5/2008 |
| JP | 2008-140490 A | 6/2008 |
| JP | 2008-165223 A | 7/2008 |
| JP | 2008-187780 A | 8/2008 |
| JP | 2008-193545 A | 8/2008 |
| JP | 2008-217902 A | 9/2008 |
| JP | 2008-251094 A | 10/2008 |
| JP | 2021-064434 A | 4/2021 |
| KR | 2006-0072051 A | 6/2006 |
| KR | 2006-0129697 A | 12/2006 |
| KR | 10-2130466 | 7/2020 |
| TW | 200609885 | 3/2006 |
| WO | WO-1995/031804 | 11/1995 |
| WO | WO-2004/013836 | 2/2004 |

(56) References Cited

FOREIGN PATENT DOCUMENTS

| WO | WO-2004/114391 | 12/2004 |
|----|----------------|---------|
| WO | WO-2007/080813 | 7/2007  |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp, 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al. "65.2:Distinguished Paper:World-Largest (6.5") Flexible Full Color Top Emission. AMOLED Display on Plastic Film and Its Bending Properties", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn-Oxide TFTs", IDW '09 : Proceedings of the 15th International Display Workshops, 2009, pp. 689-892.

Park.J et al., "Amorphous Indium-Gallium Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al, "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 396-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev, A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp, 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Taiwanese Office Action (Application No. 98138437) dated Sep. 24, 2014.

\* cited by examiner

FIG. 3A period T1
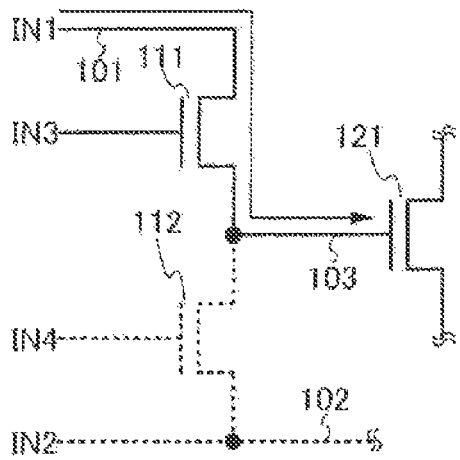
FIG. 3B period T2
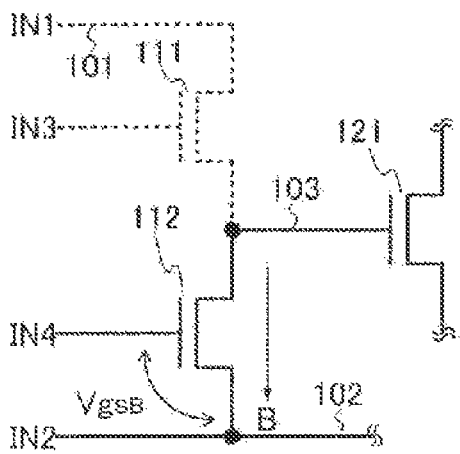
FIG. 3C period T3
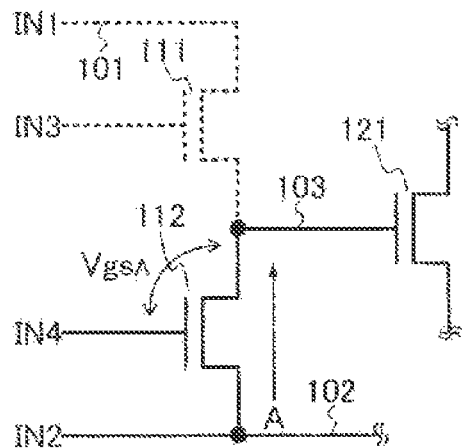
FIG. 3D period Tn
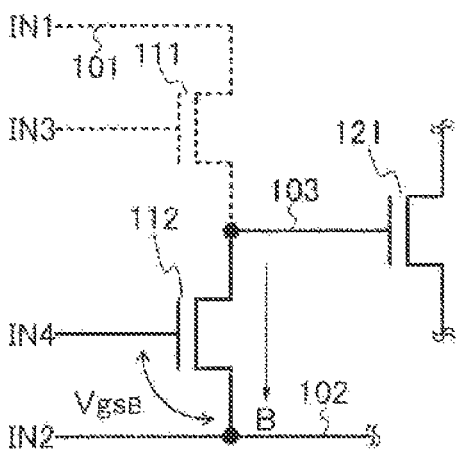
FIG. 3E period T(n+1)
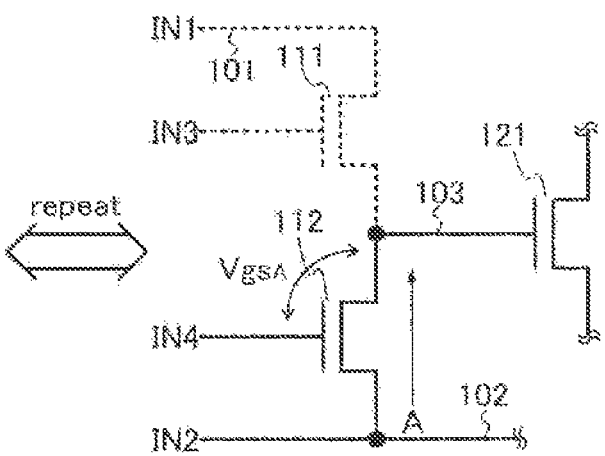

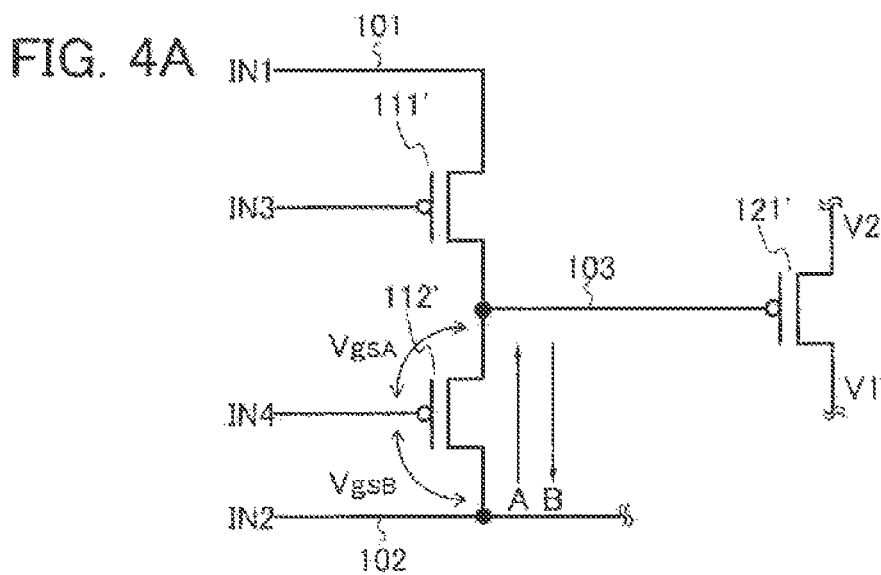
FIG. 4A
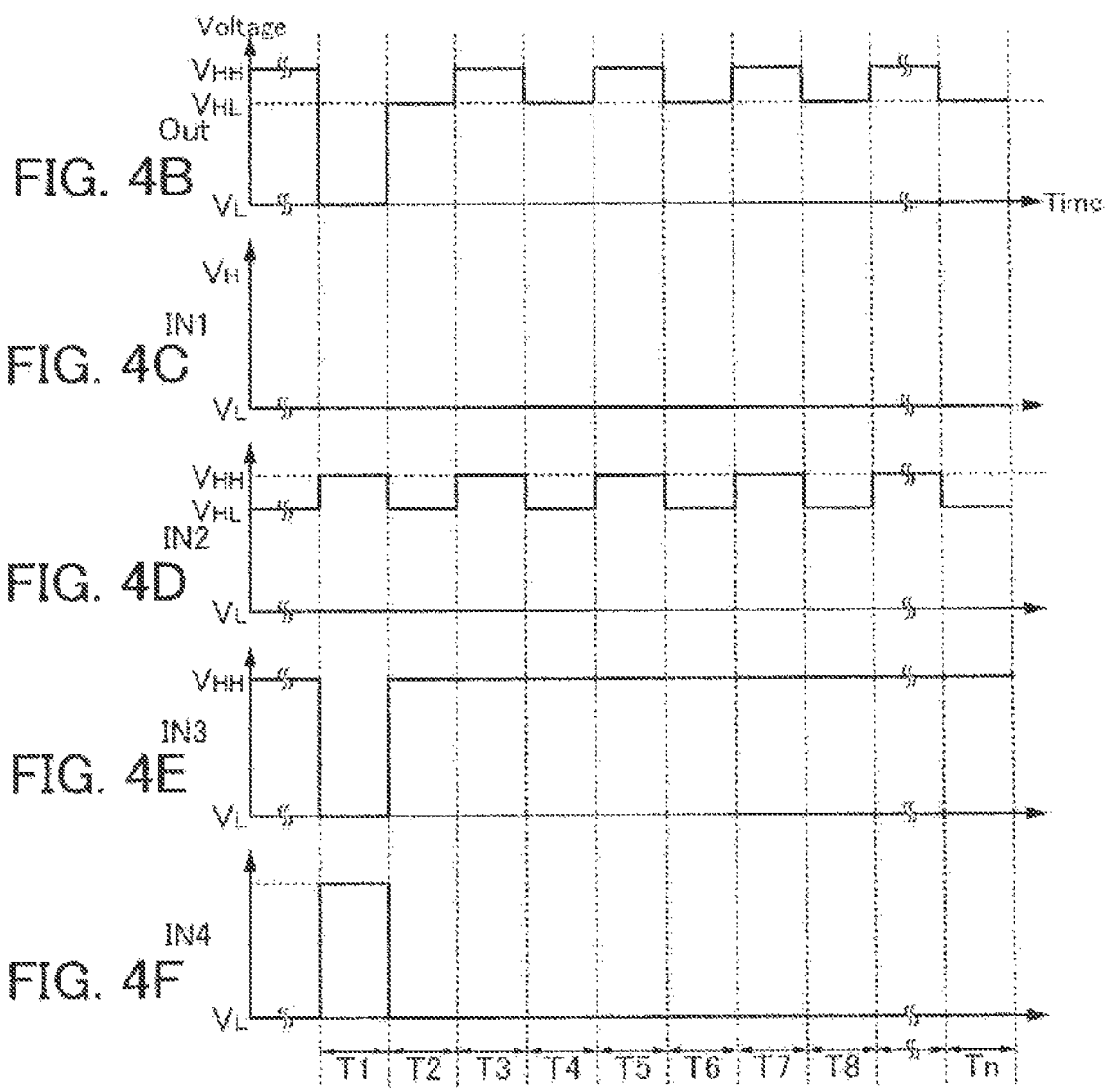
FIG. 4B
FIG. 4C
FIG. 4D
FIG. 4E
FIG. 4F

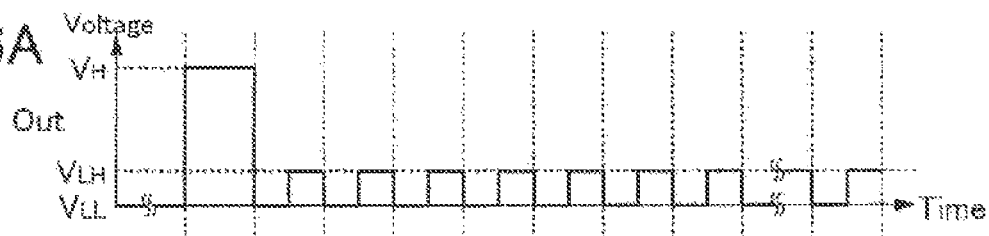
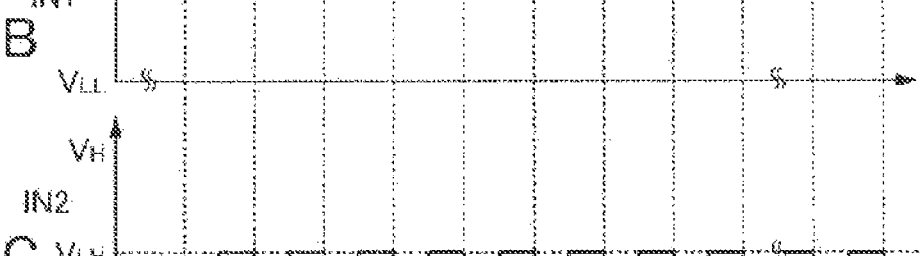
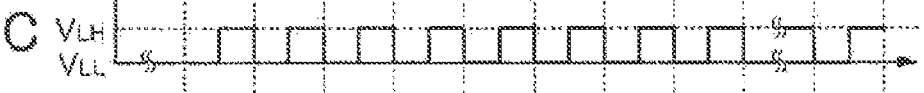
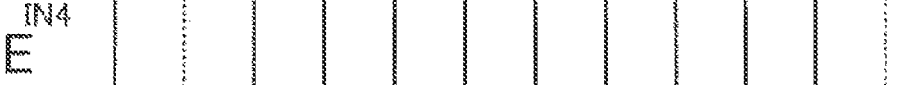

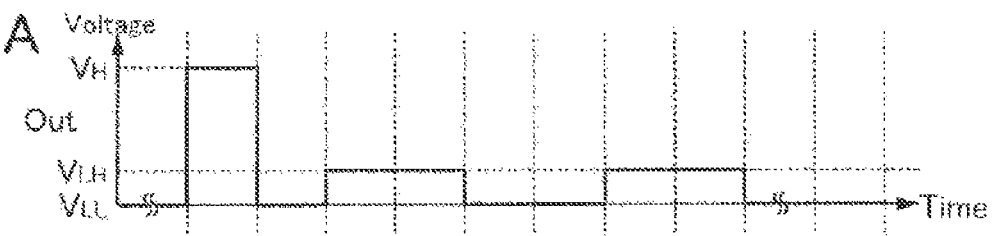
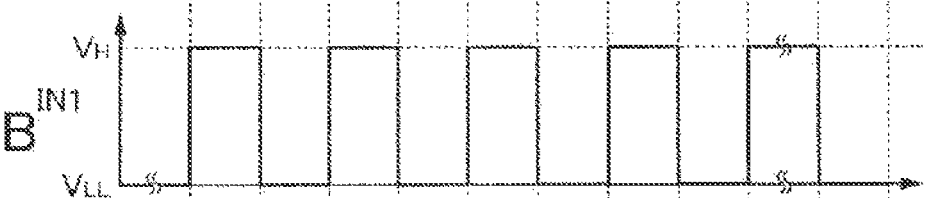
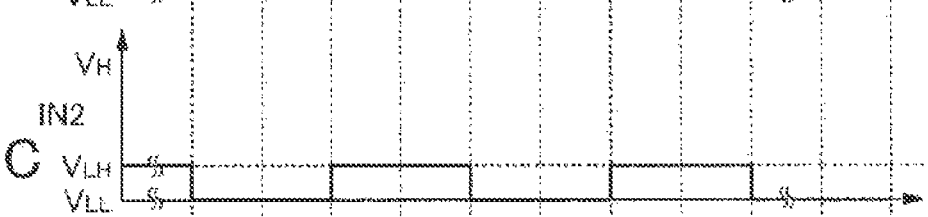
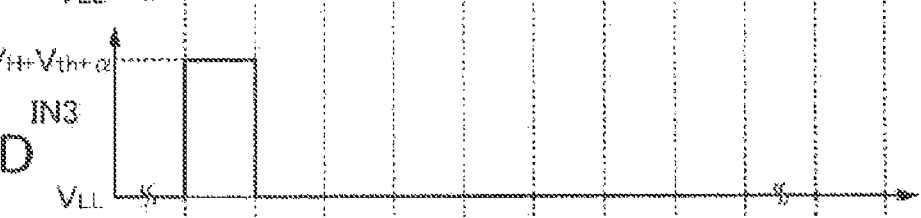
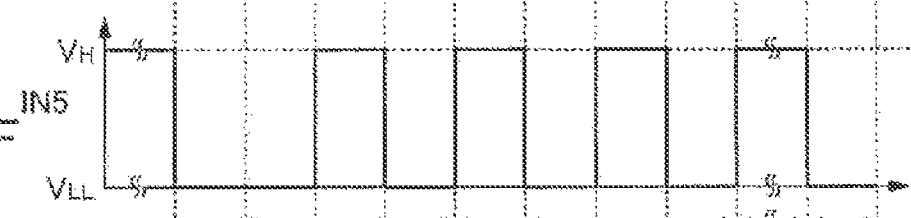
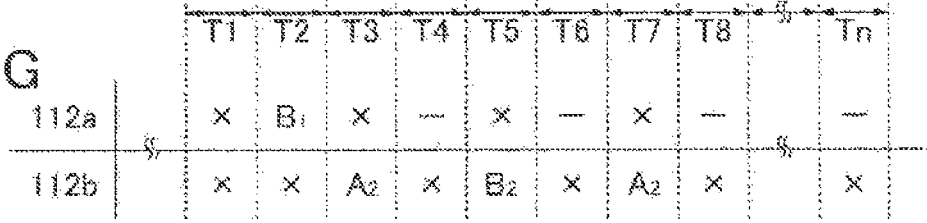

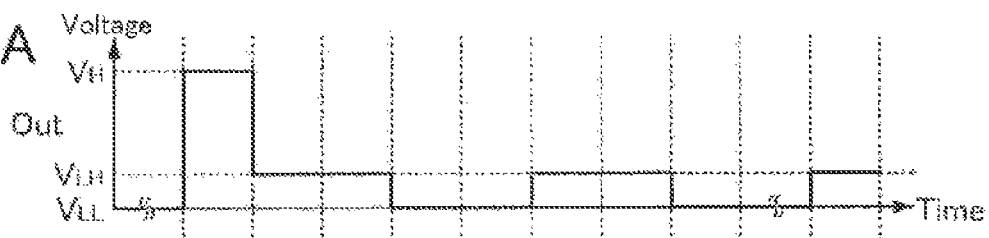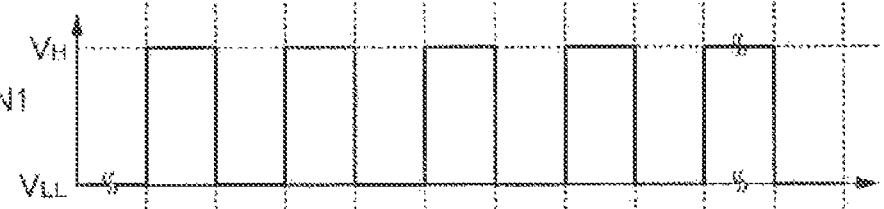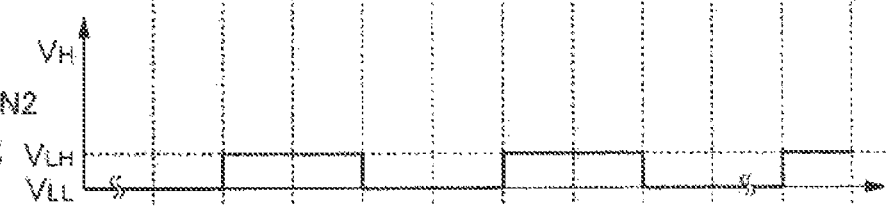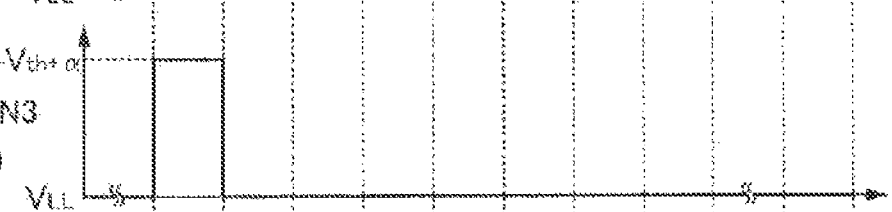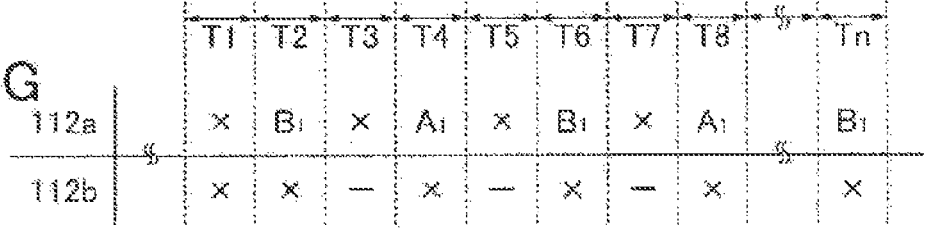

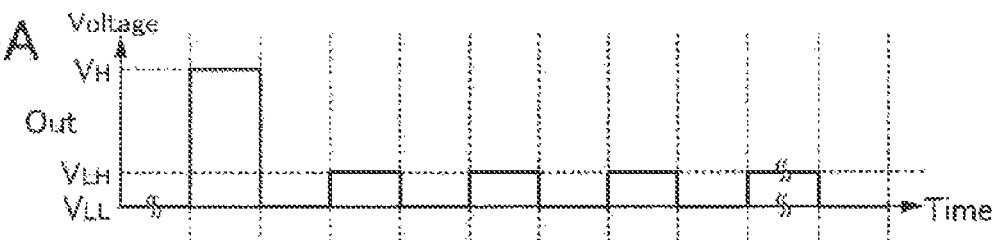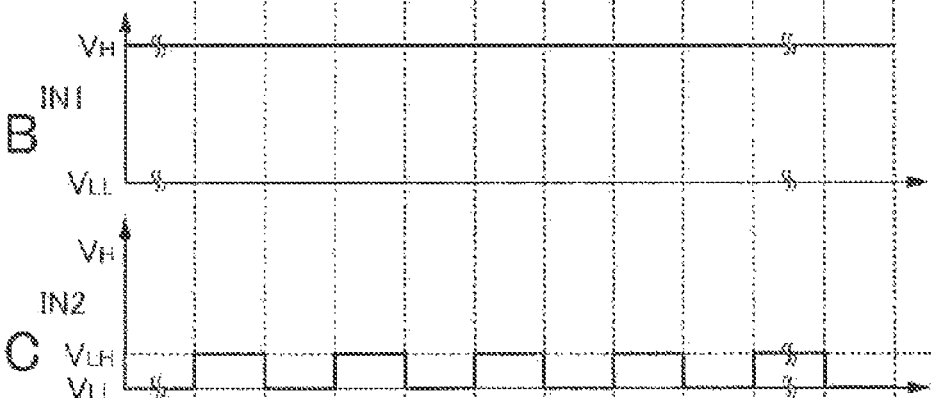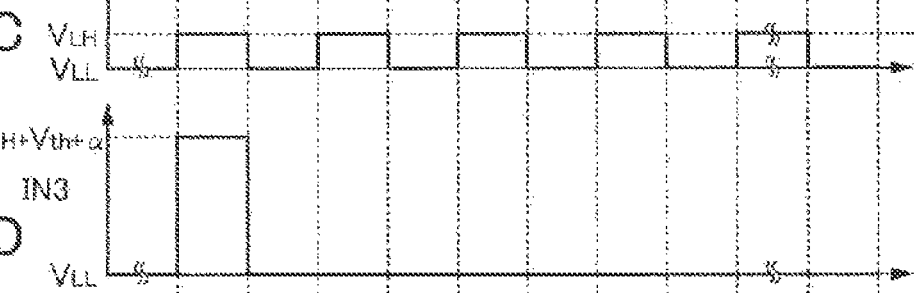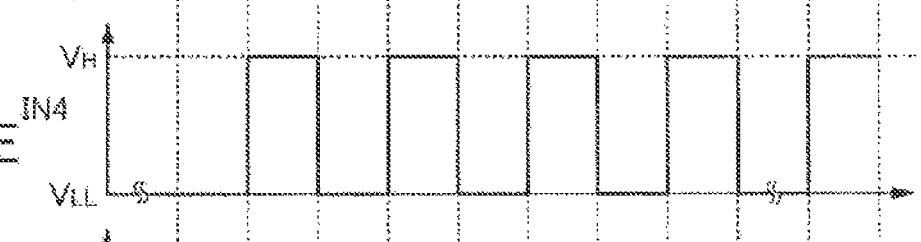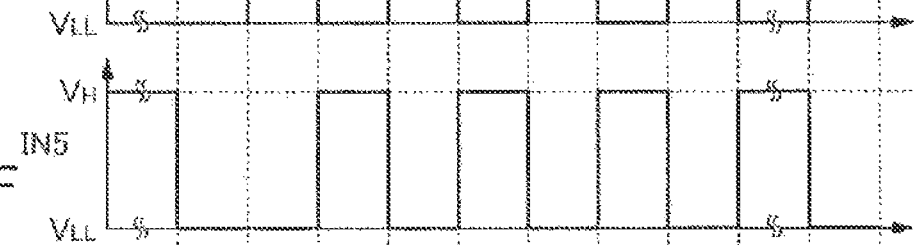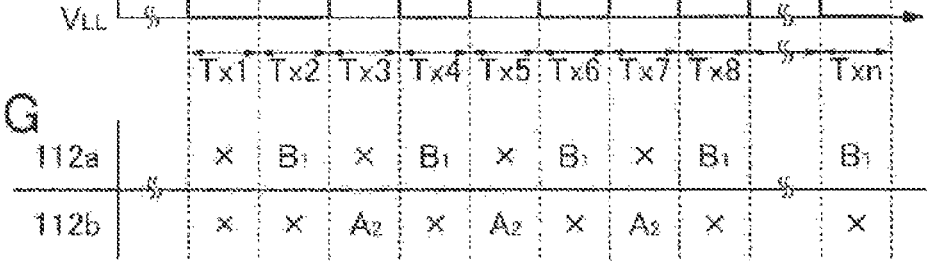

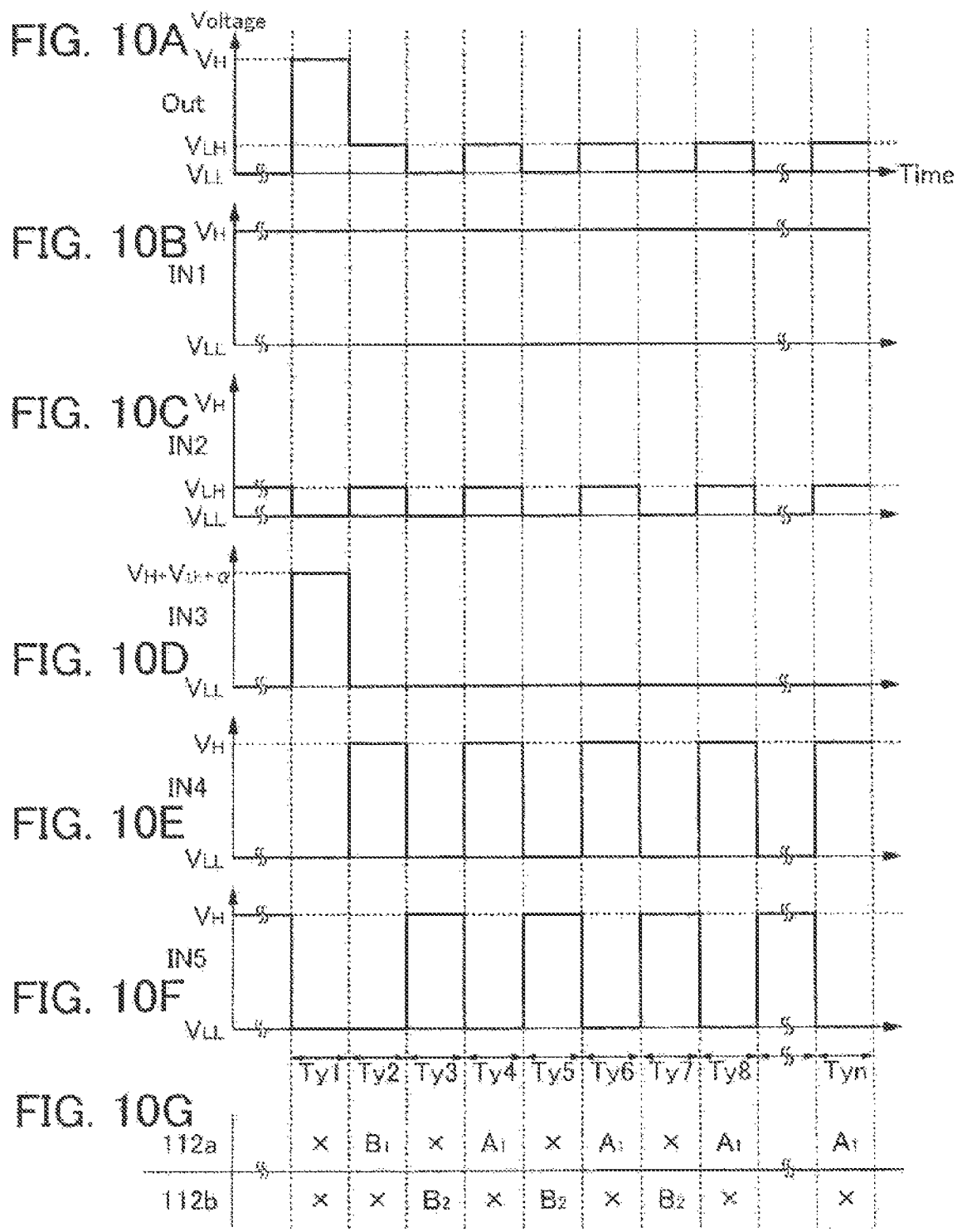

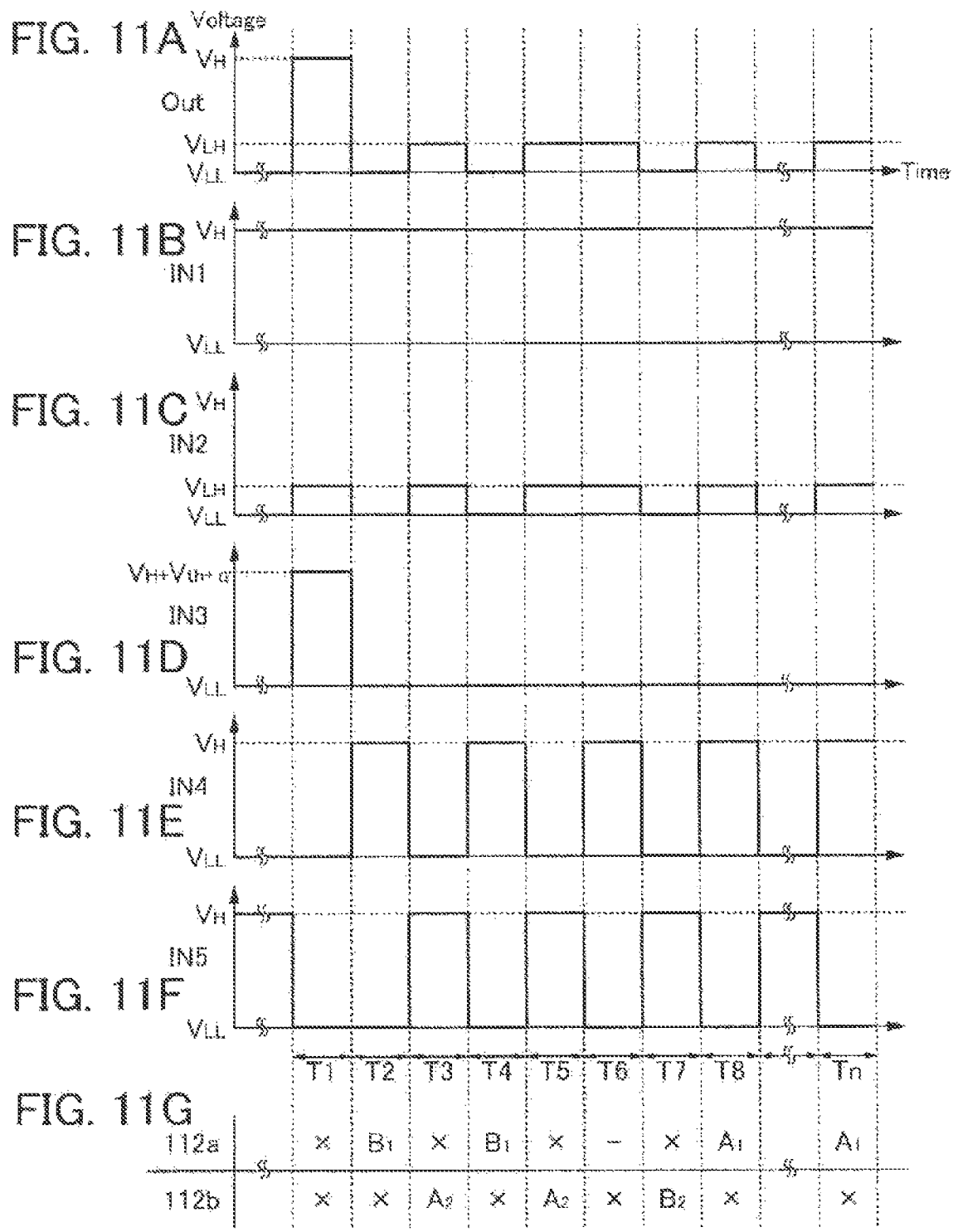

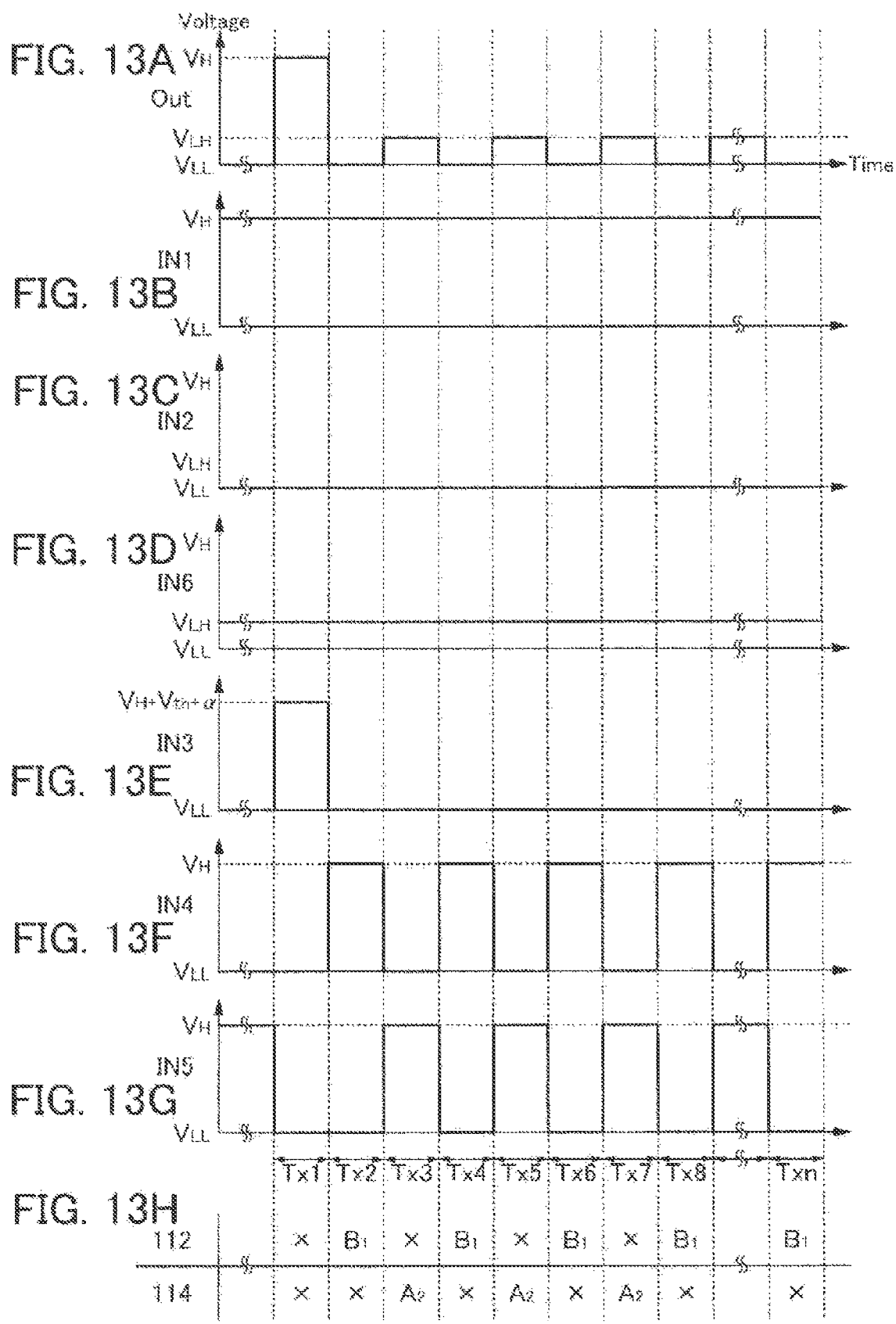

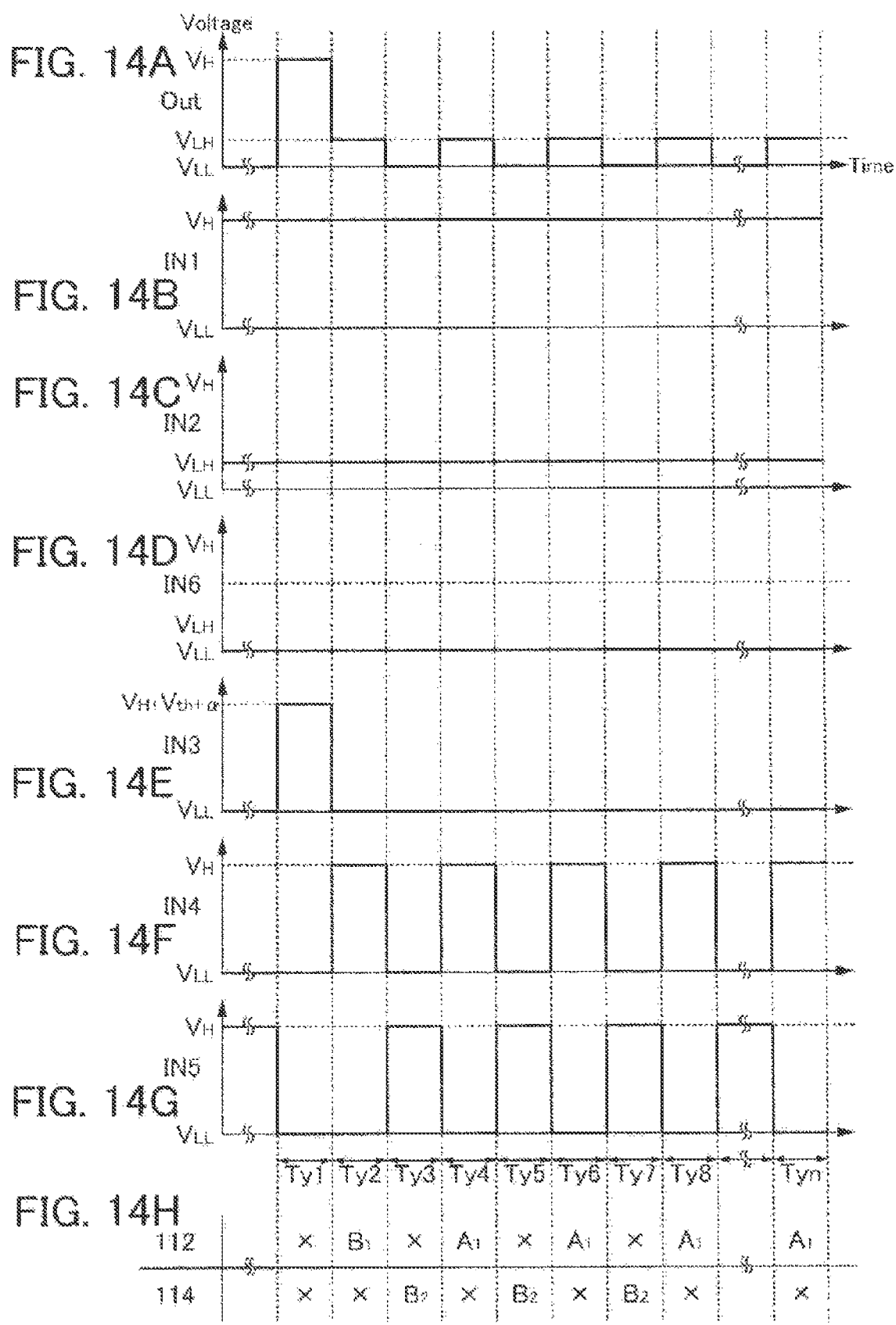

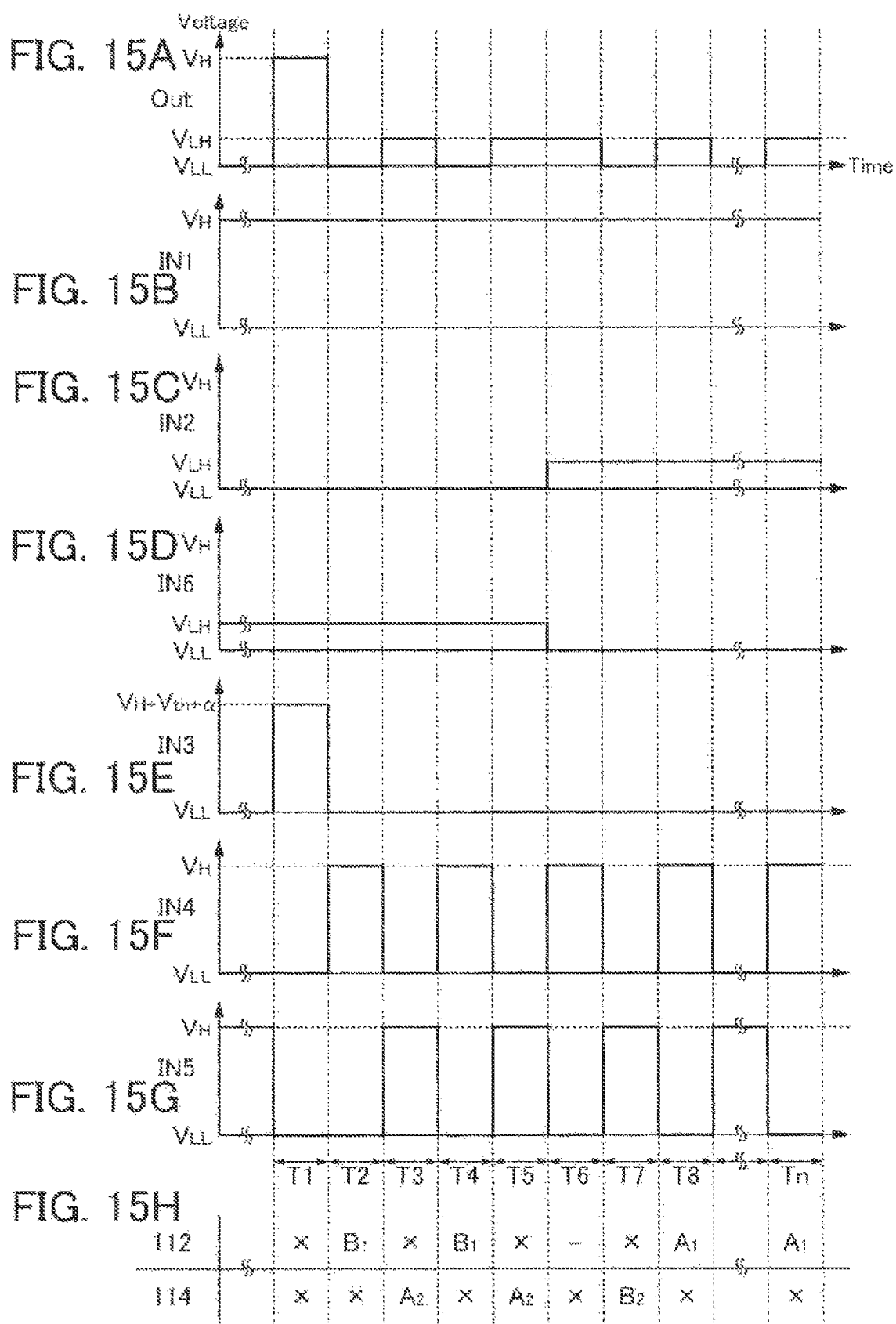

LIQUID CRYSTAL DISPLAY DEVICE

BACKGROUND OF THE INVENTION

1. Field of the Invention

The present invention relates to semiconductor devices, in particular, the present invention relates to semiconductor devices formed using transistors and an operating method thereof. Further, the present invention relates to display devices including semiconductor devices and electronic devices including the display devices.

2. Description of the Related Art

In recent years, display devices such as liquid crystal display devices and light-emitting devices have actively developed. In particular, a technique for forming a pixel circuit and a driver circuit including a shift register circuit or the like (hereinafter referred to as an internal circuit) over the same insulator by using transistors formed using a non-single-crystal semiconductor has actively developed, because the technique greatly contributes to reduction in power consumption and cost, improvement in reliability, and decrease in frame. The internal circuit formed over the insulator is connected to a controller IC or the like provided outside the insulator (hereinafter referred to as an external circuit) through an FPC (flexible printed circuit) or the like, and its operation is controlled.

In addition, a shift register circuit including transistors formed using a non-single-crystal semiconductor has been devised as the internal circuit formed over the insulator (see Reference 1).

However, since an output terminal of the shift register circuit is in a floating state in a certain period, there has been a problem in that noise is easily generated in the output terminal and that the shift register circuit malfunctions due to noise generated in the output terminal.

In order to solve the foregoing problem, a shift register circuit whose output terminal does not enter into a floating state has been devised. For example, in Reference 2, a technique by which a shift register circuit is operated by so-called static drive has been proposed. In this case, since an output terminal of the shift register circuit does not enter into a floating state, noise generated in the output terminal can be reduced.

REFERENCE

Reference 1: PCT International Publication No. 95/31804
Reference 2: Japanese Published Patent Application No. 2004-078172

SUMMARY OF THE INVENTION

In the case of performing static drive as disclosed in Reference 2, an operating period is divided into a selection period during which selection signals are output and a non-selection period during which non-selection signals are output. Most of the operating period is the non-selection period. In the case where a selection signal has a high potential (a high-level signal), a non-selection signal (having a low potential (a low-level signal)) is supplied to an output terminal through a transistor in the non-selection period. That is, a transistor for supplying a low potential to the output terminal is on in most of the operating period of a circuit.

It is known that a transistor formed using a non-single crystal semiconductor deteriorates in accordance with a time during which the transistor is on and a potential applied to the transistor. In the case where the transistor deteriorates, for example, there is a problem in that a shift in threshold voltage, where the threshold voltage is shifted positively, occurs and that a malfunction of a circuit occurs.

In addition, unlike a pixel, an analog switch (e.g., a transfer gate), or the like, a direction through which current flows is fixed in a digital circuit such as a shift register circuit or a latch circuit in many cases. That is, since a source and a drain of a transistor are fixed, an electric field concentrates on a drain side and the transistor easily deteriorates.

In view of the foregoing problems, it is an object to suppress deterioration in a transistor. Alternatively, it is an object to suppress a malfunction of a circuit due to deterioration in a transistor. Alternatively, it is an object to improve reliability of a circuit including a transistor.

In order to suppress deterioration in a transistor, in a transistor which continuously outputs signals having certain levels (e.g., L-level signals (low-level signals)) in a pixel or a circuit, the direction of current flowing through the transistor is changed (inverted). That is, by changing the level of voltage applied to a first terminal and a second terminal (terminals serving as a source and a drain) every given period, the source and the drain are switched every given period.

Therefore, in a portion which continuously outputs signals having certain levels (e.g., L-level signals) in a circuit including a transistor, L-level signals having a plurality of different potentials (L-level signals whose potentials are changed every given period) are used as the signals having certain levels. For example, in the case where L-level signals are continuously output through a transistor, signals whose potentials are switched between first potentials $V_L$ and second potentials $V_{LL}$ ($V_{LH} > V_{LL}$) every given period can be used as the L-level signals. That is, by using signals whose potentials are changed as the L-level signals and changing the direction of current flowing through the transistor (switching a source and a drain), concentration of an electric field on a source side or a drain side is suppressed. Thus, deterioration in the transistor is suppressed.

Note that any potential may be used as the first potential $V_{LH}$ and the second potential $V_{LL}$ as long as it serves as an L-level signal in the circuit. For example, in the case where the L-level signal is a non-selection signal in the circuit, the first potential and the second potential may be set such that they serve as non-selection signals. Alternatively, as the plurality of potentials, three or more potentials may be set.

Alternatively, in the case where H-level signals (high-level signals) are continuously output through the transistor, signals whose potentials are switched between first potentials $V_{HH}$ and second potentials $V_{HL}$ ($V_{HH} > V_{HL}$) every given period can be used as the H-level signals. Note that any potential may be used as the first potential $V_{HH}$ and the second potential $V_{HL}$ as long as it serves as an H-level signal in the circuit. For example, in the case where the H-level signal is a selection signal in the circuit, the first potential and the second potential may be set such that they serve as selection signals.

In addition, in an example of the disclosed invention, a first transistor, a second transistor, and a third transistor are provided. One of a source and a drain of the first transistor is electrically connected to a first wiring, and the other of the source and the drain of the first transistor is electrically connected to a third wiring. One of a source and a drain of the second transistor is electrically connected to a second wiring, and the other of the source and the drain of the second transistor is electrically connected to the third wiring. A gate of the third transistor is electrically connected to the third wiring. The third transistor is turned on by a selection signal supplied to the third wiring and is turned off by a non-selection signal. The selection signal is supplied from the first wiring to the third wiring in a period during which the first transistor is on. The non-selection signal is supplied from the second wiring to the third wiring in a period during which the second transistor is on. At least one of the selection signal and the non-selection signal is a signal whose potential is changed every predetermined period.

In addition, in an example of the disclosed invention, a first transistor, a plurality of second transistors, and a third transistor are provided. One of a source and a drain of the first transistor is electrically connected to a first wiring, and the other of the source and the drain of the first transistor is electrically connected to a third wiring. One of a source and a drain of each of the plurality of second transistors is electrically connected to a second wiring, and the other of the source and the drain of each of the plurality of second transistors is electrically connected to the third wiring. The plurality of second transistors am connected in parallel with each other. A gate of the third transistor is electrically connected to the third wiring. The third transistor is turned on by a selection signal supplied to the third wiring and is turned off by a non-selection signal. The selection signal is supplied from the first wiring to the third wiring in a period during which the first transistor is on. The non-selection signal is a signal whose potential is changed every predetermined period and is supplied from the second wiring to the third wiring in a period during which one of the plurality of second transistors is on.

In addition, in an example of the disclosed invention, a first transistor, a second transistor, a third transistor, and a fourth transistor are provided. One of a source and a drain of the first transistor is electrically connected to a first wiring, and the other of the source and the drain of the first transistor is electrically connected to a third wiring. One of a source and a drain of the second transistor is electrically connected to a second wiring, and the other of the source and the drain of the second transistor is electrically connected to the third wiring. One of a source and a drain of the fourth transistor is electrically connected to a fourth wiring, and the other of the source and the drain of the fourth transistor is electrically connected to the third wiring. A gate of the third transistor is electrically connected to the third wiring. The third transistor is turned on by a selection signal supplied to the third wiring and is turned off by a non-selection signal. The selection signal is supplied from the first wiring to the third wiring in a period during which the first transistor is on. The non-selection signal is supplied from the second wiring or the fourth wiring to the third wiring in a period during which the second transistor is on or a period during which the fourth transistor is on. Different potentials are applied to the second wiring and the fourth wiring, and the potential applied to the second wiring and the potential applied to the fourth wiring are switched.

In this specification, in the case of using a transistor as a switch, the polarity (conductivity type) of the transistor is not particularly limited to a certain type because it operates just as a switch. However, a transistor having polarity with smaller off-state current is preferably used when the amount of off-state current is to be suppressed. Examples of a transistor with smaller off-state current are a transistor provided with an LDD region, a transistor with a multi-gate structure, and the like. Further, an n-channel transistor is preferably used when a potential of a source terminal of the transistor which is operated as a switch is close to a potential of a low-potential-side power supply (e.g., Vss, GND, or 0 V). On the other hand, a p-channel transistor is preferably used when the potential of the source terminal is close to a potential of a high-potential-side power supply (e.g., Vdd). This is because the absolute value of gate-source voltage can be increased when the potential of the source terminal of the n-channel transistor is close to a potential of a low-potential-side power supply and when the potential of the source terminal of the p-channel transistor is close to a potential of a high-potential-side power supply, so that the transistor can be mom accurately operated as a switch. This is also because the transistor does not often perform source follower operation, so that reduction in output voltage does not often occur.

Note that a CMOS switch may be used as a switch by using both an n-channel transistor and a p-channel transistor. By using a CMOS switch, the switch can be more accurately operated as a switch because current can flow when either the p-channel transistor or the n-channel transistor is turned on. For example, voltage can be appropriately output regardless of whether voltage of an input signal to the switch is high or low. In addition, since the voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not include a terminal for controlling conduction in some cases. Therefore, when a diode is used as a switch, the number of wirings for controlling terminals can be further reduced as compared to the case of using a transistor.

Note that when it is explicitly described that "A and B are connected", the case where A and B are electrically connected, the case where A and B are functionally connected, and the case where and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. Alternatively, in the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-de converter, or a step-down de-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is interposed between A and B, A and B are functionally connected.

Note that when it is explicitly described that "A and B are electrically connected" the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ various modes. For example, an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, a carbon nanotube, or the like can be used as a display element, a display device, a light-emitting element, or a light-emitting device. Such an element can include a display medium whose contrast, luminance, reflectivity, transmittance, or the like changes by electromagnetic action. Note that display devices having EL elements include an EL display. Display devices having electron emitters include a field emission display (FED), an SED-type flat panel display (SED: surface-conduction electron-emitter display), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper.

Note that an EL element is an element including an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, a layer including a high-molecular material and a low-molecular material, or the like can be used. Note that the present invention is not limited to this, and a variety of EL elements can be used as an EL element.

Note that an electron emitter is an element in which electrons are extracted by high electric field concentration on a cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a thin film type in which a metal, an insulator, a semiconductor, and a metal are stacked, a HEED type, an EL type, a porous silicon type, a surface-conduction (SCE) type, or the like can be used. Note that the present invention is not limited to this, and a variety of elements can be used as an electron emitter.

Note that a liquid crystal element is an element which controls transmission or non-transmission of light by optical modulation action of liquid crystals and includes a pair of electrodes and liquid crystals. Note that the optical modulation action of liquid crystals is controlled by an electric filed applied to the liquid crystals (including a horizontal electric field, a vertical electric field, and a diagonal electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FC (ferroelectric liquid crystal) mode, an AFLC (anti-ferroelectric liquid crystal) mode, a PDLC (polymer dispersed liquid crystal) mode, a guest-host mode, a blue phase mode, and the like. Note that the present invention is not limited to this, and a variety of liquid crystal elements and driving methods thereof can be used as a liquid crystal element and a driving method thereof.

Note that electronic paper corresponds to a device for displaying images by molecules (a device which utilizes optical anisotropy, dye molecular orientation, or the like), a device for displaying images by particles (a device which utilizes electrophoresis, particle movement, particle rotation, phase change, or the like), a device for displaying images by movement of one end of a film, a device for displaying images by using coloring properties or phase change of molecules, a device for displaying images by using optical absorption by molecules, or a device for displaying images by using self-light emission by combination of electrons and holes. For example, the following can be used for a display method of electronic paper: microcapsule electrophoresis, horizontal electrophoresis, vertical electrophoresis, a spherical twisting ball, a magnetic twisting ball, a columnar twisting hall, a charged toner, an electron powder and granular material, magnetic electrophoresis, a magnetic thermosensitive type, electro wetting, light-scattering (transparent-opaque change), a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that the present invention is not limited to this, and a variety of electronic paper and display methods thereof can be used as electronic paper and a driving method thereof. Here, by using microcapsule electrophoresis, defects of electrophoresis, which are aggregation and precipitation of phoresis particles, can be solved. Electron powder and granular material has advantages such as high-speed response, high reflectivity, wide viewing angle, low power consumption, and memory properties.

Note that a plasma display panel has a structure where a substrate having a surface provided with an electrode faces with a substrate having a surface provided with an electrode and a minute groove in which a phosphor layer is formed at a narrow interval and a rare gas is sealed therein. Alternatively, the plasma display panel can have a structure where a plasma tube is sandwiched between film-form electrodes from the top and the bottom. The plasma tube is formed by sealing a discharge gas, RGB fluorescent materials, and the like inside a glass tube. Note that the plasma display panel can perform display by application of voltage between the electrodes to generate an ultraviolet ray so that a phosphor emits light. Note that a discharge method may be either a DC method or an AC method. Here, as a driving method of the plasma display panel, AWS (address while sustain) driving, ADS (address display separated) driving in which a sub-frame is divided into a reset period, an address period, and a sustain period, CLEAR (high-contrast & low energy address & reduction of false contour sequence) driving, ALIS (alternate lighting of surfaces) method, TERES (technology of reciprocal sustainer) driving, or the like can be used. Note that the present invention is not limited to this, and a variety of driving methods can be used as a driving method of a plasma display panel.

Note that electroluminescence, a cold cathode fluorescent lamp, a hot cathode fluorescent lamp, an LED, a laser light source, a mercury lamp, or the like can be used as a light source of a display device in which a light source is needed, such as a liquid crystal display (e.g., a transmissive liquid crystal display, a transflective liquid crystal display, a reflective liquid crystal display, a direct-view liquid crystal display, or a projection liquid crystal display), a display device including a grating light valve (GLV), or a display device including a digital micromirror device (DMD). Note that the present invention is not limited to this, and a variety of light sources can be used as a light source.

Note that a variety of transistors can be used as a transistor, without limitation to a certain type. For example, a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used. In the case of using the TFT, there are various advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost, in addition, since the manufacturing temperature is low, a substrate having low heat resistance can be used. Therefore, the transistor can be formed using a light-transmitting substrate. Further, transmission of light in a display element can be controlled by using the transistor formed using the light-transmitting substrate. Alternatively, part of a film included in the transistor can transmit light because the thickness of the transistor is small. Therefore, the aperture ratio can be improved.

Note that by using a catalyst (e.g., nickel) in the case of forming polycrystalline silicon, crystallinity can be further improved and a transistor having excellent electrical characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed using the same substrate as a pixel portion.

Note that by using a catalyst (e.g., nickel) in the case of forming microcrystalline silicon, crystallinity can be further improved and a transistor having excellent electrical characteristics can be formed. In this case, crystallinity can be improved by just performing heat treatment without performing laser irradiation. Accordingly, a gate driver circuit (e.g., a scan line driver circuit) and part of a source driver circuit (e.g., an analog switch) can be formed using the same substrate as a pixel portion. In addition, in the case of not performing laser irradiation for crystallization, unevenness in crystallinity of silicon can be suppressed. Therefore, high-quality images can be displayed.

Note that polycrystalline silicon and microcrystalline silicon can be formed without using a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective improvement in crystallinity is possible by selective laser irradiation or the like. For example, only a peripheral driver circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region whose crystallinity is improved is small, manufacturing steps can be decreased, throughput can be increased, and manufacturing cost can be reduced. Since the number of necessary manufacturing apparatus is small, manufacturing cost can be reduced.

A transistor can be formed using a semiconductor substrate, an SOI substrate, or the like. Thus, a transistor with few variations in characteristics, sizes, shapes, or the like, with high current supply capability, and with a small size can be formed. By using such a transistor, power consumption of a circuit can be reduced or a circuit can be highly integrated.

A transistor including a compound semiconductor or an oxide semiconductor, such as zinc oxide (ZnO), an oxide containing indium, gallium, and zinc (InGaZnO), silicon germanium (SiGe), gallium arsenide (GaAs), indium zinc oxide (IZO), indium tin oxide (ITO), or tin oxide (SnO), a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a resistor, a pixel electrode, or a light-transmitting electrode. Further, since such an element can be formed at the same time as the transistor, cost can be reduced.

A transistor or the like formed by an inkjet method or a printing method can be used. Thus, a transistor can be formed at room temperature, can be formed at a low vacuum, or can be formed using a large substrate. Since the transistor can be formed without using a mask (reticle), the layout of the transistor can be easily changed. Further, since it is not necessary to use a resist, material cost is reduced and the number of steps can be reduced. Furthermore, since a film is formed only in a necessary portion, a material is not wasted as compared to a manufacturing method by which etching is performed after the film is formed over the entire surface, so that cost can be reduced.

A transistor or the like including an organic semiconductor or a carbon nanotube can be used. Thus, such a transistor can be formed over a flexible substrate. A semiconductor device formed using such a substrate can resist shocks.

Further, transistors with a variety of structures can be used. For example, a MOS transistor, a junction transistor, a bipolar transistor, or the like can be used as a transistor. By using a MOS transistor, the size of the transistor can be reduced. Thus, a plurality of transistors can be mounted. By using a bipolar transistor, large current can flow. Thus, a circuit can be operated at high speed.

Note that a MOS transistor, a bipolar transistor, and the like may be formed over one substrate. Thus, reduction in power consumption, reduction in size, high-speed operation, and the like can be achieved.

Note that the structure of a transistor can be a variety of structures, without limitation to a certain structure. For example, a multi-gate structure having two or more gate electrodes can be used. By using the multi-gate structure, a structure where a plurality of transistors are connected in series is provided because channel regions are connected in series. With the multi-gate structure, the amount of off-state current can be reduced and the withstand voltage of the transistor can be increased (reliability can be improved). Further, with the multi-gate structure, drain-source current does not fluctuate very much even when drain-source voltage fluctuates when the transistor operates in a saturation region, so that a flat slope of voltage-current characteristics can be obtained. By utilizing the flat slope of the voltage-current characteristics, an ideal current source circuit or an active load having an extremely large resistance value can be realized. Accordingly, a differential circuit or a current mirror circuit having excellent properties can be realized.

As another example, a structure where gate electrodes are formed above and below a channel can be used. By using the structure where gate electrodes are formed above and below the channel, a channel region is increased, so that the amount of current can be increased. Alternatively, by using the structure where gate electrodes are formed above and below the channel, a depletion layer can be easily formed, so that subthreshold swing can be improved. Note that when the gate electrodes are formed above and below the channel, a structure where a plurality of transistors are connected in parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Alternatively, a structure where a source electrode or a drain electrode overlaps with a channel region (or part of it) can be used. By using the structure where the source electrode or the drain electrode overlaps with the channel region (or part of it) unstable operation due to accumulation of electric charge in part of the channel region can be prevented. Alternatively, a structure where an LDD region is provided can be used. By providing the LDD region, the amount of off-state current can be reduced or the withstand voltage of the transistor can be increased (reliability can be improved). Further, by providing the LDD region, drain-source current does not fluctuate very much even when drain-source voltage fluctuates when the transistor operates in the saturation region, so that a flat slope of voltage-current characteristics can be obtained.

Note that a variety of transistors can be used as a transistor, and the transistor can be formed using a variety of substrates. Accordingly, all the circuits that are necessary to realize a predetermined function can be formed using the same substrate. For example, all the circuits that are necessary to realize the predetermined function can be formed using a glass substrate, a plastic substrate, a single crystal substrate, an SOI substrate, or any other substrate. When all the circuits that are necessary to realize the predetermined function are formed using the same substrate, cost can be reduced by reduction in the number of components or reliability can be improved by reduction in the number of connections to circuit components. Alternatively, some of the circuits which are necessary to realize the predetermined function can be formed using one substrate and some of the circuits which are necessary to realize the predetermined function can be formed using another substrate. That is, not all the circuits that are necessary to realize the predetermined function are required to be formed using the same substrate. For example, some of the circuits which are necessary to realize the predetermined function can be formed by transistors using a glass substrate and some of the circuits which are necessary to realize the predetermined function can be formed using a single crystal substrate, so that an IC chip formed by a transistor using the single crystal substrate can be connected to the glass substrate by COG (chip on glass) and the IC chip may be provided over the glass substrate. Alternatively, the IC chip can be connected to the glass substrate by TAB (tape automated bonding) or a printed wiring board. When some of the circuits are formed using the same substrate in this manner, cost can be reduced by reduction in the number of components or reliability can be improved by reduction in the number of connections to circuit components. Alternatively, when circuits with high driving voltage and high driving frequency, which consume large power, are formed using a single crystal substrate instead of forming such circuits using the same substrate, and an IC chip formed by the circuits is used, for example, increase in power consumption can be prevented.

Note that one pixel corresponds to one element whose brightness can be controlled. Therefore, for example, one pixel corresponds to one color element and brightness is expressed with the one color element. Accordingly, in that case, in the case of a color display device having color elements of R (red), G (green), and B (blue), the minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) can be used by adding white. Alternatively, one or more colors of yellow, cyan, magenta, emerald green, vermilion, and the like can be added to RGB. Alternatively, a color similar to at least one of R, G, and B can be added to RGB. For example, R, G, B1, and B2 may be used. Although both B1 and B2 are blue, they have different frequencies. In a similar manner, R1, R2, G, and B can be used. By using such color elements, display which is closer to the real object can be performed and power consumption can be reduced. As another example, in the case of controlling brightness of one color element by using a plurality of regions, one region can correspond to one pixel. Therefore, for example, in the case of performing area ratio gray scale display or in the case of including a subpixel, a plurality of regions which control brightness are provided in each color element and gray levels are expressed with the whole regions. In this case, one region which controls brightness can correspond to one pixel. Thus, in that case, one color element includes a plurality of pixels. Alternatively, even when the plurality of regions which control brightness are provided in one color element, these regions may be collected and one color element may be referred to as one pixel. Thus, in that case, one color element includes one pixel. Alternatively, in the case where brightness is controlled in a plurality of regions in each color element, the size of regions which contribute to display is varied depending on pixels in some cases. Alternatively, in the plurality of regions which control brightness in each color element, signals supplied to each of the plurality of regions may be slightly varied so that the viewing angle is widened. Thai is, potentials of pixel electrodes included in the plurality of regions provided in each color element can be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included: the case where the pixels are arranged in stripes and the case where dots of the three color elements are arranged in a delta pattern. In addition, the case is also included in which dots of the three color elements are provided in Bayer arrangement. Note that the size of display regions may be different between dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also a variety of active elements (non-linear elements) can be used. For example, an MIM (metal insulator metal), a TFD (thin film diode), or the like can also be used. Since such an element has few number of manufacturing steps, manufacturing cost can be reduced or yield can be improved. Further, since the size of the element is small, the aperture ratio can be improved, so that power consumption can be reduced or higher luminance can be achieved.

Note that as a method other than the active matrix method, a passive matrix method in which an active element (a non-linear element) is not used can be used. Since an active element (a non-linear element) is not used, manufacturing steps is few, so that manufacturing cost can be reduced or yield can be improved. Further, since an active element (a non-linear element) is not used, the aperture ratio can be improved, so that power consumption can be reduced or higher luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source and a drain is not referred to as a source or a drain in some cases. In such a case, one of the source and the drain might be referred to as a first terminal and the other of the source and the drain might be referred to as a second terminal, for example. Alternatively, one of the source and the drain might be referred to as a first electrode and the other of the source and the drain might be referred to as a second electrode. Alternatively, one of the source and the drain might be referred to as a first region and the other of the source and the drain might be referred to as a second region.

Note that a transistor may be an element having at least three terminals of a base, an emitter, and a collector. In this case, in a similar manner, one of the emitter and the collector might be referred to as a first terminal and the other of the emitter and the collector might be referred to as a second terminal.

Note that a gate corresponds to all or some of agate electrode and a gate wiring (also referred to as a gate line, a gate signal line, a scan line, a scan signal line, or the like). A gate electrode corresponds to part of a conductive film which overlaps with a semiconductor which forms a channel region with a gate insulating film interposed therebetween. Note that part of the gate electrode overlaps with an LDD (lightly doped drain) region or a source region (or a drain region) with the gate insulating film interposed therebetween in some cases. A gate wiring corresponds to a wiring for connecting gate electrodes of transistors to each other, a wiring for connecting gate electrodes of pixels to each other, or a wiring for connecting a gate electrode to another wiring.

Note that a source corresponds to all or some of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Therefore, a region containing a small amount of p-type impurities or n-type impurities, namely, an LDD (lightly doped drain) region is not included in the source region. A source electrode is part of a conductive layer which is formed using a material different from that of a source region and is electrically connected to the source region. However, a source electrode and a source region are collectively referred to as a source electrode in some cases. A source wiring corresponds to a wiring for connecting source electrodes of transistors to each other, a wiring for connecting source electrodes of pixels to each other, or a wiring for connecting a source electrode to another wiring.

Note that the same can be said for a drain.

Note that a semiconductor device corresponds to a device having a circuit including a semiconductor element (e.g., a transistor, a diode, or a thyristor). The semiconductor device may also correspond to all devices that can function by utilizing semiconductor characteristics. In addition, the semiconductor device corresponds to a device having a semiconductor material.

Note that a display device corresponds to a device having a display element. The display device may include a plurality of pixels each having a display element. Note that that the display device may include a peripheral driver circuit for driving the plurality of pixels. The peripheral driver circuit for driving the plurality of pixels may be formed using the same substrate as the plurality of pixels. The display device may include a peripheral driver circuit provided over a substrate by wire bonding or bump bonding, namely, an IC chip connected by chip on glass (COG) or an IC chip connected by TAB or the like. The display device may include a flexible printed circuit (FPC) to which an IC chip, a resistor, a capacitor, an inductor, a transistor, or the like is attached. Note that the display device may include a printed wiring board (PWB) which is connected through a flexible printed circuit (FPC) and to which an IC chip, a resistor, a capacitor, an inductor, a transistor, or the like is attached. The display device may include an optical sheet such as a polarizing plate or a retardation plate. The display device may include a lighting device, a housing, an audio input and output device, an optical sensor, or the like.

Note that a lighting device may include a backlight unit, a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a light-emitting device corresponds to a device having a light-emitting element or the like. In the case where a light-emitting device includes a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of signals from a source signal line to pixels (also referred to as a selection transistor, a switching transistor, or the like), a transistor which supplies voltage or current to a pixel electrode, a transistor which supplies voltage or current to a light-emitting element, and the like are examples of the driving device. A circuit which supplies signals to a gate signal line (also referred to as a gate driver, a gate line driver circuit, or the like), a circuit which supplies signals to a source signal line (also referred to as a source driver, a source line driver circuit, or the like), and the like are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

According to one embodiment of the invention disclosed in this specification, deterioration in a transistor can be suppressed.

Alternatively, according to one embodiment of the invention disclosed in this specification, a malfunction of a circuit due to deterioration in a transistor can be suppressed.

Alternatively, according to one embodiment of the invention disclosed in this specification, reliability of a circuit including a transistor can be improved.

BRIEF DESCRIPTION OF THE DRAWINGS

In the accompanying drawings:

FIGS. 3A to 3E illustrate the semiconductor device and a driving method thereof;

FIG. 4A illustrates a semiconductor device, and FIGS. 4B to 4F illustrate a driving method of the semiconductor device;

FIGS. 6A to 6G illustrate an example of operation of the semiconductor device;

FIGS. 7A to 7G illustrate an example of operation of the semiconductor device;

FIGS. 8A to 8G illustrate an example of operation of the semiconductor device;

FIGS. 9A to 9G illustrate an example of operation of the semiconductor device;

FIGS. 10A to 10G illustrate an example of operation of the semiconductor device;

FIGS. 11A to 11G illustrate an example of operation of the semiconductor device;

FIGS. 13A to 13H illustrate an example of operation of the semiconductor device;

FIGS. 14A to 14H illustrate an example of operation of the semiconductor device;

FIGS. 15A to 15H illustrate an example of operation of the semiconductor device;

DETAILED DESCRIPTION OF THE INVENTION

Figure 1A:
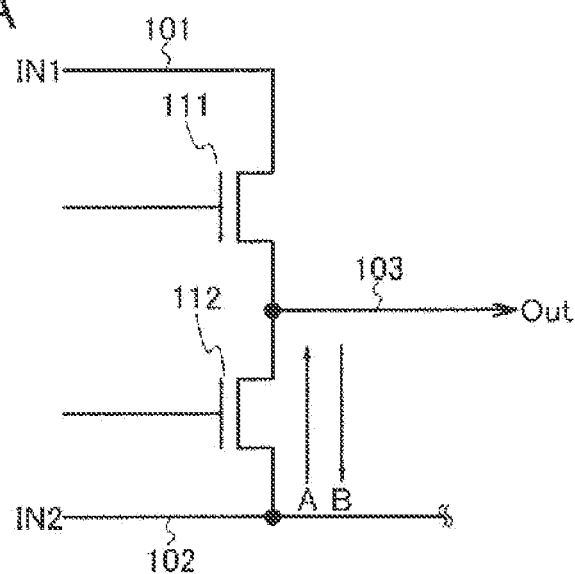
FIGS. 1A to 1C illustrate examples of a semiconductor device.

Hereinafter, embodiments will be described with reference to the drawings. Note that the embodiments can be implemented in various different ways and it will be readily appreciated by those skilled in the art that modes and details of the embodiments can be changed in various ways without departing from the spirit and scope of the present invention. Therefore, the present invention should not be construed as being limited to the following description of the embodiments. Note that in structures described below, the same portions or portions having similar functions are denoted by common reference numerals in different drawings, and description thereof is not repeated.

Further, a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another pan of the diagram, a different diagram (or may be part of the different diagram) illustrated in the embodiment, and/or a diagram (or may be part of the diagram) illustrated in one or a plurality of different embodiments, much more diagrams can be formed.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, part of the diagram or the text is taken out, and one embodiment of the invention can be constituted. For example, M pieces of circuit elements (e.g., transistors or capacitors) (M is an integer, where M<N) are taken out from a circuit diagram in which N pieces of circuit elements (e.g., transistors or capacitors) (N is an integer) are provided, and one embodiment of the invention can be constituted. As another example, U pieces of layers (M is an integer, where M<N) are taken out from a cross-sectional view in which N pieces of layers (N is an integer) are provided, and one embodiment of the invention can be constituted. As another example, M pieces of elements (M is an integer, where M<A) are taken out from a flow chart in which N pieces of elements (N is an integer) are provided, and one embodiment of the invention can be constituted.

Note that in a diagram or a text described in one embodiment, in the case where at least one specific example is described, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

Note that it might be possible for those skilled in the art to constitute one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that it might be possible for those skilled in the art to specify the invention when at least a connection portion of a circuit is specified. Alternatively, it might be possible for those skilled in the art to specify the invention when at least a function of a circuit is specified. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Embodiment 1

In this embodiment, examples of a semiconductor device including a transistor are described.

In order to suppress deterioration in a transistor, in the semiconductor device described in this embodiment, the direction of current flowing through the transistor is changed (inverted) in a period during which the transistor is on. That is, by changing the level of voltage applied to a first terminal and a second terminal (terminals serving as a source and a drain) of the transistor in the period during which the transistor is on every given period, the source and the drain are switched every given period. Specific circuit structures and operation are described below with reference to drawings.

The semiconductor device described in this embodiment includes at least a transistor 111 provided between a wiring 101 and a wiring 103 and a transistor 112 provided between a wiring 102 and the wiring 103 (see FIG. 1A).

One of a source and a drain of the transistor 111 is electrically connected to the wiring 101, and the other of the source and the drain of the transistor 111 is electrically connected to the wiring 103. By turning on the transistor 111, a signal which is input to the wiring 101 (IN1) is supplied to the wiring 103. One of a source and a drain of the transistor 112 is electrically connected to the wiring 102, and the other of the source and the drain of the transistor 112 is electrically connected to the wiring 103. By turning on the transistor 112, a signal which is input to the wiring 102 (IN2) is supplied to the wiring 103.

That is, a first signal corresponding to the signal which is input to the wiring 101 (IN1) or a second signal corresponding to the signal which is input to the wiring 102 (IN2) is supplied to the wiring 103.

Figure 2A:
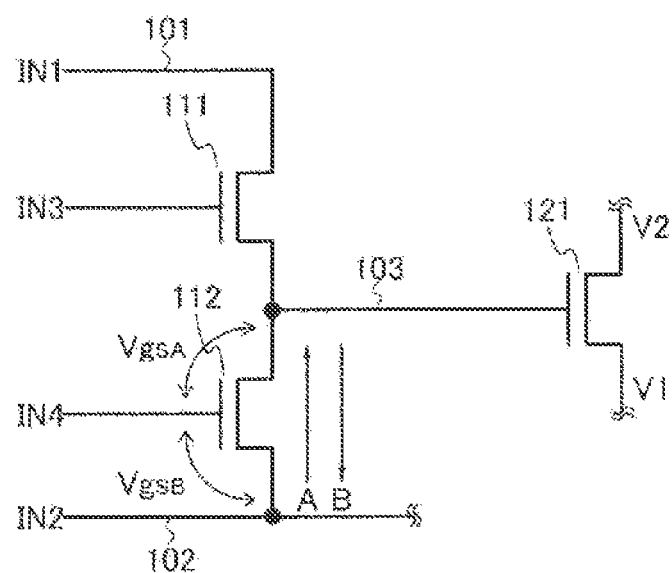
FIG. 2A illustrates a semiconductor device.
Figure 2B:
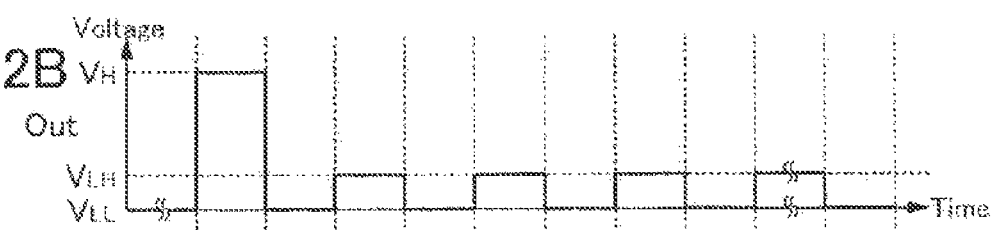
FIGS. 2B to 2F illustrate a driving method of the semiconductor device.
Figure 2C:
Figure 2D:
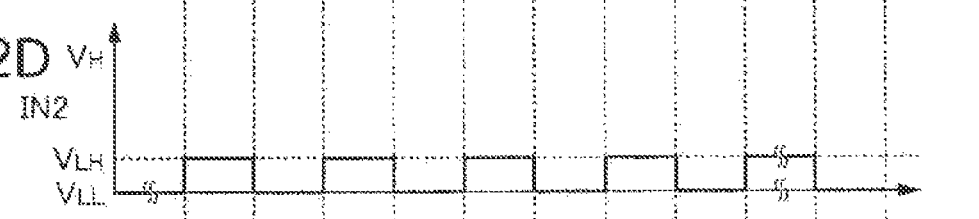
Figure 2E:
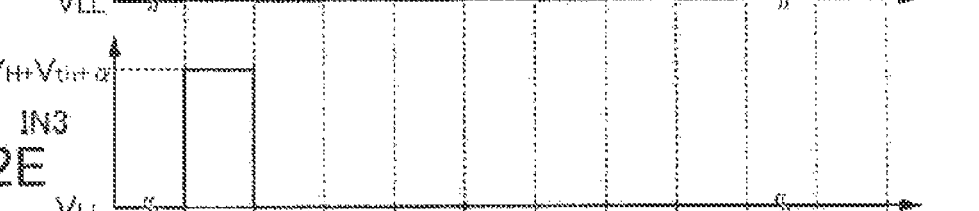
Figure 2F:
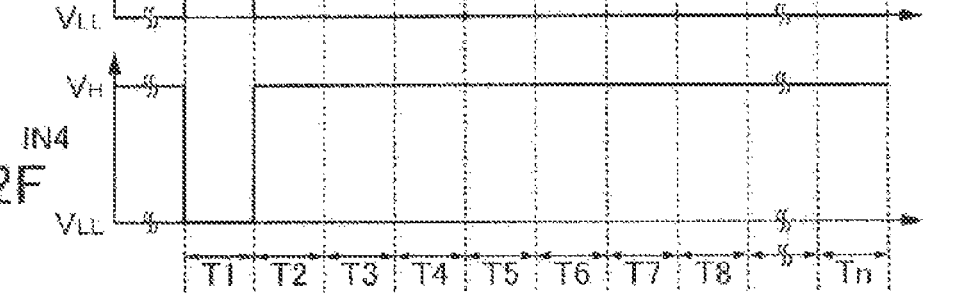

For example, by using a high potential (a high (H)-level signal) and a low potential (a low (L)-level signal) as the first signal and the second signal and by controlling on/off of the transistor 111 and the transistor 112, the H-level signal or the L-level signal can be selectively output to the wiring 103. Alternatively, as illustrated in FIG. 2A, by connecting a gate of a transistor to the wiring 103 and outputting the H-level signal or the L-level signal from the wiring 103, on/off of the transistor can be controlled.

Figure 1B:
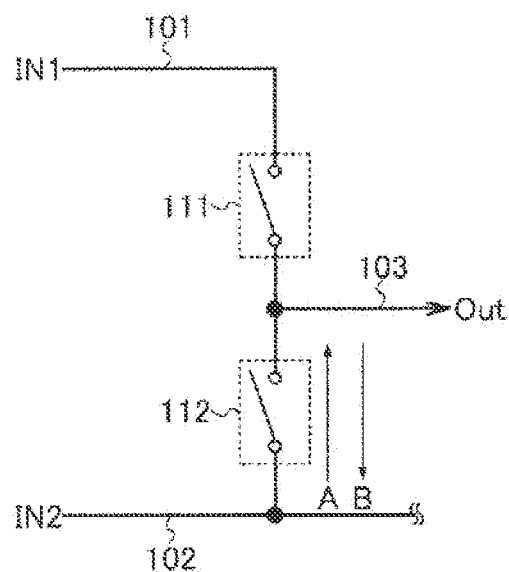
Figure 1C:
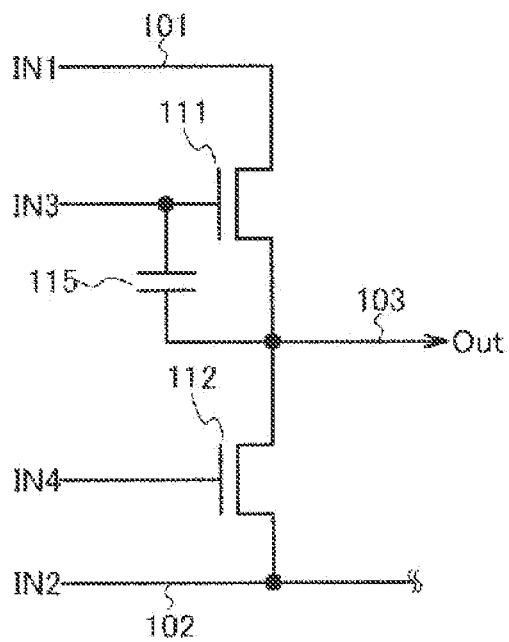

Note that although n-channel transistors are used as the transistor 111 and the transistor 112 in FIGS. 1A to 1C, p-channel transistors may be used. Alternatively, the polarities of the transistor 111 and the transistor 112 may be different from each other, or a CMOS may be used for each transistor. Further, the transistor 111 can serve as a switch provided between the wiring 101 and the wiring 103, and the transistor 112 can serve as a switch provided between the wiring 102 and the wiring 103 (see FIG. 1B).

In this embodiment, in the structures illustrated in FIGS. 1A to 1C, in at least one of the transistor 111 and the transistor 112, the direction of current flowing through the transistor is changed. That is, the level of voltage applied to a first terminal and a second terminal (terminals serving as the source and the drain) of at least one of the transistor 111 and the transistor 112 is changed every given period (the source and the drain are switched).

In particular, in operating a circuit, in a transistor which is kept on for a long time, it is preferable that the direction of current flowing through the transistor be changed. For example, in the case where the transistor 112 is kept on for along time in FIG. 1A, at least the direction of current flowing through the transistor 112 (a direction A or a direction B) is changed. That is, the level of voltage applied to the first terminal and the second terminal of the transistor 112 is changed every period (the source and the drain are switched).

A specific operating method is described below with reference to FIGS. 2A to 2F and FIGS. 3A to 3E.

In the following description, a structure where a gate of an n-channel transistor 121 is electrically connected to the wiring 103 (e.g., a structure where the wiring 103 serves as a gate line) is described (see FIG. 2A). In addition, the case is described in which the direction of current flowing through the transistor 112 is changed in a period during which the transistor 112 is on by using a signal whose potential is changed every predetermined period as a signal which is input to the wiring 102.

FIGS. 2B to 2F illustrate a signal which is supplied to the wiring 103 (Out), the signal which is input to the wiring 101 (IN1), the signal which is input to the wiring 102 (IN2), a signal which is input to a gate of the transistor 111 (IN3), and a signal which is input to agate of the transistor 112 (IN4), respectively. Needless to say, these signals (IN1 to IN4) are just examples, and signals are not limited to the signals illustrated in FIGS. 2A to 2F.

First, in a period T1, the signal for turning on the transistor 111 (IN3) is input to the gate of the transistor 111. Accordingly, the transistor 111 is turned on, and the first signal corresponding to the signal which is input to the wiring 101 (IN1) (here, an H-level signal (a selection signal for turning on the transistor 121)) is supplied to the wiring 103 through the transistor 111. Then, the selection signal is input to the gate of the transistor 121 which is connected to the wiring 103, so that the transistor 121 is turned on (see FIG. 3A).

In the period T1, in the case where a potential of the signal which is input to the gate of the transistor 111 (IN3) is $V_H$, when it is assumed that the threshold voltage of the transistor 111 is Vth, a potential of a signal which is output to the wiring 103 is $V_H$-Vth. In order to set the potential of the signal which is output to the wiring 103 at $V_H$, the potential of the signal which is input to the gate of the transistor 111 (IN3) is set higher than $V_H$+Vth by setting the gate of the transistor 111 in a floating state in the period T1 and performing bootstrap operation. Needless to say, in order to set the potential of the signal which is output to the wiring 103 at $V_H$, the potential of the signal which is input to the gate of the transistor 111 (IN3) may be set higher than $V_H$+Vth (e.g., $V_H$+Vth+α) in advance.

In addition, in the period T1, the transistor 112 is brought out of conduction (off). Note that this embodiment is not limited to this, and the transistor 112 may be on as long as the selection signal is output to the wiring 103. In this case, a potential of the signal which is input to the wiring 102 (IN2) is preferably $V_H$.

Alternatively, in a period before the period T1, the transistor 111 may be on. In this case, the signal which is input to the wiring 101 is preferably an L-level signal.

Next, in a period T2, the signal for turning on the transistor 112 (IN4) is input to the gate of the transistor 112. In this case, in the transistor 112, a potential of a terminal which is connected to the wiring 102 (in this case, $V_{LL}$) is lower than a potential of a terminal which is connected to the wiring 103 (in this case, $V_{11}$), so that the terminal which is connected to the wiring 102 is the source and the terminal which is connected to the wiring 103 is the drain. Accordingly, a gate-source potential of the transistor 112 (VgsB=$V_H$-$V_{LL}$) is higher than the threshold voltage of the transistor 112, so that the transistor 112 is turned on. Thus, the second signal corresponding to the signal which is input to the wiring 102 (IN2) (here, a non-selection signal for turning off the transistor 121 (having the potential $V_{LL}$)) is supplied to the wiring 103 through the transistor 112.

Then, the non-selection signal is supplied to the gate of the transistor 121 which is connected to the wiring 103, so that the transistor 121 is turned off. Note that in the period T2, the transistor 111 is off. Note that the state of the transistor 111 is not limited to this, and the transistor 111 may be on as long as the signal IN1 has the potential $V_{LL}$.

In this manner, in the period T2, in the transistor 112, the potential of the terminal which is connected to the wiring 102 is lower than the potential of the terminal which is connected to the wiring 103, so that the terminal which is connected to the wiring 102 is the source and the terminal which is connected to the wiring 103 is the drain. Current flows from the drain to the source (in a direction B in FIG. 2A)(see FIG. 3B).

Next, in a period T3, the transistor 111 is kept off, and the potential of the signal which is input to the wiring 102 (IN2) is changed from $V_{LL}$ to $V_{LH}$ ($V_{LL}$<$V_{LH}$). In this case, in the transistor 112, the potential of the terminal which is connected to the wiring 102 (in this case, $V_{LH}$) is higher than the potential of the terminal which is connected to the wiring 103 (in this case, $V_{LL}$), so that the terminal which is connected to the wiring 102 is the drain and the terminal which is connected to the wiring 103 is the source. Since the gate-source potential of the transistor 112 (VgsA=$V_H$-$V_{LH}$)

is kept higher than the threshold voltage of the transistor 112, the transistor 112 is kept on, and the second signal corresponding to the signal which is input to the wiring 102 (IN2) (here, the non-selection signal for turning off the transistor 121 (having the potential $V_{LH}$)) is supplied to the wiring 103 through the transistor 112.

Then, since the non-selection signal is input to the gate of the transistor 121 which is connected to the wiring 103, the transistor 121 is kept off. Here, the potential $V_{LH}$ and the potential $V_{LL}$ are different from each other and are potentials which do not turn on the transistor 121 even when they are applied to the gate of the transistor 121. For example, when the lowest potential in a source or a drain of the transistor 121 is Vmin, the highest voltage is Vmax, and the threshold voltage of the transistor 121 is Vth, $V_{LH}$–Vmin<Vth and $V_H$–Vmax>Vth are satisfied.

In this manner, in the period T3, in the transistor 112, the potential of the terminal which is connected to the wiring 102 is higher than the potential of the terminal which is connected to the wiring 103, so that the terminal which is connected to the wiring 102 is the drain and the terminal which is connected to the wiring 103 is the source. Current flows from the drain to the source (in a direction A in FIG. 2A) (see FIG. 3C).

In consecutive periods Tn and T (n+1), the operation in the period T2 and the period T3 is repeated. Thus, a second signal whose potential is switched between the potential $V_{LL}$ and the potential $V_{LH}$ every predetermined period is supplied to the wiring 103 (here, a signal whose potential is $V_{LH}$ and is $V_{LL}$ in even-numbered periods is supplied), and the transistor 121 is kept off. Further, although the transistor 112 is kept on, the direction of current is changed (see FIGS. 3D and 3E).

In other words, in this embodiment, the level of voltage of the two terminals serving as the source and the drain of the transistor 112 is changed by input of an L-level signal (a non-selection signal) whose potential is changed every given period to the transistor 112 which continuously outputs L-level signals, so that the direction of current flowing through the transistor 112 is changed.

With a structure in which the direction of current flowing through the transistor 112 is changed (the source and the drain are switched) in this manner, even in the case where the transistor 112 is on for a long time in order to stably turn off the transistor 121, concentration of an electric field on a channel portion (an end of the drain) of the transistor 112 is relieved. Thus, deterioration in the transistor 112 can be suppressed. Accordingly, a malfunction of the circuit due to deterioration in the transistor is suppressed, so that reliability can be improved.

In particular, in the case where amorphous silicon or microcrystalline silicon (microcrystal silicon or nanocrystal silicon) is used for a channel formation region of a transistor, it is effective to operate a transistor which is kept on for a long time in an operating period of a circuit as illustrated in FIGS. 2A to 2F or FIGS. 3A to 3E in suppressing deterioration in the transistor. Note that besides amorphous silicon or microcrystalline silicon, it is effective to use, for example, polysilicon, an oxide semiconductor (e.g., ZnO or IGZO (InGaZnO)), an organic semiconductor, a carbon nanotube, or the like for a channel formation region in suppressing deterioration in the transistor.

Note that although FIGS. 2A to 2F illustrate the case where a signal whose potential is switched between a first potential $V_{LH}$ and a second potential $V_{LL}$ ($V_{LH}$>$V_{LL}$) every given period is used as an L-level signal, signals which are input to the wiring 102 are not limited to two kinds of signals having different potentials. Three or more kinds of different potentials may be input to the transistor 112 in combination as long as the potentials are not potentials for turning on the transistor 121.

In addition, although FIGS. 2A to 2F illustrate the case where the first potential $V_{LH}$ and the second potential $V_{LL}$ are alternately and repeatedly input to the wiring 102 for the same length of time, periods for inputting the first potential and the second potential can be set optionally. Further, even in the case where the first potential $V_{LH}$ and the second potential $V_{LL}$ are alternately and repeatedly input to the wiring 102 for the same length of time, the cycle can be set optionally.

In addition, the signals illustrated in FIGS. 2A to 2F (IN1 to IN4) are just examples, and this embodiment is not limited to this. For example, although FIGS. 2A to 2F illustrate the case where a signal having a constant potential is input to the wiring 101 (e.g., the case where the wiring 101 is connected to a power supply line), a different signal (e.g., a clock signal) may be input to the wiring 101. Further, although FIGS. 2A to 2F illustrate the case where the transistor 111 is off in the period T2 to the period Tn, a period during which the transistor 111 is on may be provided in the case where an L-level signal is supplied from the wiring 101.

In addition, although the case where the potential of the signal which is input to the gate of the transistor 112 (IN4) is $V_{LL}$ in the period T1 is described, the potential of the signal is not limited to this as long as the transistor 112 is turned off. For example, a potential which is lower than $V_{LL}$ may be used as the potential of the signal which is input to the gate of the transistor 112 (IN4). In this case, since Vgs can be made lower than 0 V when the transistor 112 is off, deterioration in the transistor 112 can be effectively suppressed.

In addition, although FIGS. 2A to 2F illustrate the case where the transistor 112 is kept on in the period T2 to the period Tn, the state of the transistor 112 is not limited to this. For example, the transistor 112 may be turned off in some of the period T2 to the period Tn. That is, a period during which the transistor 112 is on is combined with a period during which the transistor 112 is of, and the direction of current flowing through the transistor 112 is changed in the period during which the transistor 112 is on. In this case, deterioration in the transistor 112 can be more effectively suppressed. Note that the potentials of the wiring 102 and the wiring 103 may be the same or different in the period during which the transistor 112 is off. Further, although the period during which the transistor 112 is off is not particularly limited to a certain period, it is preferable that the period during which the transistor 112 is on and the period during which the transistor 112 is off be the same or substantially the same in view of controllability.

In addition, the semiconductor device described in this embodiment can have a circuit structure in which bootstrap operation is performed utilizing capacitive coupling between the gate and the source of the transistor 111 by temporally setting the gate of the transistor 111 in a floating state, as described above. In this case, as illustrated in FIG. 1C, a capacitor 115 may be provided between the gate of the transistor 111 and the one of the source and the drain of the transistor 111. With provision of the capacitor 115, bootstrap operation can be performed stably. Note that in the case where sufficient parasitic capacitance is generated between the gate of the transistor 111 and the one of the source and the drain of the transistor 111, bootstrap operation can be performed without provision of the capacitor 115.

In addition, although the structure where the direction of current flowing through the transistor 112 which continuously outputs L-level signals is changed is given as an example in this embodiment, the direction of current flowing through the transistor 111 may be changed in the case where the transistor 111 continuously outputs L-level signals. In this case, a signal whose potential is switched between the first potential $V_{LH}$ and the second potential $V_{LL}$ ($V_{LH}$>$V_{LL}$) every given period can be used as the signal which is input to the wiring 101 (IN1).

Alternatively, in the case where the transistor 112 (or the transistor 111) continuously outputs H-level signals, the direction of current flowing through the transistor 112 (or the transistor 111) may be changed. In this case, a signal whose potential is switched between a first potential $V_{HH}$ and a second potential $V_{HL}$ ($V_{HH}$>$V_{HL}$) every given period can be used as the signal which is input to the wiring 102 (or the wiring 101).

Needless to say, a structure where the direction of current is changed in both the transistor 111 and the transistor 112 may be used. For example, in the case where an H-level signal is supplied from the wiring 101 to the wiring 103 through the transistor 111 and an L-level signal is supplied from the wiring 102 to the wiring 103 through the transistor 112, a signal whose potential is switched between the first potential Vs and the second potential $V_{HL}$ every given period can be used as the signal which is input to the wiring 101 (IN1), and a signal whose potential is switched between the first potential $V_{LH}$ and the second potential $V_{LL}$ every given period can be used as the signal which is input to the wiring 102 (IN2).

Further, although n-channel transistors are used as the transistors 111, 112, and 121 in this embodiment, p-channel transistors may be used (see FIGS. 4A to 4F). In the case where p-channel transistors are used, by using a signal whose potential is switched between the first potential $V_{HH}$ and the second potential $V_{HL}$ every given period as the signal which is input to the wiring 102, operation can be performed such that the direction of current flowing through the transistor 112 is changed. Accordingly, deterioration in the transistor 112 is suppressed, so that a malfunction of the circuit can be suppressed. Note that although p-channel transistors are used as the transistors 111, 112, and 121 in FIGS. 4A to 4F, an n-channel transistor may be used as the transistor 121.

Note that the structure described in this embodiment can be combined with a different structure described in this specification (including a structure described in any of the other embodiments) as appropriate.

Embodiment 2

In this embodiment, examples of a semiconductor device having a structure which is different from the structure in the above embodiment are described with reference to drawings.

Figure 5A:
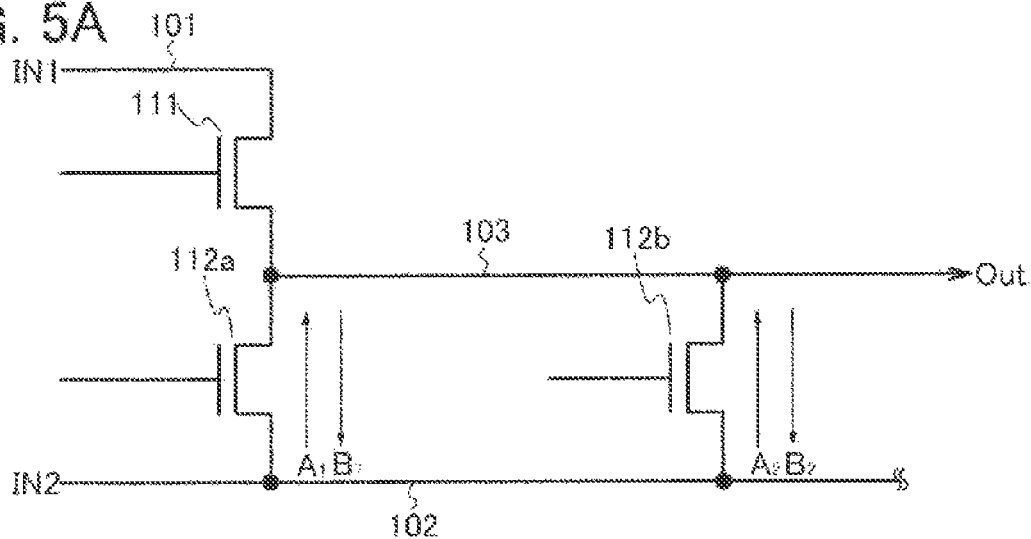
FIGS. 5A to 5C illustrate examples of a semiconductor device.

The semiconductor device described in this embodiment includes at least the transistor 111 provided between the wiring 101 and the wiring 103 and a plurality of transistors 112a and 112b provided in parallel with each other between the wiring 102 and the wiring 103 (see FIG. 5A). That is, the structure illustrated in FIG. 5A is a structure obtained by adding the transistor 112b to the structure illustrated in FIG. 1A (the transistor 112a in FIGS. 5A to 5C corresponds to the transistor 112 in FIGS. 1A to 1C). Note that although FIG. 5A illustrates the case where two transistors (the transistors 112a and 112b) are provided in parallel, three or more transistors may be provided.

One of a source and a drain of each of the transistors 112a and 112b is electrically connected to the wiring 102, and the other of the source and the drain of each of the transistors 112a and 112b is electrically connected to the wiring 103. The transistors 112a and 112b are provided in parallel with each other. Therefore, by turning on at least one of the transistors 112a and 112b, the signal which is input to the wiring 102 (IN2) is supplied to the wiring 103.

That is, a first signal corresponding to the signal which is input to the wiring 101 (IN1) or a second signal corresponding to the signal which is input to the wiring 102 (IN2) is supplied to the wiring 103.

Figure 5B:
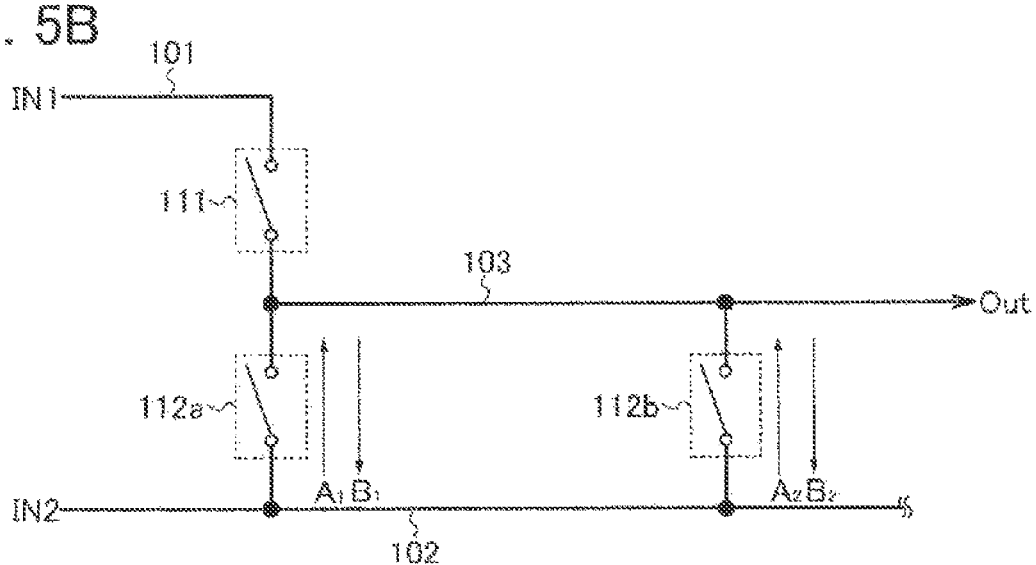
Figure 5C:
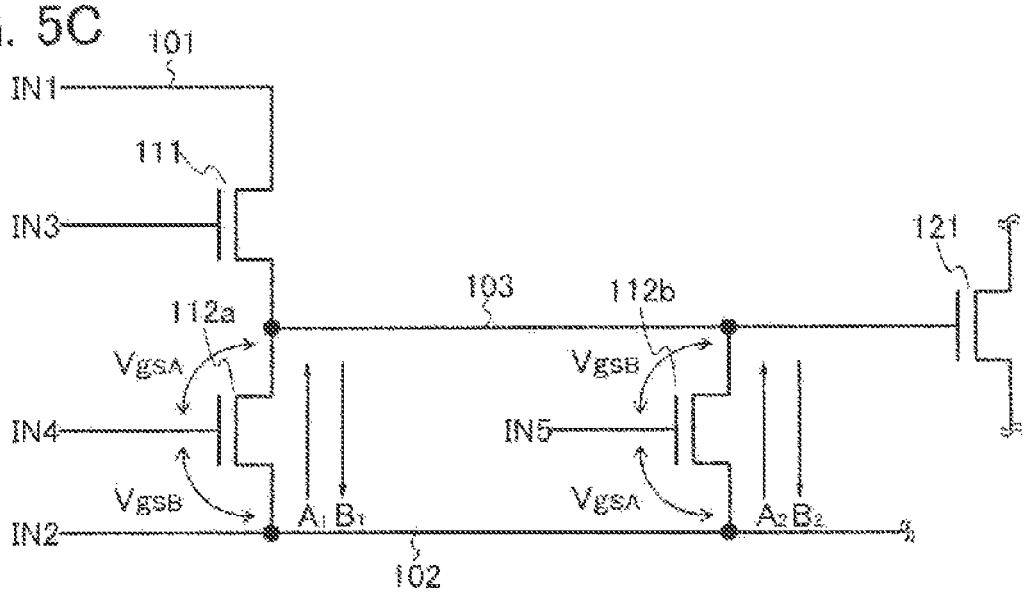

Note that although n-channel transistors are used as the transistors 111, 112a, and 112b in FIGS. 5A to 5C, p-channel transistors may be used or CMOSs may be used. Further, the transistor 11 serves as a switch provided between the wiring 101 and the wiring 103, and each of the transistors 112a and 112b serves as a switch provided between the wiring 102 and the wiring 103 (see FIG. 5B).

In this embodiment, a plurality of transistors provided in parallel (the transistors 112a and 112b in FIGS. 5A to 5C) are alternately turned on and off. In addition, a structure where the direction of current flowing through the plurality of transistors is changed (a structure where the level of voltage applied to a terminal serving as the source or the drain of each transistor is changed every period (the source and the drain are switched)) is used. That is, on/off of the plurality of transistors provided in parallel is controlled. Further, by controlling the direction of current flowing through the plurality of transistors, concentration of an electric field on a channel portion (an end of the drain) of each transistor is relieved, so that deterioration is suppressed.

A specific operating method is described below with reference to drawings.

[Operation in the Case where the Cycle of IN2 is Shorter than the Cycle of IN4 or IN5]

FIGS. 6A to 6F illustrate a signal which is output from the wiring 103 (Out), the signal which is input to the wiring 101 (IN1), the signal which is input to the wiring 102 (IN2), the signal which is input to the gate of the transistor 111 (IN3), a signal which is input to a gate of the transistor 112a (IN4), and a signal which is input to a gate of the transistor 112b (IN5), respectively. FIGS. 6C, 6E, and 6F illustrate the case where the cycle of the signal which is input to the wiring 102 (IN2) is half of the cycle of the signal which is input to the gate of the transistor 112a or 112b (IN4 or IN5). Needless to say, signals to be input (IN1 to IN5) are just examples, and signals are not limited to the signals illustrated in FIGS. 6A to 6F.

In addition, FIG. 6G illustrates the direction of current flowing through the transistor 112a and the transistor 112b, and $A_1$, $A_2$, $B_1$, and $B_2$ correspond to the directions illustrated in FIGS. 5A to 5C. Further, a period during which the transistor is off and current does not flow is indicated by x.

First, in the period T1, the signal for turning on the transistor 111 (IN3) is input to the gate of the transistor 111. Accordingly, the transistor 111 is turned on, and the first signal corresponding to the signal which is input to the wiring 101 (IN1) (here, an H-level signal (a selection signal)) is supplied to the wiring 103 through the transistor 111. In the case where the gate of the transistor 121 is connected to the wiring 103 (see FIG. 5C), the selection signal is input to the gate of the transistor 121 which is connected to the wiring 103, so that the transistor 121 is turned on.

In the period T1, in the case where a potential of the signal which is input to the gate of the transistor 111 (IN3) is $V_H$, when it is assumed that the threshold voltage of the transistor 111 is Vth, a potential of a signal which is output to the wiring 103 is $V_H$–Vth. In this case, in order to set the potential of the signal which is output to the wiring 103 at V the gate of the transistor 111 is set to be in a floating state in the period T1 and bootstrap operation is performed. Needless to say, in order to set the potential of the signal which is output to the wiring 103 at $V_H$, the potential of the signal which is input to the gate of the transistor 111 (IN3) may be set at $V_H$+Vth or higher in advance.

In addition, in the period T1, the transistors 112a and 112b are off. Note that this embodiment is not limited to this, and the transistors 112a and 112b may be on as long as the selection signal is output to the wiring 103. In this case, a potential of the signal which is input to the wiring 102 (IN2) is preferably $V_H$.

Next, in the period T2, the signal for turning on the transistor 112a (IN4) is input to the gate of the transistor 112a. In this case, in the transistor 112a, a potential of a terminal which is connected to the wiring 102 (in this case, $V_L$) is lower than a potential of a terminal which is connected to the wiring 103 (in this case, $V_H$), so that the terminal which is connected to the wiring 102 is the source and the terminal which is connected to the wiring 103 is the drain. Accordingly, a gate-source potential of the transistor 112a (VgsB=$V_H$–$V_{LL}$) is higher than the threshold voltage of the transistor 112a, so that the transistor 112a is turned on. Thus, a second signal which corresponds to the signal input to the wiring 102 (IN2) and has the potential $V_{LL}$ (a non-selection signal) is supplied to the wiring 103 through the transistor 112a.

In the case where the gate of the transistor 121 is connected to the wiring 103, the non-selection signal is input to the gate of the transistor 121 which is connected to the wiring 103, so that the transistor 121 is turned off.

Subsequently, in the latter half of the period T2, the potential of the signal which is input to the wiring 102 (IN2) is changed (is changed from $V_{LL}$ to $V_{LH}$, here). In this case, in the transistor 112a, the potential of the terminal which is connected to the wiring 102 (in this case, $V_{LH}$) is higher than the potential of the terminal which is connected to the wiring 103 (in this case, $V_{LL}$), so that the terminal which is connected to the wiring 102 is the drain and the terminal which is connected to the wiring 103 is the source. Accordingly, the gate-source potential of the transistor 112a (VgsA=$V_H$–$V_{LL}$) is higher than the threshold voltage of the transistor 112a, so that the transistor 112a is kept on. Thus, the second signal which corresponds to the signal input to the wiring 102 (IN2) and has the potential $V_{LH}$ (the non-selection signal) is supplied to the wiring 103 through the transistor 112a.

In the case where the gate of the transistor 121 is connected to the wiring 103, the non-selection signal is input to the gate of the transistor 121 which is connected to the wiring 103, so that the transistor 121 is kept off.

In this manner, in the first half of the period T2, in the transistor 112a, the potential of the terminal which is connected to the wiring 102 is lower than the potential of the terminal which is connected to the wiring 103, so that the terminal which is connected to the wiring 102 is the source and the terminal which is connected to the wiring 103 is the drain. Current flows from the drain to the source (in a direction $B_1$ in FIGS. 5A to 5C). On the other hand, in the latter half of the period T2, in the transistor 112a, the potential of the terminal which is connected to the wiring 102 is higher than the potential of the terminal which is connected to the wiring 103, so that the terminal which is connected to the wiring 102 is the drain and the terminal which is connected to the wiring 103 is the source. Current flows from the drain to the source (in a direction $A_1$ in FIGS. 5A to 5C).

Next, in the period T3, the transistor 112a is turned off, and the signal for turning on the transistor 112b (IN5) is input to the gate of the transistor 112b. In this case, in the transistor 112b, a potential of a terminal which is connected to the wiring 102 (in this case, $V_{LL}$) is lower than a potential of a terminal which is connected to the wiring 103 (in this case, $V_{LH}$), so that the terminal which is connected to the wiring 102 is the source and the terminal which is connected to the wiring 103 is the drain. Accordingly, a gate-source potential of the transistor 112b (VgsB=$V_H$–$V_{LL}$) is higher than the threshold voltage of the transistor 112b, so that the transistor 112b is turned on. Thus, the second signal which corresponds to the signal input to the wiring 102 (IN2) and has the potential $V_{LL}$ (the non-selection signal) is supplied to the wiring 103 through the transistor 112b.

In the case where the gate of the transistor 121 is connected to the wiring 103, the non-selection signal is input to the gate of the transistor 121 which is connected to the wiring 103, so that the transistor 121 is kept off.

Subsequently, in the latter half of the period T3, the potential of the signal which is input to the wiring 102 (IN2) is changed (is changed from $V_{LL}$ to $V_{LH}$, here). In this case, in the transistor 112b, the potential of the terminal which is connected to the wiring 102 (in this case, $V_{LH}$) is higher than the potential of the terminal which is connected to the wiring 103 (in this case, $V_{LL}$), so that the terminal which is connected to the wiring 102 is the drain of the transistor 112b and the terminal which is connected to the wiring 103 is the source. Accordingly, the gate-source potential of the transistor 112b (VgsA=$V_H$–$V_{LL}$) is higher than the threshold voltage of the transistor 112b, so that the transistor 112b is kept on. Thus, the second signal which corresponds to the signal input to the wiring 102 (IN2) and has the potential $V_{LH}$ (the non-selection signal) is supplied to the wiring 103 through the transistor 112b.

In the case where the gate of the transistor 121 is connected to the wiring 103, the non-selection signal is input to the gate of the transistor 121 which is connected to the wiring 103, so that the transistor 121 is kept off.

In this manner, in the first half of the period T3, in the transistor 112b, the potential of the terminal which is connected to the wiring 102 is lower than the potential of the terminal which is connected to the wiring 103, so that the terminal which is connected to the wiring 102 is the source and the terminal which is connected to the wiring 103 is the drain. Current flows from the drain to the source (in a direction $B_2$ in FIGS. 5A to 5C). On the other hand, in the latter half of the period T3, in the transistor 112b, the potential of the terminal which is connected to the wiring 102 is higher than the potential of the terminal which is connected to the wiring 103, so that the terminal which is connected to the wiring 102 is the drain and the terminal which is connected to the wiring 103 is the source. Current flows from the drain to the source (in a direction $A_2$ in FIGS. 5A to 5C).

In consecutive periods T4 to Tn, operation which is similar to the operation in the period T2 or the period T3 is performed.

In the periods T3 to Tn, when the transistor 112a is on, the second signal having the potential $V_U$ is supplied from the wiring 102 to the wiring 103 in the first half of a period during which the transistor 112a is on, and the second signal having the potential V is supplied from the wiring 102 to the wiring 103 in the latter half of the period during which the transistor 112a is on. Therefore, in the first half of the period during which the transistor 112a is on, the terminal which is connected to the wiring 102 is the source, the terminal which is connected to the wiring 103 is the drain, and current flows from the drain to the source (in the direction $B_1$ in FIGS. 5A to 5C). In addition, in the latter half of the period during which the transistor 112a is on, the terminal which is connected to the wiring 102 is the drain, the terminal which is connected to the wiring 103 is the source, and current flows from the drain to the source (in the direction $A_1$ in FIGS. 5A to 5C).

Further, in the latter half of the period during which the transistor 112a is on (a period during which the transistor 112b is off), a potential of the wiring 102 is $V_L$, so that the level of the gate-source voltage (Vgs) of the transistor 112b is negative (Vgs<0 V). By providing a period during which the level of the gate-source voltage (Vgs) of the transistor 112b is negative (Vgs<0 V) in this manner, deterioration in the transistor can be effectively suppressed.

In the periods T3 to Tn, when the transistor 112b is on, the second signal having the potential $V_{LL}$ is supplied from the wiring 102 to the wiring 103 in the first half of a period during which the transistor 112b is on, and the second signal having the potential $V_{LH}$ is supplied from the wiring 102 to the wiring 103 in the latter half of the period during which the transistor 112b is on. Therefore, in the first half of the period during which the transistor 112b is on, the terminal which is connected to the wiring 102 is the source, the terminal which is connected to the wiring 103 is the drain, and current flows from the drain to the source (in the direction $B_2$ in FIGS. 5A to 5C). In addition, in the latter half of the period during which the transistor 112b is on, the terminal which is connected to the wiring 102 is the drain, the terminal which is connected to the wiring 103 is the source, and current flows from the drain to the source (in the direction $A_2$ in FIGS. 5A to 5C).

Further, in the latter half of the period during which the transistor 112b is on (a period during which the transistor 112a is off), the potential of the wiring 102 is $V_{LH}$, so that the level of the gate-source voltage (Vgs) of the transistor 112a is negative (Vgs<0 V). By providing a period during which the level of the gate-source voltage (Vgs) of the transistor 112a is negative (Vgs<0 V) in this manner, deterioration in the transistor can be effectively suppressed.

With a structure in which a plurality of transistors provided in parallel are alternately turned on and off and the direction of current flowing through the transistor is changed (the level of voltage applied to a first terminal and a second terminal (terminals serving as a source and a drain) of the transistor is changed every period (the source and the drain are switched)) in a period during which the transistor is on in this manner, concentration of an electric field on a channel portion (an end of the drain) of the transistor is relieved. Thus, deterioration in the transistor can be suppressed. Accordingly, a malfunction of a circuit due to deterioration in the transistor is suppressed, so that reliability can be improved.

Further, as illustrated in FIGS. 6A to 6G, it is preferable that the length of the period during which the transistor 112a or 112b is on and the length of the period during which the transistor 112a or 112b is off be the same or substantially the same in view of controllability. In this case, the direction of current flowing through the transistor can be changed every half of the period during which the transistor 112a or 112b is on.

Note that although FIGS. 6A to 6G illustrate the case where the plurality of transistors provided in parallel (the transistors 112a and 112b) are alternately turned on and off, the period during which the transistor 112a is on and the period during which the transistor 112b is on may partly overlap with each other, or the period during which the transistor 112a is of and the period during which the transistor 112b is off may partly overlap with each other. That is, a period during which both the transistors 112a and 112b are on or a period during which both the transistors 112a and 112b are off may be provided.

Although FIGS. 6C, 6E, and 6F illustrate the case where the cycle of the signal which is input to the wiring 102 (IN2) is half of the cycle of the signal which is input to the gate of the transistor 112a or 112b (IN4 or IN5), this embodiment is not limited to this. The cycle may be shorter or longer than half of the cycle of the signal which is input to the gate of the transistor 112a or 112b (IN4 or IN5). In addition, in FIG. 6C, the phase of the signal which is input to the wiring 102 (IN2) may be changed. For example, the phase of the signal which is input to the wiring 102 (IN2) may be changed by half or quarter of the cycle.

Further, in the operation of the structures illustrated in FIGS. 5A to 5C, the cycle of the signal which is input to the wiring 102 (IN2) is not limited to a cycle which is shorter than the cycle of the signal which is input to the gate of the transistor 112a or 112b (IN4 or IN5). The case where the cycle of the signal which is input to the wiring 102 (IN2) is equal to the cycle of the signal which is input to the gate of the transistor 112a or 112b (IN4 or IN5) and the case where the cycle of the signal which is input to the wiring 102 (IN2) is longer than the cycle of the signal which is input to the gate of the transistor 112a or 112b (IN4 or IN5) are described below with reference to drawings.

[Operation in the Case where the Cycle of IN2 is Longer than the Cycle of IN4 or IN5]

In the following description, FIGS. 7A to 7F and FIGS. 5A to 8F illustrate the signal which is output from the wiring 103 (Out), the signal which is input to the wiring 101 (IN1), the signal which is input to the wiring 102 (IN2), the signal which is input to the gate of the transistor 111 (IN3), the signal which is input to the gate of the transistor 112a (IN4), and the signal which is input to the gate of the transistor 112b (IN5). FIGS. 7C, 7E, and 7F and FIGS. 8C, 8E, and 8F illustrate the case where the cycle of the signal which is input to the wiring 102 (IN2) is longer than the cycle of the signal which is input to the gate of the transistor 112a or 112b (IN4 or IN5)(the case where the cycle of IN2 is twice the cycle of IN4 or IN5). Needless to say, signals to be input (IN1 to IN5) are just examples, and signals are not limited to the signals illustrated in FIGS. 7A to 7F and FIGS. 8A to 8F.

In addition, FIG. 7G and FIG. 8G illustrate the direction of current flowing through the transistor 112a and the transistor 112b, and $A_1$, $A_2$, $B_1$ and $B_2$ correspond to the directions illustrated in FIGS. 5A to 5C. Further, a period during which the transistor is of and current does not flow is indicated by x. Furthermore, a period during which the transistor is on but current does not flow is indicated by -.

First, in the period T1, the signal for turning on the transistor 111 (IN3) is input to the gate of the transistor 11. Here, operation which is similar to the operation in the period T1 in FIGS. 6A to 6G is performed.

Next, in the period T2, the signal for turning on the transistor 112a (IN4) is input to the gate of the transistor 112a. In this case, in the transistor 112a, the potential of the terminal which is connected to the wiring 102 (in this case, $V_{LL}$) is lower than the potential of the terminal which is connected to the wiring 103 (in this case, $V_H$), so that the terminal which is connected to the wiring 102 is the source and the terminal which is connected to the wiring 103 is the drain. Accordingly, the gate-source potential of the transistor 112a (VgsB=$V_H$-$V_{LL}$) is higher than the threshold voltage of the transistor 112a, so that the transistor 112a is turned on. Thus, the second signal which corresponds to the signal input to the wiring 102 (IN2) and has the potential $V_L$ (the non-selection signal) is supplied to the wiring 103 through the transistor 112a.

In the case where the gate of the transistor 121 is connected to the wiring 103 (see FIG. 5C), the non-selection signal is input to the gate of the transistor 121 which is connected to the wiring 103, so that the transistor 121 is turned off.

In this manner, in the period T2, in the transistor 112a, the potential of the terminal which is connected to the wiring 102 is lower than the potential of the terminal which is connected to the wiring 103, so that the terminal which is connected to the wiring 102 is the source and the terminal which is connected to the wiring 103 is the drain. Current flows from the drain to the source (in the direction $B_1$ in FIGS. 5A to 5C).

Next, in the period T3, the signal for turning off the transistor 112a (IN4) is input to the gate of the transistor 112a, and the signal for turning on the transistor 112b (IN5) is input to the gate of the transistor 112b, so that on/off of the transistors 112a and 112b is switched. In this case, in the transistor 112b, the potential of the terminal which is connected to the wiring 102 (in this case, $V_{LH}$) is higher than the potential of the terminal which is connected to the wiring 103 (in this case, $V_{LL}$), so that the terminal which is connected to the wiring 102 is the drain and the terminal which is connected to the wiring 103 is the source. Accordingly, the gate-source potential of the transistor 112b (VgsA=$V_H$-$V_{LL}$) is higher than the threshold voltage of the transistor 112b, so that the transistor 112b is turned on. Thus, the second signal which corresponds to the signal input to the wiring 102 (IN2) and has the potential $V_{LH}$ (the non-selection signal) is supplied to the wiring 103 through the transistor 112b.

In this manner, in the period T3, in the transistor 112b, the potential of the terminal which is connected to the wiring 103 is lower than the potential of the terminal which is connected to the wiring 102, so that the terminal which is connected to the wiring 103 is the source and the terminal which is connected to the wiring 102 is the drain. Current flows from the drain to the source (in the direction $A_2$ in FIGS. 5A to 5C).

Further, in the period T3, the level of the gate-source voltage (Vgs) of the transistor 112a is negative (Vgs<0 V). By providing a period during which the level of the gate-source voltage (Vgs) of the transistor 112a is negative (Vgs<0 V) in this manner, deterioration in the transistor can be more effectively suppressed as compared to the case where Vgs=0 V.

Next, in the period T4, the signal for turning on the transistor 112a (IN4) is input to the gate of the transistor 112a, and the signal for turning off the transistor 112b (IN5) is input to the gate of the transistor 112b, so that on/off of the transistors 112a and 112b is switched. In addition, since the potential of the wiring 102 is kept at $V_{LH}$, the potential of the wiring 103 is also kept at $V_{LH}$. Therefore, in the transistor 112a, the potential of the terminal which is connected to the wiring 102 is equal to the potential of the terminal which is connected to the wiring 103, so that current does not flow through the transistor 112a.

Next, in the period T5, the signal for turning off the transistor 112a (IN4) is input to the gate of the transistor 112a, and the signal for turning on the transistor 112b (IN5) is input to the gate of the transistor 112b, so that on/off of the transistors 112a and 112b is switched. In this case, in the transistor 112b, the potential of the terminal which is connected to the wiring 102 (in this case, $V_{LL}$) is lower than the potential of the terminal which is connected to the wiring 103 (in this case, $V_{LH}$), so that the terminal which is connected to the wiring 102 is the source and the terminal which is connected to the wiring 103 is the drain. Accordingly, the gate-source potential of the transistor 112b (VgsB=$V_H$-$V_{LL}$) is higher than the threshold voltage of the transistor 112b, so that the transistor 112h is turned on. Thus, the second signal which corresponds to the signal input to the wiring 102 (IN2) and has the potential $V_{LL}$ (the non-selection signal) is supplied to the wiring 103 through the transistor 112b.

In this manner, in the period T5, in the transistor 112b, the potential of the terminal which is connected to the wiring 102 is lower than the potential of the terminal which is connected to the wiring 103, so that the terminal which is connected to the wiring 102 is the source and the terminal which is connected to the wiring 103 is the drain. Current flows from the drain to the source (in the direction 132 in FIGS. 5A to 5C).

In consecutive periods T6 to Tn, the operation in the periods T2 to is repeated. Thus, the transistor 111 is kept off, the transistors 112a and 112b are alternately turned on, and a signal whose potential is switched between the potential $V_{LH}$ and the potential $V_{LL}$ every given period is input to the wiring 103. Therefore, in the case where the gate of the transistor 121 is connected to the wiring 103, the transistor 121 is stably kept off.

Note that in the operating method illustrated in FIGS. 7A to 7G, it is impossible to change the direction of current flowing through the transistor 112a (to switch the source and the drain). Therefore, it is preferable to use a structure where the cycle of the signal which is input to the wiring 102 (IN2) is changed every certain period and the direction of current flowing through the transistor 112a is changed.

FIGS. 8A to 8G illustrate the case where the cycle of the signal which is input to the wiring 102 (IN2) is changed and the direction of current flowing through the transistor 112a is changed. In the operation illustrated in FIGS. 8A to 8G, it is impossible to change the direction of current flowing through the transistor 112b (to switch the source and the drain). Therefore, in operating the circuit, by switching the operation illustrated in FIGS. 7A to 7O and the operation illustrated in FIGS. 8A to 8G, deterioration in the transistor 112a and the transistor 112b can be suppressed even in the case where the cycle of the signal which is input to the wiring 102 (IN2) is made longer than the cycle of the signal which is input to the transistor 112a or 112b (IN4 or IN5).

Note that although FIGS. 7A to 7G, and FIGS. 8A to 8G illustrate the case where the plurality of transistors provided in parallel (the transistors 112a and 112b) are alternately turned on and off, the period during which the transistor 112a is on and the period during which the transistor 112b is on may partly overlap with each other, or the period during which the transistor 112a is off and the period during which the transistor 112b is off may partly overlap with each other. That is, a period during which both the transistors 112a and 112b are on or a period during which both the transistors 112a and 112h are off may be provided.

Although FIGS. 7C, 7E, and 7F and FIGS. 8C, 8E, and 8F illustrate the case where the cycle of the signal which is input to the wiring 102 (IN2) is twice the cycle of the signal which is input to the gate of the transistor 112a or 112b (IN4 or IN5), this embodiment is not limited to this. The cycle may be shorter or longer than twice the cycle of the signal which is input to the gate of the transistor 112a or 112b (IN4 or IN5).

[Operation in the Case where the Cycle of IN2 is Equal to the Cycle of IN4 or IN5]

In the following description, FIGS. 9A to 9F and FIGS. 10A to 10F illustrate the signal which is output from the wiring 103 (Out), the signal which is input to the wiring 101 (IN1), the signal which is input to the wiring 102 (IN2), the signal which is input to the gate of the transistor 111 (IN3), the signal which is input to the gate of the transistor 112a (IN4), and the signal which is input to the gate of the transistor 112b (IN5). FIGS. 9C, 9E, and 9F and FIGS. 10C, 10E, and 10F illustrate the case where the cycle of the signal which is input to the wiring 102 (IN2) is equal to the cycle of the signal which is input to the gate of the transistor 112a or 112b (IN4 or IN5). Needless to say, signals to be input (IN1 to IN5) are just examples, and signals are not limited to the signals illustrated in FIGS. 9A to 9F and FIGS. 10A to 10F.

In addition, FIG. 9G and FIG. 10G illustrate the direction of current flowing through the transistor 112a and the transistor 112b, and $A_1$, $A_2$, $B_1$, and $B_2$ correspond to the directions illustrated in FIGS. 5A to 5C. Further, a period during which the transistor is off and current does not flow is indicated by x. Furthermore, a period during which the transistor is on but current does not flow is indicated by -.

In this embodiment, the transistors are operated by alternately performing the operation illustrated in FIGS. 9A to 9G and the operation illustrated in FIGS. 10A to 10G every given period.

First, in periods Tx1 to Txn, the second signal having the potential $V_{LL}$ is supplied from the wiring 102 to the wiring 103 when the transistor 112a is on, and the second signal having the potential $V_{LH}$ is supplied from the wiring 102 to the wiring 103 when the transistor 112b is on (see FIGS. 9A to 9G).

Therefore, in the periods Tx1 to Txn, when the transistor 112a is on, in the transistor 112a the terminal which is connected to the wiring 102 is the source, the terminal which is connected to the wiring 103 is the drain, and current flows from the drain to the source (in the direction $B_1$ in FIGS. 5A to 5C). In addition, when the transistor 112b is on, in the transistor 112b, the terminal which is connected to the wiring 103 is the source, the terminal which is connected to the wiring 102 is the drain, and current flows from the drain to the source (in the direction $A_2$ in FIGS. 5A to 5C). Further, in the case where the transistor 112a is off, the level of the gate-source voltage (Vgs) of the transistor 112a can be negative (Vgs<0 V). Thus, deterioration in the transistor can be more effectively suppressed as compared to the case where Vgs=0 V.

Note that in each of the transistor 112a and the transistor 112b, in the case where current flows and the potential or the terminal which is connected to the wiring 102 is equal to the potential of the terminal which is connected to the wiring 103, there is no distinction between the source and the drain.

First, in periods Ty1 to Tyn, the second signal having the potential $V_{LH}$ is supplied from the wiring 102 to the wiring 103 when the transistor 112a is on, and the second signal having the potential $V_{LL}$ is supplied from the wiring 102 to the wiring 103 when the transistor 112b is on (see FIGS. 10A to 10G).

Therefore, in the periods Ty1 to Tyn, when the transistor 112a is on, in the transistor 112a, the terminal which is connected to the wiring 102 is the drain, the terminal which is connected to the wiring 103 is the source, and current flows from the drain to the source (in the direction $A_1$ in FIGS. 5A to 5C). In addition, when the transistor 112b is on, in the transistor 112b, the terminal which is connected to the wiring 103 is the drain, the terminal which is connected to the wiring 102 is the source, and current flows from the drain to the source (in the direction $B_2$ in FIGS. 5A to 5C). Further, in the case where the transistor 112b is of the level of the gate-source voltage (Vgs) of the transistor 112b can be negative (Vgs<0 V). Thus, deterioration in the transistor can be more effectively suppressed as compared to the case where Vgs=0 V.

Therefore, by changing (for example, inverting) the cycle of the signal which is input to the wiring 102 (IN2) every given period and by combining the operation in FIGS. 9A to 9G with the operation in FIGS. 10A to 10G (for example, see FIGS. 11A to 11G), a structure can be used in which the direction of current flowing through the transistors 112a and 112b is changed (the level of voltage applied to the terminals serving as the source and the drain of the transistor is changed every period (the source and the drain are switched)). Accordingly, concentration of an electric field on channel portions (ends of the drains) of the transistors 112a and 112b is relieved. Thus, deterioration can be suppressed. Further, by alternately turning on and off the plurality of transistors provided in parallel (the transistors 112a and 112b) deterioration in the transistors can be suppressed.

In a given period, for example, in the case where the semiconductor device in this embodiment is used as a gate driver of a display device, the operation illustrated in FIGS. 9A to 9G and the operation illustrated in FIGS. 10A to 10G can be switched every one frame period.

Note that although FIGS. 9A to 9G and FIGS. 11A to 10G illustrate the case where rising and falling of the signal which is input to the wiring 102 (IN2) and the signal which is input to the gate of the transistor 112a or 112b (IN4 or IN5) are performed at the same timing, this embodiment is not limited to this. For example, the operation may be performed by changing the cycle of the signal which is input to the wiring 102 (IN2) by quarter of the cycle.

With a structure in which a plurality of transistors provided in parallel are alternately turned on and off and the direction of current flowing through the plurality of transistors is changed (the level of voltage applied to terminals serving as a source and a drain of the transistor is changed every period (the source and the drain are switched)) as illustrated in this embodiment, concentration of an electric field on a channel portion (an end of the drain) of the transistor is relieved. Thus, deterioration in the transistor can be effectively suppressed.

Note that although n-channel transistors are used as the transistors 111, 112a, 112b, and 121 in this embodiment, p-channel transistors may be used. Also in this case, by performing operation such that the direction of current flowing through the transistors 112a and 112b is changed, deterioration in the transistors is suppressed, so that a malfunction of the circuit can be suppressed.

Further, in this embodiment, a structure where L-level signals are continuously output in operating the circuit is used. However, in the case where H-level signals are continuously output, a structure can be used in which a plurality of transistors are provided in parallel with each other between the wiring 101 and the wiring 103 and a signal whose potential is switched between the first potential $V_{LH}$ and the second potential $V_{LL}$ every given period is used as the signal which is input to the wiring 101.

Note that the structure described in this embodiment can be combined with a different structure described in this specification (including a structure described in any of the other embodiments) as appropriate.

Embodiment 3

In this embodiment, examples of a semiconductor device having a structure which is different from the structure in the above embodiment are described with reference to drawings.

Figure 12A:
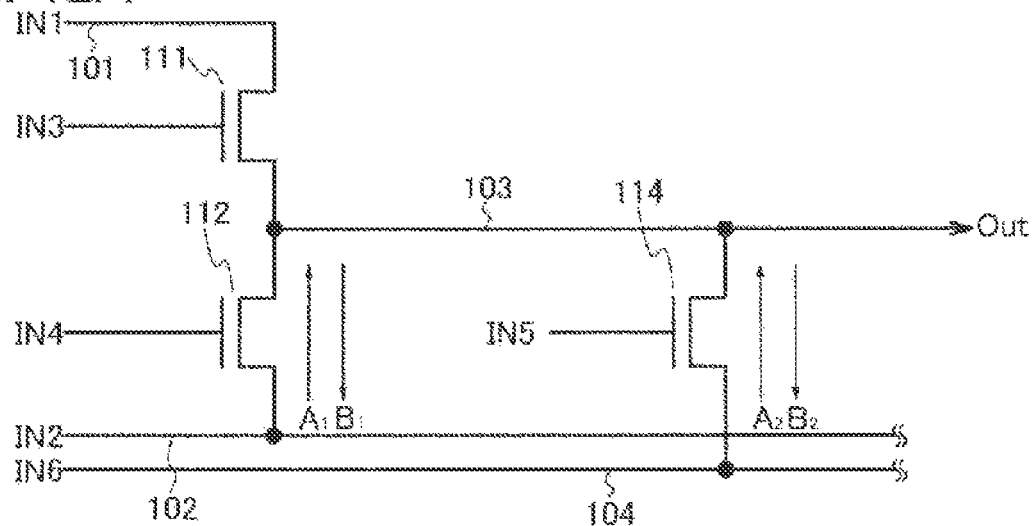
FIGS. 12A to 12C illustrate examples of a semiconductor device.

The semiconductor device described in this embodiment includes at least the transistor 111 provided between the wiring 101 and the wiring 103, the transistor 112 provided between the wiring 102 and the wiring 103, and a transistor 114 provided between a wiring 104 and the wiring 103 (see FIG. 12A).

Figure 12B:
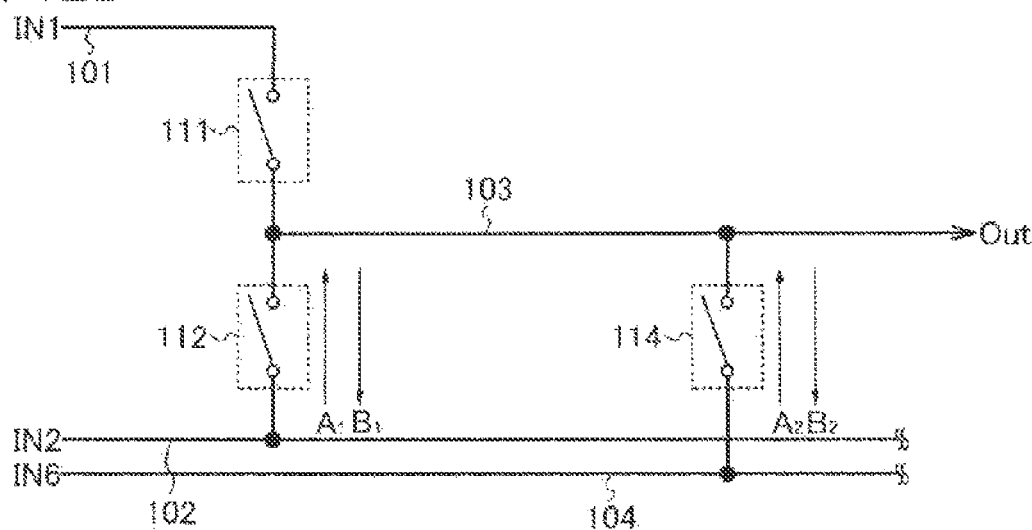
Figure 12C:
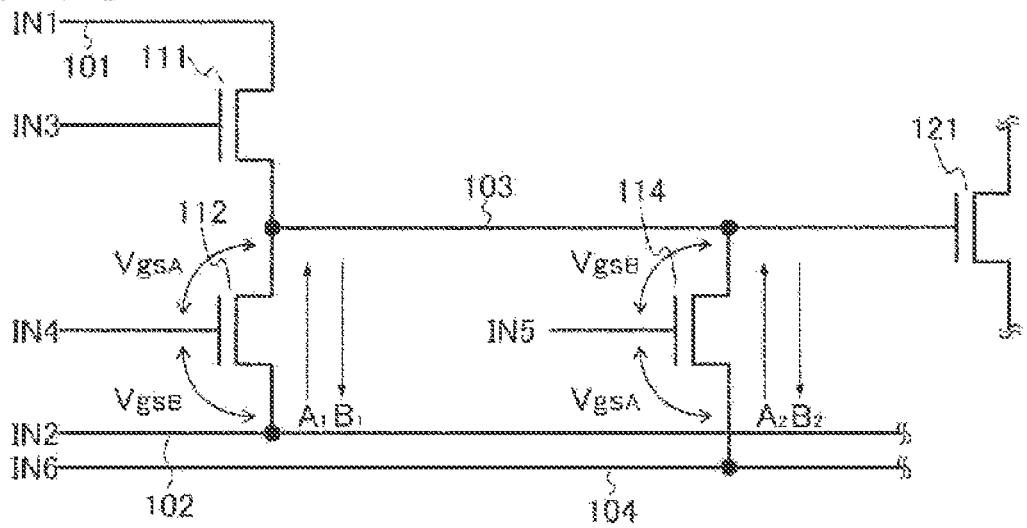

One of a source and a drain of the transistor 114 is electrically connected to the wiring 104, and the other of the source and the drain of the transistor 114 is electrically connected to the wiring 103. That is, the structures illustrated in FIGS. 12A to 12C are structures obtained by adding the wiring 104 to the structures illustrated in FIGS. 5A to 5C and by electrically connecting the one of the source and the drain of the transistor 112b in FIGS. 5A to 5C not to the wiring 102 but to the wiring 104. Therefore, by turning on the transistor 114, a signal which is input to the wiring 104 (IN6) is supplied to the wiring 103.

Therefore, a first signal corresponding to the signal which is input to the wiring 101 (IN1), a second signal corresponding to the signal which is input to the wiring 102 (IN2), or a third signal corresponding to the signal which is input to the wiring 104 (IN6) is supplied to the wiring 103.

By separately providing the wiring 102 and the wiring 104 in this manner, different signals can be simultaneously supplied to the transistor 112 and the transistor 114. Accordingly, the frequency of signals is lowered, so that power consumption can be reduced.

Note that although n-channel transistors are used as the transistors 111, 112, and 114 in FIGS. 12A to 12C, p-channel transistors may be used or CMOSs may be used. Further, the transistor 111 serves as a switch provided between the wiring 101 and the wiring 103; the transistor 112 serves as a switch provided between the wiring 102 and the wiring 103; the transistor 114 serves as a switch provided between the wiring 104 and the wiring 103 (see FIG. 12B).

In this embodiment, in the case where certain signals (e.g., non-selection signals) are continuously supplied to the wiring 103, a structure is used in which a plurality of transistors each having one of a source and a drain which is connected to the wiring 103 and the other of the source and the drain which is connected to a different wiring (the transistors 112 and 114 in FIGS. 12A to 12C) are alternately turned on and off and the direction of current flowing through the plurality of transistors is changed (the level of voltage applied to terminals serving as the sources and the drains of the transistors is changed every period (the sources and the drains are switched)). That is, by controlling on/off of the plurality of transistors and the direction of current flowing through the transistors, concentration of an electric field on channel portions (ends of the drains) of the transistors is relieved, so that deterioration is suppressed.

A specific operating method is described below with reference to drawings.

In the following description, FIGS. 13A to 13G and FIGS. 14A to 14G illustrate the signal which is output from the wiring 103 (Out), the signal which is input to the wiring 101 (IN1), the signal which is input to the wiring 102 (IN2), the signal which is input to the wiring 104 (IN6), the signal which is input to the gate of the transistor 111 (IN3), the signal which is input to the gate of the transistor 112 (IN4), and a signal which is input to a gate of the transistor 114 (IN5). Needless to say, signals to be input (IN1 to IN6) are just examples, and signals are not limited to the signals illustrated in FIGS. 13A to 13G and FIGS. 14A to 14G.

In addition, FIG. 13H and FIG. 14H illustrate the direction of current flowing through the transistor 112 and the transistor 114, and $A_1$, $A_2$, $B_1$, and $B_2$ correspond to the directions illustrated in FIGS. 12A to 12C. Further, a period during which the transistor is off and current does not flow is indicated by x. Furthermore, a period during which the transistor is on but current does not flow is indicated by -.

In FIGS. 13A to 13H and FIGS. 14A to 14H, the potential $V_{LL}$ and the potential $V_{LH}$ are alternately applied to the wiring 102 and the wiring 104 every given period. In the following description, the case where the periods Tx1 to Txn during which the potential $V_{LL}$ is applied to the wiring 102 and the potential $V_{LH}$ is applied to the wiring 104 and the periods Ty1 to Tyn during which the potential $V_{LH}$ is applied to the wiring 102 and the potential $V_{LL}$ is applied to the wiring 104 are switched every given period is described.

First, in the periods Tx1 to Txn, when the transistor 111 is on (in the period Tx1), the first signal corresponding to the signal which is input to the wiring 101 (IN1) (here, an H-level signal (a selection signal)) is supplied to the wiring 103. In the case where the gate of the transistor 121 is connected to the wiring 103 (see FIG. 12C), the selection signal is input to the gate of the transistor 121 which is connected to the wiring 103, so that the transistor 121 is turned on.

In addition, in the periods Tx1 to Txn, the second signal having the potential $V_{LL}$ is supplied from the wiring 102 to the wiring 103 when the transistor 112 is on (here, in the periods Tx2, Tx4, Tx6, Tx8, and Txn), and the third signal having the potential $V_{LH}$ is supplied from the wiring 104 to the wiring 103 when the transistor 114 is on (here, in the periods Tx3, Tx5, and Tx7) (see FIGS. 13A to 13H). In the case where the gate of the transistor 121 is connected to the wiring 103 (see FIG. 12C), the transistor 121 is turned off.

Therefore, in the periods Tx1 to Txn, when the transistor 112 is on, in the transistor 112, the terminal which is connected to the wiring 102 is the source, the terminal which is connected to the wiring 103 is the drain, and current flows from the drain to the source (in a direction $B_1$ in FIGS. 12A to 12C). In addition, when the transistor 114 is on, in the transistor 114, a terminal which is connected to the wiring 103 is the source, a terminal which is connected to the wiring 102 is the drain, and current flows from the drain to the source (in a direction $A_2$ in FIGS. 12A to 12C).

In the periods Ty1 to Tyn, the second signal having the potential $V_{LH}$ is supplied from the wiring 102 to the wiring 103 when the transistor 112 is on (here, in the periods Ty4, Ty6, Ty8, and Tyn), and the third signal having the potential $V_{LL}$ is supplied from the wiring 104 to the wiring 103 when the transistor 114 is on (here, in the periods Ty3, Ty5, and Ty7) (see FIGS. 14A to 14H).

Therefore, in the periods Ty1 to Tyn, when the transistor 112 is on, in the transistor 112, the terminal which is connected to the wiring 102 is the drain, the terminal which is connected to the wiring 103 is the source, and current flows from the drain to the source (in a direction $A_1$ in FIGS. 12A to 12C). In addition, when the transistor 114 is on, in the transistor 114, the terminal which is connected to the wiring 103 is the drain, the terminal which is connected to the wiring 102 is the source, and current flows from the drain to the source (in a direction $B_2$ in FIGS. 12A to 12C).

Therefore, by inverting the signal which is input to the wiring 102 (IN2) and the signal which is input to the wiring 104 (IN6) every given period and by combining the operation in FIGS. 13A to 13H with the operation in FIGS. 14A to 14H (for example, see FIGS. 15A to 15H), a structure can be used in which the direction of current flowing through the transistors 112 and 114 is changed (the level of voltage applied to the terminals serving as the source and the drain of the transistor is changed every period (the source and the drain are switched)). Accordingly, concentration of an electric field on channel portions (ends of the drains) of the transistors 112 and 114 is relieved. Thus, deterioration can be suppressed. Further, by alternately turning on and off the plurality of transistors (the transistors 112 and 114), deterioration in the transistors can be suppressed.

In a given period, for example, in the case where the semiconductor device in this embodiment is used as a gate driver of a display device, the operation illustrated in FIGS. 13A to 13H and the operation illustrated in FIGS. 14A to 14H can be switched every one frame period.

Further, with the structure described in this embodiment, even in the case where certain signals having a plurality of potentials (e.g., non-selection signals) are continuously supplied to the wiring 103, potentials of the wirings 102 and 104 can be made constant. Thus, power consumption can be reduced.

Note that the structure described in this embodiment can be combined with a different structure described in this specification (including a structure described in any of the other embodiments) as appropriate.

Embodiment 4

In this embodiment, applications of the structures described in the above embodiments are described with reference to drawings.

Figure 16:
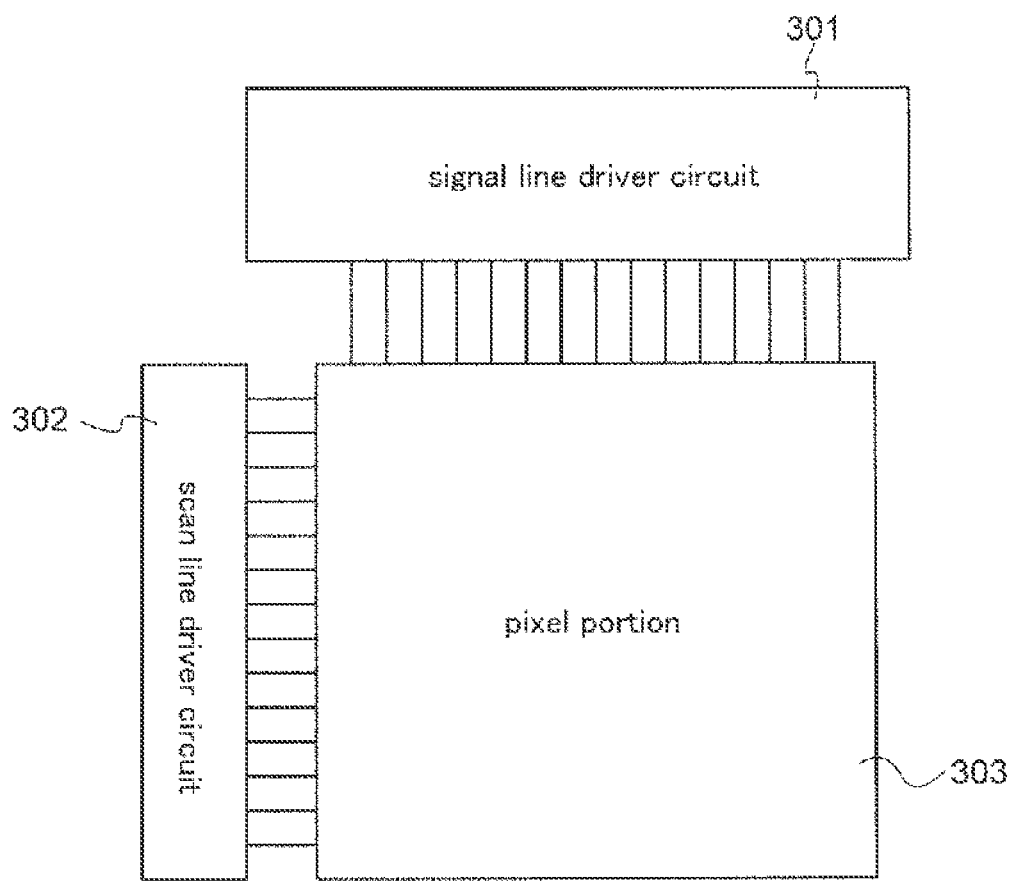
FIG. 16 illustrates an example of a semiconductor device.

Any of the structures described in the above embodiments can be used for a scan line driver circuit and/or a signal line driver circuit (see FIG. 16). A display device includes the scan line driver circuit (gate driver), the signal line driver circuit (source driver), and a pixel portion.

Figure 17:
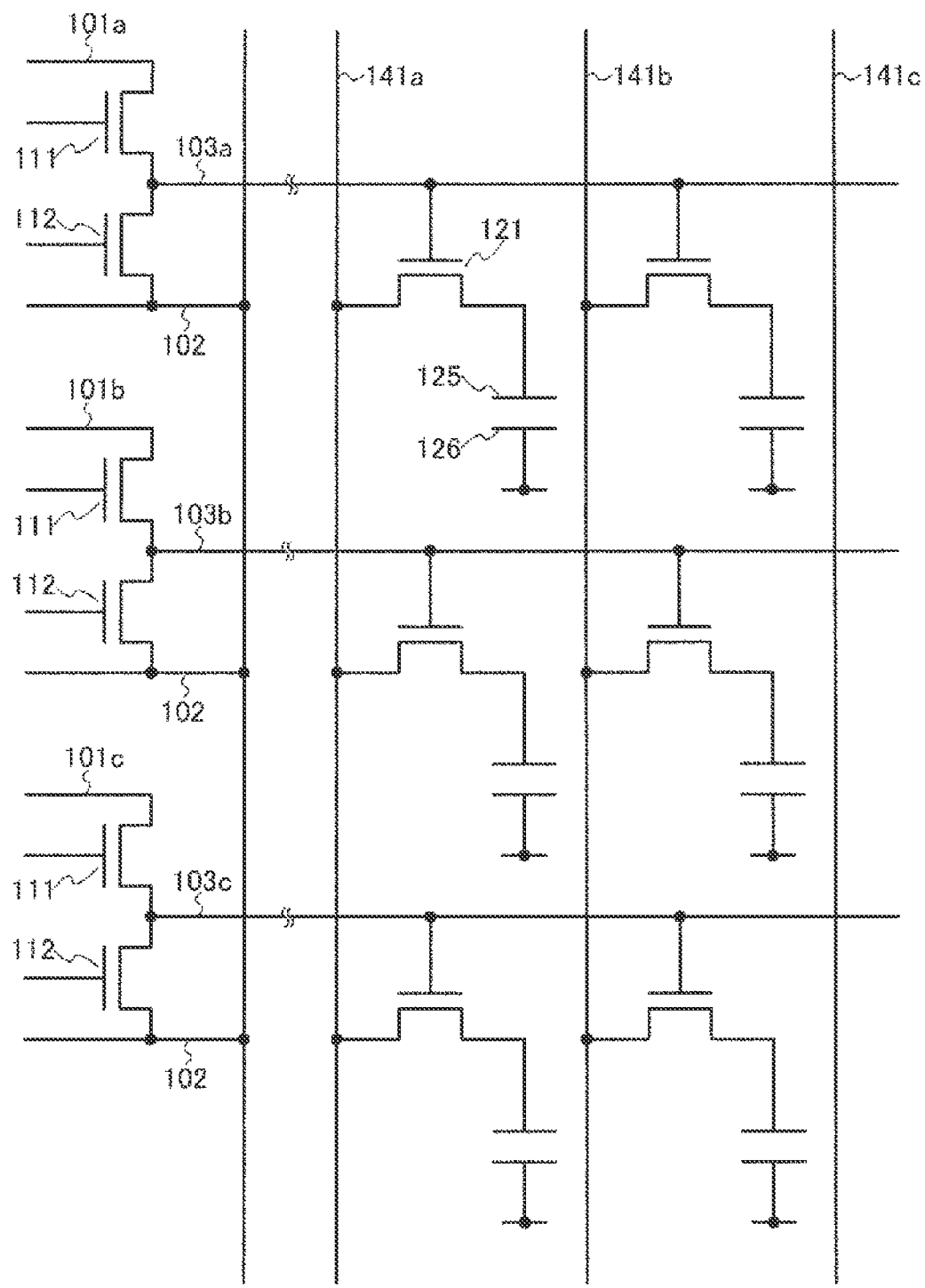
FIG. 17 illustrates an example of a semiconductor device.

FIG. 17 illustrates the case whom the structure described in Embodiment 1 is used for a gate driver of a display device. In specific, FIG. 17 illustrates the case where the structure described in Embodiment 1 is used for a gale driver of a liquid crystal display device including a plurality of pixels.

In each of the transistors 121 provided in the plurality of pixels, the gate is electrically connected to any one of wirings 103a to 103c serving as gate lines; the one of the source and the drain is electrically connected to any one of wirings 141a to 141c serving as source lines; the other of the source and the drain is electrically connected to a pixel electrode 125. In addition, a liquid crystal material is provided between the pixel electrode 125 and a counter electrode 126. Note that although wirings 101a to 101c are electrically isolated from each other in FIG. 17, the wirings 101a to 101c may be provided in common.

In addition, in order to turn on the transistors 121, H-level signals which are selection signals are supplied from the wirings 101a to 101c through the transistors 111. In order to turn off the transistors 121, L-level signals which are non-selection signals are supplied from the wirings 102 through the transistors 112.

In the case of a method by which data is written by selecting pixels in each row, such as a line-at-a-time driving method, it is necessary to supply a non-selection signal for turning off the transistor 121 provided in each pixel to the gate of the transistor 121 after the transistor 121 is turned on. In particular, it is effective to continuously supply non-selection signals to the wirings 103a to 103c through the transistors 112 for a predetermined period in turning off the transistors 121 stably.

Here, by using a structure where a plurality of L-level signals which are non-selection signals are input to the wirings 102 and the direction of current flowing through the transistors 112 is changed in a period during which the transistors 112 are on as described in Embodiment 1, deterioration in the transistors 112 can be suppressed. Accordingly, the transistor 121 provided in each pixel can be stably turned off and a malfunction of a circuit due to deterioration in the transistors 112 can be suppressed.

In particular, in the case where amorphous silicon or microcrystalline silicon is used for a channel formation region of a transistor, it is effective to suppress deterioration in a transistor which is kept on for a long time in an operating period of a circuit in suppressing a malfunction of the circuit.

In addition, although n-channel transistors are used as all the transistors 111 and 112 provided in the gate driver and the transistors 121 provided in the pixels in FIG. 17, p-channel transistors may be used or CMOSs can be used.

Further, although FIG. 17 illustrates the case where the structure described in Embodiment 1 is used for the gate driver, this embodiment is not limited to this. The structure described in Embodiment 2 or 3 can be used.

Figure 18:
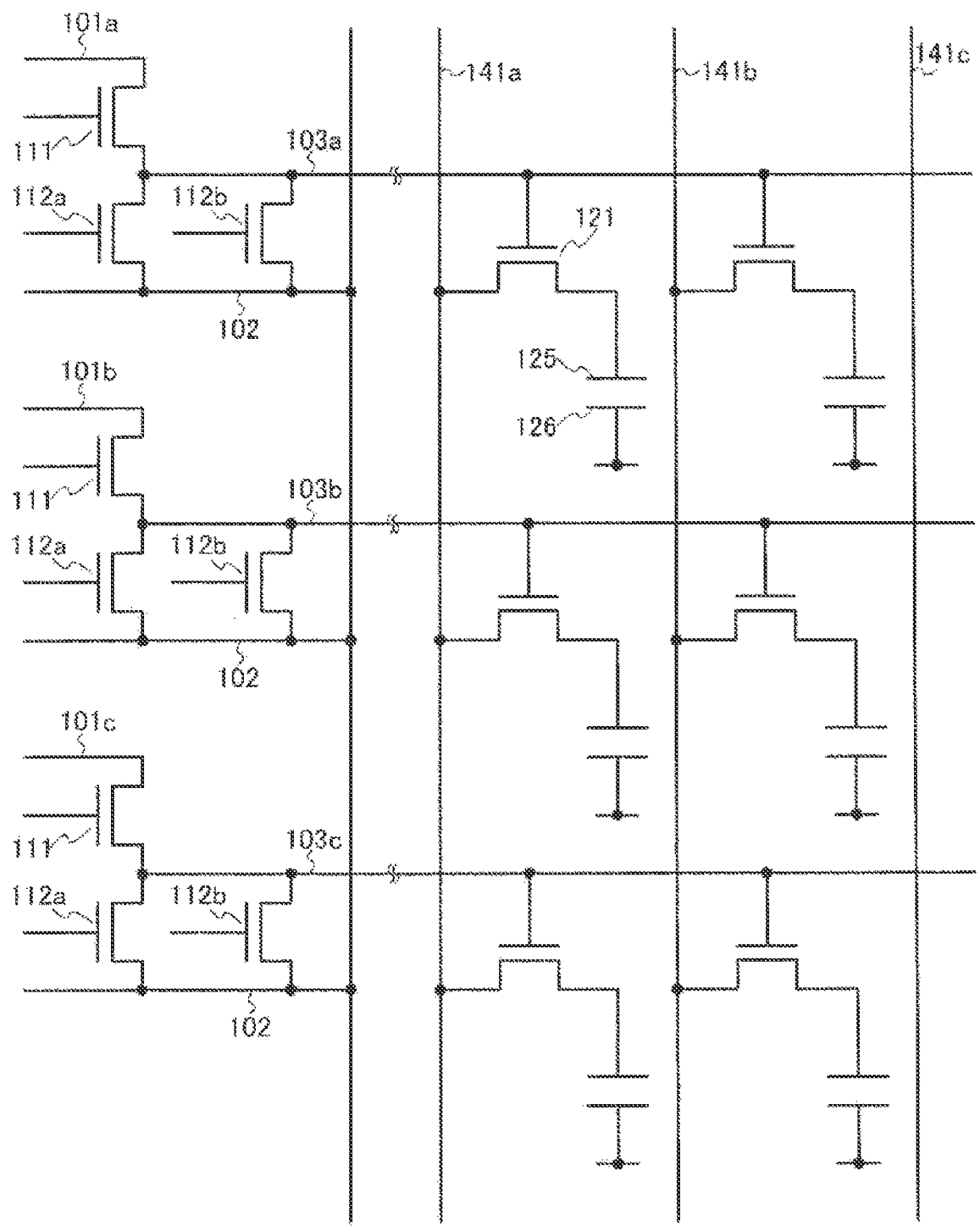
FIG. 18 illustrates an example of a semiconductor device.

In the case where the structure described in Embodiment 2 is used, in FIG. 17, the transistor 112b may be provided (see FIG. 18). The one of the source and the drain of the transistor 112b is electrically connected to the wiring 102. The other of the source and the drain of the transistor 112b is connected to the wiring 103a (or the wiring 103b or 103c). The transistor 112b is provided in parallel with the transistor 112.

Figure 19:
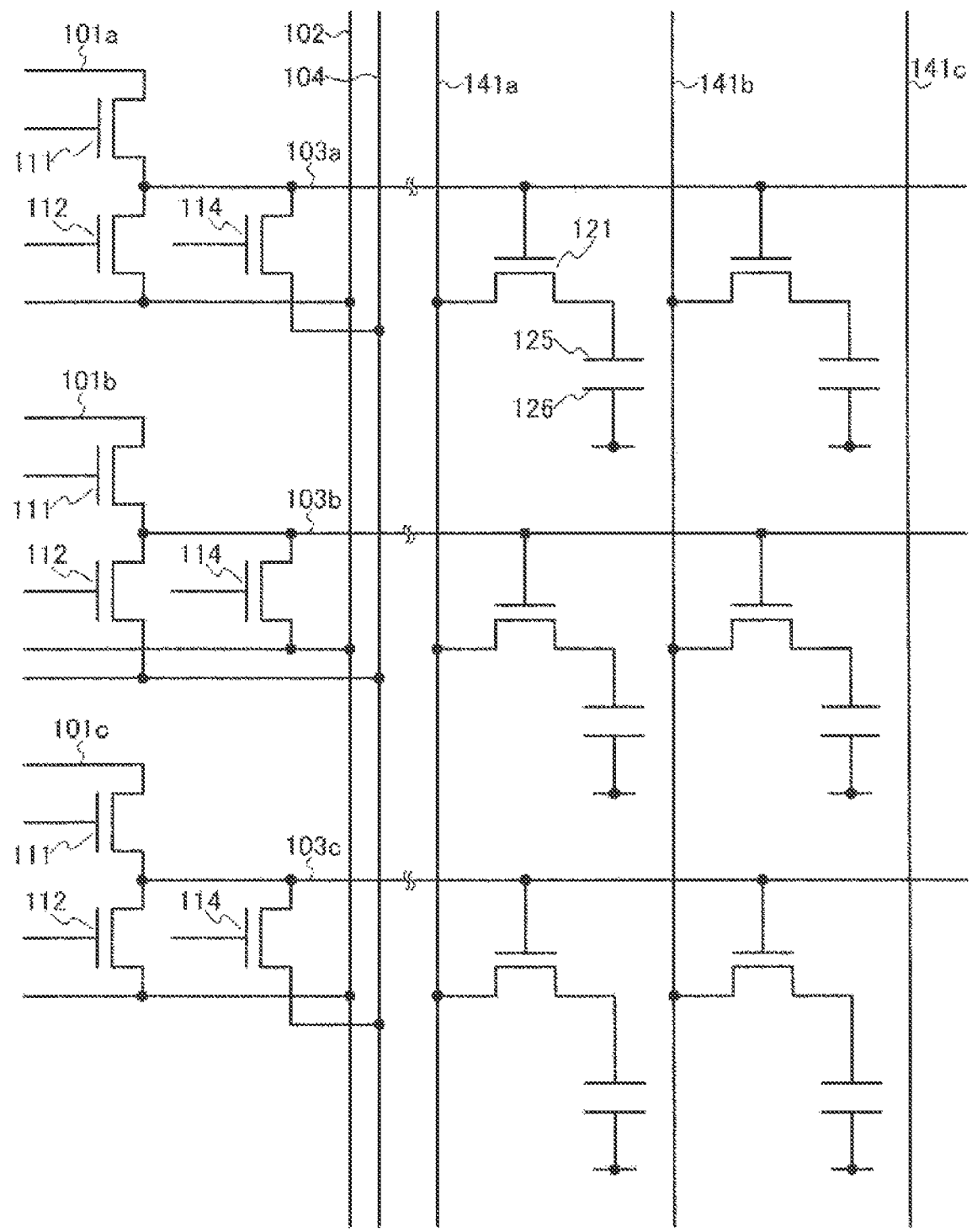
FIG. 19 illustrates an example of a semiconductor device.

In the case where the structure described in Embodiment 3 is used, in FIG. 17, the wiring 104 may be additionally provided and the transistor 114 may be provided (see FIG. 19). The one of the source and the drain of the transistor 114 is electrically connected to the wiring 104. The other of the source and the drain of the transistor 114 is connected to the wiring 103a (or the wiring 103b or 103c).

Note that FIG. 19 illustrates the case where a structure in which the one of the source and the drain of the transistor 112 is electrically connected to the wiring 102 and the one of the source and the drain of the transistor 114 is electrically connected to the wiring 104 and a structure in which the one of the source and the drain of the transistor 112 is electrically connected to the wiring 104 and the one of the source and the drain of the transistor 114 is electrically connected to the wiring 102 are alternately provided in a row direction; however, this embodiment is not limited to this. In all the rows, the one of the source and the drain of the transistor 112 may be electrically connected to the wiring 102 and the one of the source and the drain of the transistor 114 may be electrically connected to the wiring 104, or the one of the source and the drain of the transistor 112 may be electrically connected to the wiring 104 and the one of the source and the drain of the transistor 114 may be electrically connected to the wiring 102.

Further, although FIG. 17, FIG. 18, and FIG. 19 illustrate the case where any of the structures described in the above embodiments is used for a liquid crystal display device, any of the structures described in the above embodiments can be used for a gate driver and/or a source driver of a different display device (e.g., an organic EL display device). For example, as illustrated in FIG. 20, any of the structures described in the above embodiments can be used for a gate driver of an organic EL display device including the transistor 121, a transistor 128, and a light-emitting element 129 in a pixel.

Figure 20:
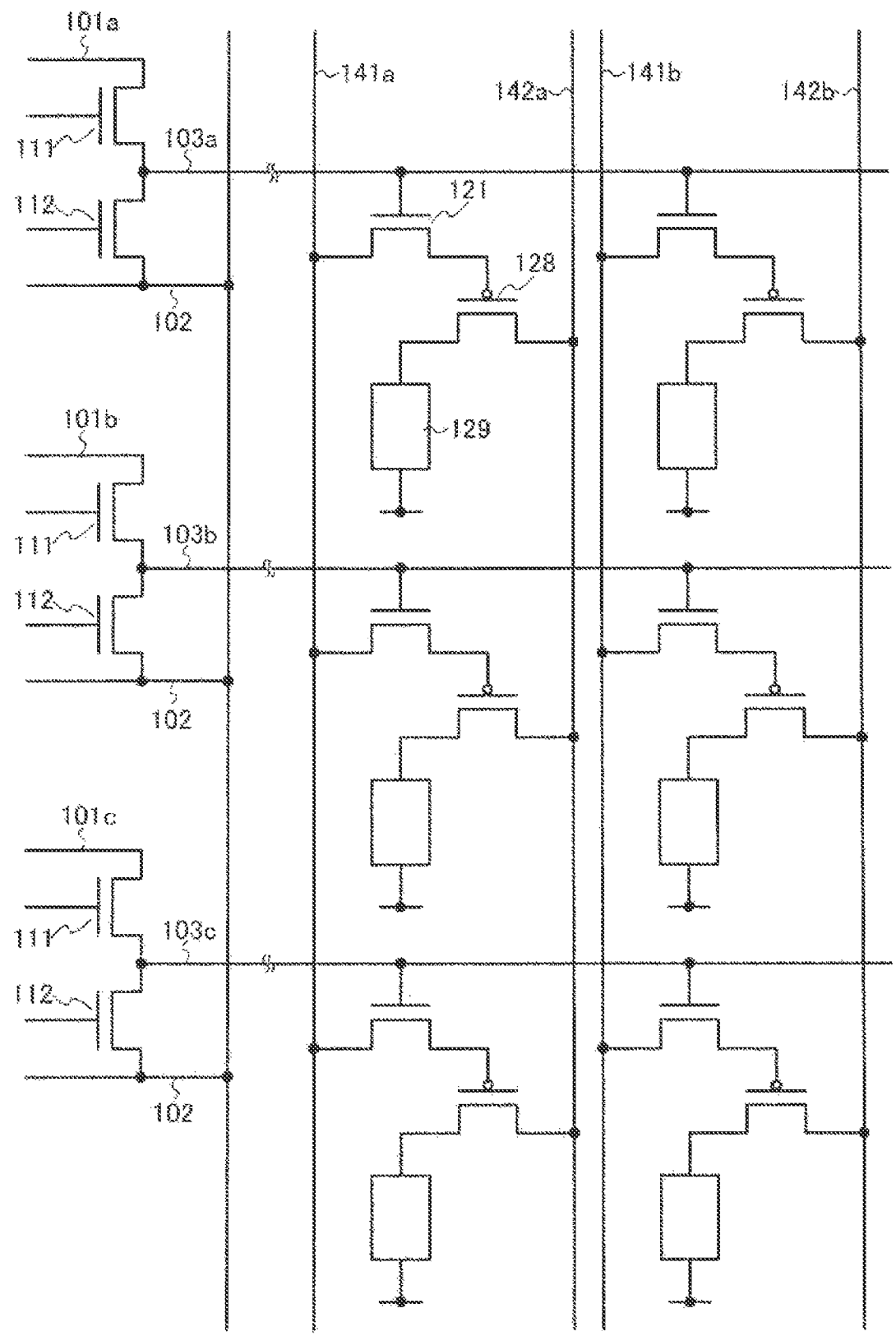
FIG. 20 illustrates an example of a semiconductor device.

In FIG. 20, in each of the transistors 121 provided in a plurality of pixels, the gate is electrically connected to any one of the wirings 103a to 103c, and the one of the source and the drain is electrically connected to a gate of the transistor 128. Note that each of the transistors 121 is referred to as a switching transistor in some cases. Further, one of a source and a drain of the transistor 128 is electrically connected to one of wirings 142a and 142b, and the other of the source and the drain of the transistor 128 is electrically connected to one of electrodes of the light-emitting element 129. Note that the transistor 128 is referred to as a driving transistor in some cases.

Note that the circuit structures illustrated in FIG. 17, FIG. 18, FIG. 19, and FIG. 20 are just examples, and a different circuit structure can be used.

Next, circuit structures which can be used for a driver circuit are described.

Figure 21A:
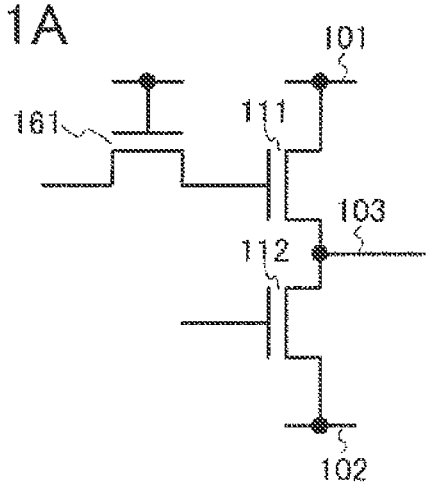
FIGS. 21A to 21C illustrate examples of a semiconductor device.

A structure where one of a source and a drain of a different transistor (here, a transistor 161) is electrically connected to the gate of the transistor 111 can be used (see FIG. 21A). Alternatively, a structure where one of a source and a drain of a different transistor (here, a transistor 162) is electrically connected to the gate of the transistor 111 in the structure of FIG. 21A can be used (see FIG. 21B). Alternatively, a structure where one of a source and a drain of a different transistor (here, a transistor 163) is electrically connected to the gate of the transistor 112 in the structure of FIG. 21A can be used (see FIG. 21).

Figure 21B:
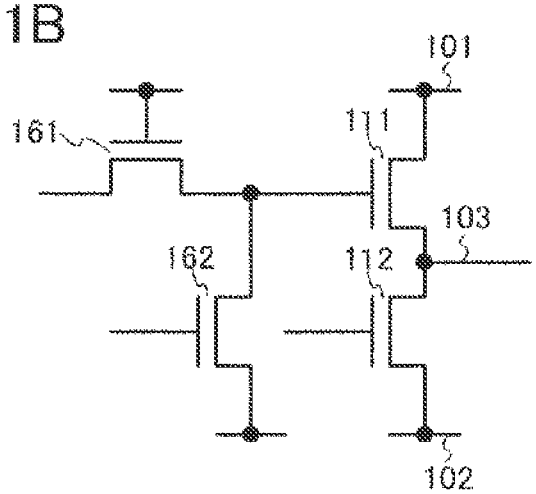

Note that in FIG. 21B, a wiring to which the other of the source and the drain of the transistor 162 is connected may be electrically connected to the wiring 102, or the gate of the transistor 112 and a gate of the transistor 162 may be electrically connected to the same wiring.

Figure 21C:
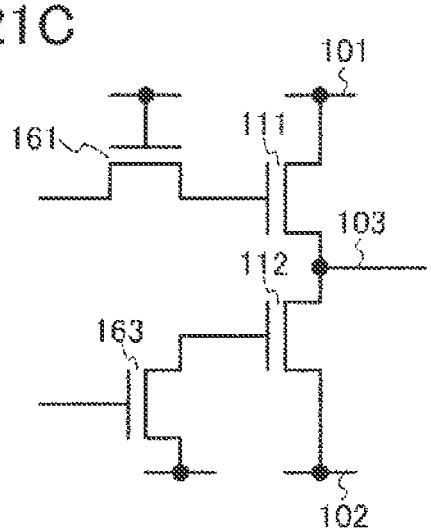
Figure 22A:
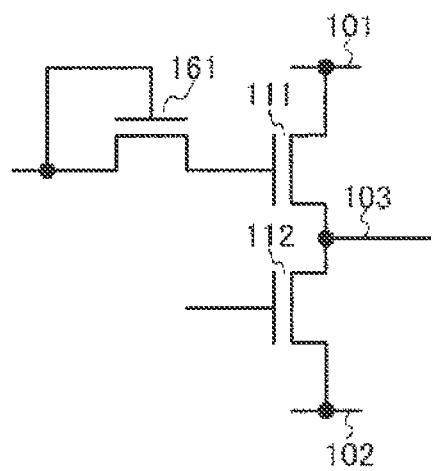
FIGS. 22A to 22C illustrate examples of a semiconductor device.
Figure 22B:
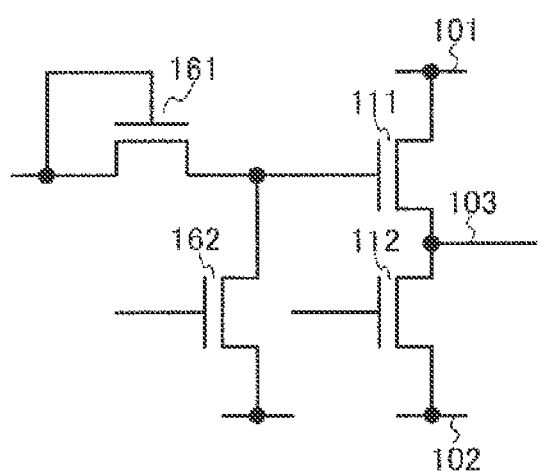
Figure 22C:
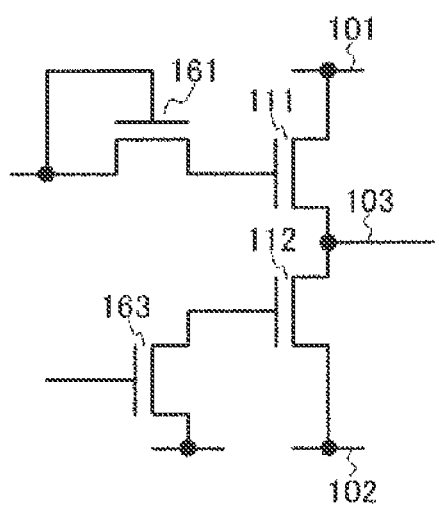

Alternatively, in FIGS. 21A to 21C, a gate of the transistor 161 may be electrically connected to the drain of the transistor 161 (the transistor 161 may be diode-connected) (see FIGS. 22A to 22C).

Next, specific circuit structures in the case where any of the structures described in the above embodiments is used for a gate driver are described in detail.

Figure 23:
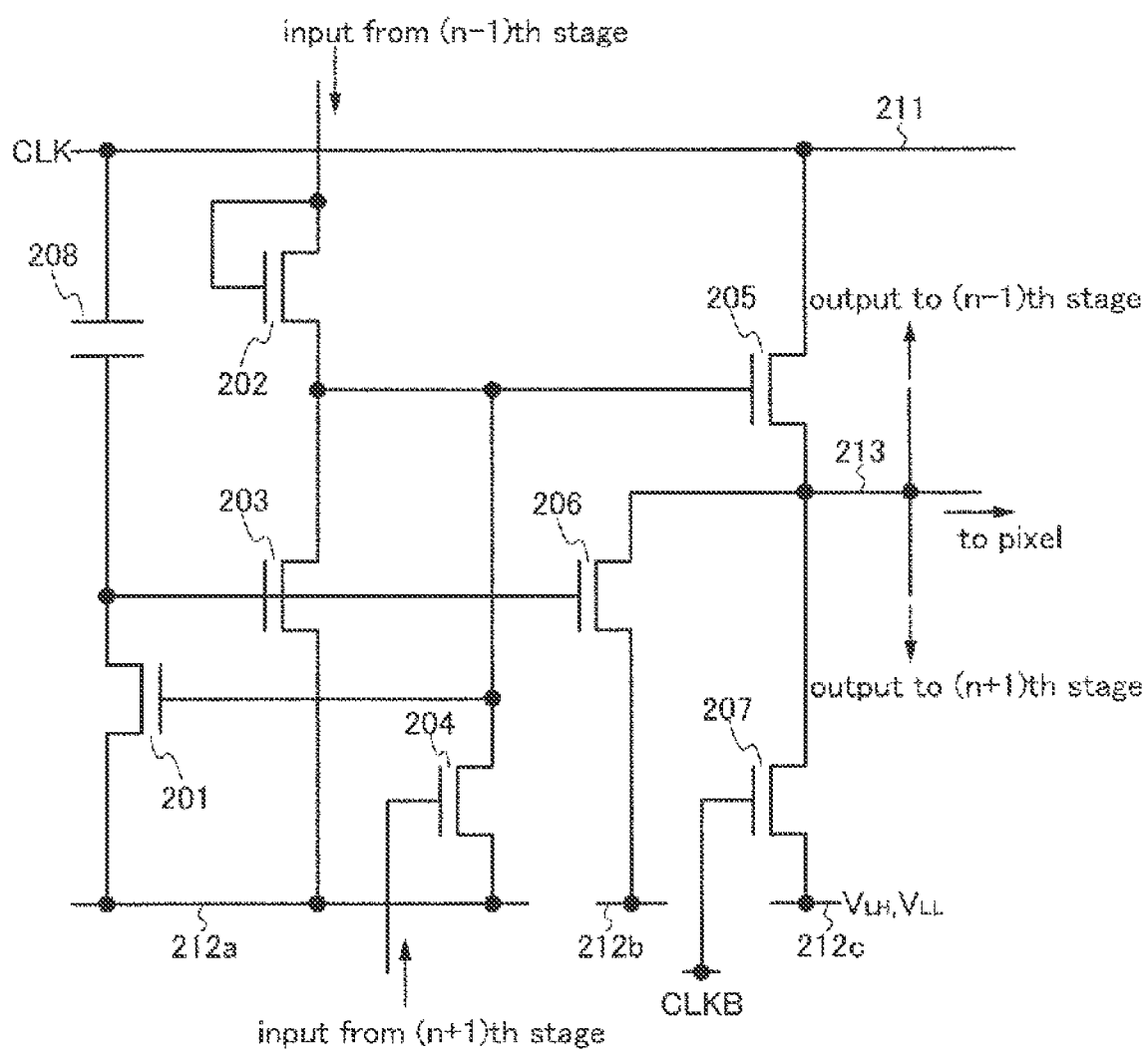
FIG. 23 illustrates an example of a semiconductor device.

A structure example of a shift register included in the gate driver is described with reference to FIG. 23. Note that FIG. 23 illustrates the structure of the shift register in an n-th stage.

The shift register in the n-th stage includes first to seventh transistors 20) to 207 and a capacitor 208. Note that although n-channel transistors are used as the first to seventh transistors 201 to 207 in FIG. 23, p-channel transistors may be used.

A gate of the first transistor 201 is electrically connected to a source of the second transistor 202, one of a source and a drain of the third transistor 203, one of a source and a drain of the fourth transistor 204, and a gate of the fifth transistor 205. One of a source and a drain of the first transistor 201 is electrically connected to a wiring 212a. The other of the source and the drain of the first transistor 201 is electrically connected to a gate of the third transistor 203, a gate of the sixth transistor 206, and one of electrodes of the capacitor 209.

A gate of the second transistor 202 is electrically connected to a drain of the second transistor 202 (the second transistor 202 is diode-connected). The source of the second transistor 202 is electrically connected to the gate of the first transistor 201 and the gate of the fifth transistor 205. In addition, a signal which is output from an (n−1)th stage is input to the drain of the second transistor 202.

The gate of the third transistor 203 is electrically connected to the other of the source and the drain of the first transistor 201 and the one of the electrodes of the capacitor 208. The one of the source and the drain of the third transistor 203 is electrically connected to the gate of the fifth transistor 205. The other of the source and the drain of the third transistor 203 is electrically connected to the wiring 212a.

A signal which is output from an (n+1)th stage is input to a gate of the fourth transistor 204. The one of the source and the drain of the fourth transistor 204 is electrically connected to the gate of the fifth transistor 205. The other of the source and the drain of the fourth transistor 204 is electrically connected to the wiring 212a.

The gate of the fifth transistor 205 is electrically connected to the gate of the first transistor 201, the source of the second transistor 202, the one of the source and the drain of the third transistor 203, and the one of the source and the drain of the fourth transistor 204. One of a source and a drain of the fifth transistor 205 is electrically connected to a wiring 211. The other of the source and the drain of the fifth transistor 205 is electrically connected to a wiring 213.

The gate of the sixth transistor 206 is electrically connected to the other of the source and the drain of the first transistor 201 and the one of the electrodes of the capacitor 208. One of a source and a drain of the sixth transistor 206 is electrically connected to a wiring 212b. The other of the source and the drain of the sixth transistor 206 is electrically connected to the wiring 213.

An inverted clock signal (CLKB) is input to a gate of the seventh transistor 207. One of a source and a drain of the seventh transistor 207 is electrically connected to a wiring 212c. The other of the source and the drain of the seventh transistor 207 is electrically connected to the wiring 213.

The one of the electrodes of the capacitor 208 is electrically connected to the gate of the third transistor 203 and the gate of the sixth transistor 206. The other of the electrodes of the capacitor 208 is electrically connected to the wiring 211.

A clock signal (CLK) is input to the wiring 211. L-level signals or L-level signals whose potentials are changed are input to the wirings 212a to 212c. Note that signals which are input to the wirings are not limited to these signals, and signals can be selected as appropriate.

In the structure illustrated in FIG. 23, in a period other than a period during which the gates in the n-th stage are selected (a non-selection period during which non-selection signals are supplied to pixels), the third transistor 203 and the sixth transistor 206, and the seventh transistor 207 are alternately turned on. Therefore, by inputting L-level signals whose potentials are changed to the wirings 212b and 212c and by changing the direction of current flowing through the sixth transistor 206 and the seventh transistor 207 (switching the sources and the drains) as described in the above embodiments, concentration of an electric field on a source side or a drain side is suppressed. Thus, deterioration in the transistors can be suppressed. Further, a structure may be used in which the direction of current flowing through the third transistor 203 is changed (the source and the drain are switched) by input of an L-level signal whose potential is changed to the wiring 212a.

Note that at least two of the wirings 212a, 212b, and 212c may be electrically connected to each other. In the case where the wirings 212b and 212c are electrically connected to each other, the sixth transistor 206 and the seventh transistor 207 serve as the transistor 112a and the transistor 112b in FIGS. 5A to 5C. In the case where the wirings 212b and 212c are electrically isolated from each other and different signals are supplied, the sixth transistor 206 and the seventh transistor 207 serve as the transistor 112 and the transistor 114 in FIGS. 12A to 12C.

Note a circuit structure which can be used for the gate driver is not limited to the circuit structure in FIG. 23. For example, as illustrated in FIG. 24, a structure may be used in which first to twelfth transistors 221 to 232 are provided in respective stages (here, n pieces of stages).

Figure 24:
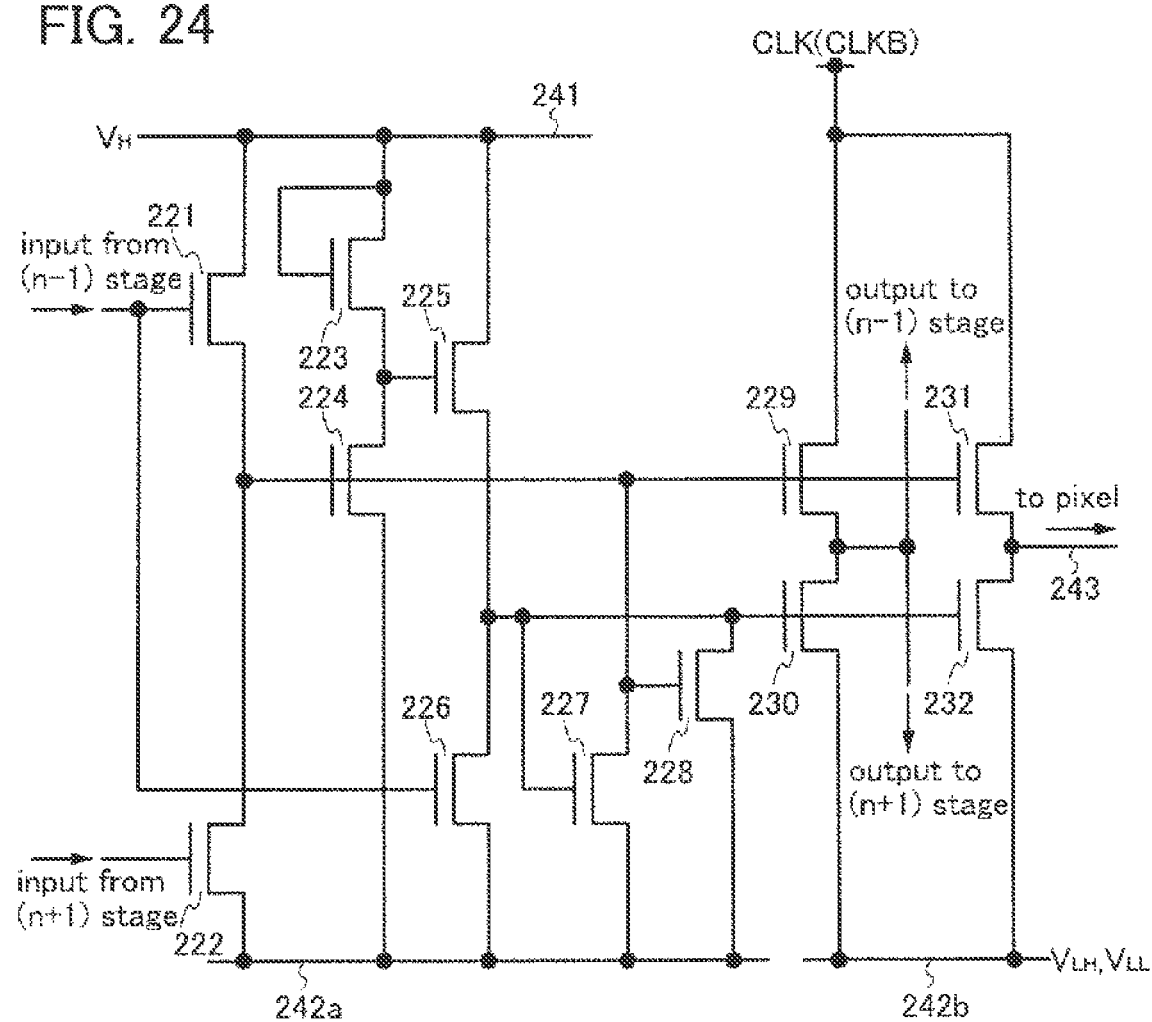
FIG. 24 illustrates an example of a semiconductor device.

In FIG. 24, an output signal from the (n−1)th stage is input to a gate of the first transistor 221. One of a source and a drain of the first transistor 221 is electrically connected to a wiring 241. The other of the source and the drain of the first transistor 221 is electrically connected to a gate of the fourth transistor 224, a gate of the eighth transistor 228, a gate of the ninth transistor 229, and a gate of the eleventh transistor 231. An output signal from the (n+1)th stage is input to a gate of the second transistor 222. One of a source and a drain of the second transistor 222 is electrically connected to a wiring 242a. The other of the source and the drain of the second transistor 222 is electrically connected to the gate of the fourth transistor 224, the gate of the eighth transistor 228, the gate of the ninth transistor 229, and the gate of the eleventh transistor 231. A gate of the third transistor 223 is electrically connected to a drain of the third transistor 223 (the third transistor 223 is diode-connected). A source of the third transistor 223 is electrically connected to a gate of the fifth transistor 225. The drain of the third transistor 223 is electrically connected to the wiring 241. One of a source and a drain of the fourth transistor 224 is electrically connected to the wiring 242a. The other of the source and the drain of the fourth transistor 224 is electrically connected to the gate of the fifth transistor 225.

One of a source and a drain of the fifth transistor 225 is electrically connected to the wiring 241. The other of the source and the drain of the fifth transistor 225 is electrically connected to a gate of the seventh transistor 227, a gate of the tenth transistor 230, and a gate of the twelfth transistor 232. The output signal from the (n−1)th stage is input to agate of the sixth transistor 226. One of a source and a drain of the sixth transistor 226 is electrically connected to the wiring 242a. The other of the source and the drain of the sixth transistor 226 is electrically connected to the gate of the seventh transistor 227, the gate of the tenth transistor 230, and the gate of the twelfth transistor 232. One of a source and a drain of the seventh transistor 227 is electrically connected to the wiring 242a. The other of the source and the drain of the seventh transistor 227 is electrically connected to the gate of the fourth transistor 224, the gate of the eighth transistor 228, the gate of the ninth transistor 229, and the gate of the eleventh transistor 231. One of a source and a drain of the eighth transistor 228 is electrically connected to the wiring 242a. The other of the source and the drain of the eighth transistor 228 is electrically connected to the gate of the seventh transistor 227, the gate of the tenth transistor 230, and the gate of the twelfth transistor 232.

The clock signal (CLK) or the inverted clock signal (CLKB) is input to one of a source and a drain of the ninth transistor 229. One of a source and a drain of the tenth transistor 230 is electrically connected to a wiring 242b. The clock signal or the inverted clock signal is input to one of a source and a drain of the eleventh transistor 231. The other of the source and the drain of the eleventh transistor 231 is electrically connected to a wiring 243. One of a source and a drain of the twelfth transistor 232 is electrically connected to the wiring 242b. The other of the source and the drain of the twelfth transistor 232 is electrically connected to the wiring 243.

In the structure illustrated in FIG. 24, in a non-selection period, the seventh transistor 227, the tenth transistor 230, and the twelfth transistor 232 are kept on. Therefore, by inputting L-level signals or L-level signals whose potentials are changed to the wirings 242a and 242b and by changing the direction of current flowing through the seventh transistor 227, the tenth transistor 230, and the twelfth transistor 232 (switching the sources and the drains), concentration of an electric field on a source side or a drain side is suppressed. Thus, deterioration in the transistors can be suppressed.

Note that although n-channel transistors are used as the first to twelfth transistors 221 to 232 in FIG. 24, p-channel transistors may be used. In addition, without provision of the ninth transistor 229 and the tenth transistor 230, a signal which is output from the wiring 243 may be output to the (n−1)th stage and the (n+1)th stage. Further, the wiring 242a and the wiring 242b may be electrically connected to each other. Furthermore, an H-level signal whose potential is changed may be input to the wiring 241. In this case, by changing the direction of current flowing through the fifth transistor 225 (switching the source and the drain), concentration of an electric field on a source side or a drain side is suppressed. Thus, deterioration in the transistor can be suppressed. Note that in FIG. 24, signals which are input to the wirings are not limited to these signals, and signals can be selected as appropriate.

Figure 25:
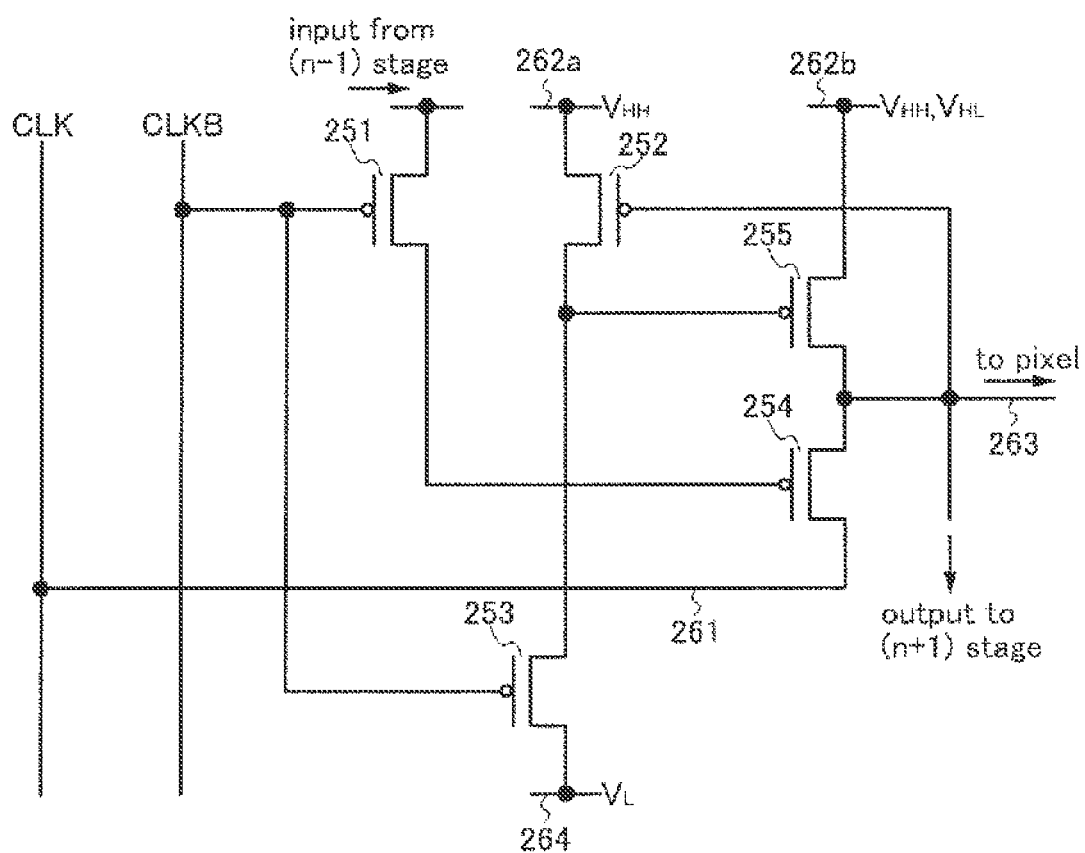
FIG. 25 illustrates an example of a semiconductor device.

Further, as illustrated in FIG. 25, a structure may be used in which first to fifth transistors 251 to 25 are provided in respective stages (hem, n pieces of stages).

In FIG. 25, an inverted clock signal (CLKB) is input to a gate of the first transistor 251. An output signal from the (n−1)th stage is input to one of a source and a drain of the first transistor 251. The other of the source and the drain of the first transistor 251 is electrically connected to a gate of the fourth transistor 254. A gate of the second transistor 252 is electrically connected to a wiring 263. One of a source and a drain of the second transistor 252 is electrically connected to a wiring 262a. The other of the source and the drain of the second transistor 252 is electrically connected to a gate of the fifth transistor 255. The inverted clock signal (CLKB) is input to a gate of the third transistor 253. One of a source and a drain of the third transistor 253 is electrically connected to a wiring 264. The other of the source and the drain of the third transistor 253 is electrically to the gate of the fifth transistor 255. The gate of the fourth transistor 254 is electrically connected to the other of the source and the drain of the first transistor 251. A clock signal (CLK) is input to one of a source and a drain of the fourth transistor 254. The other of the source and the drain of the fourth transistor 254 is electrically connected to the wiring 263. One of a source and a drain of the fifth transistor 255 is electrically connected to a wiring 262b. The other of the source and the drain of the fifth transistor 255 is electrically connected to the wiring 263.

In the structure illustrated in FIG. 25, in a non-selection period, the fifth transistor 255 is kept on. Therefore, by inputting an H-level signal whose potential is changed to the wiring 262b and by changing the direction of current flowing through the fifth transistor 255 (switching the source and the drain), concentration of an electric field on a source side or a drain side is suppressed. Thus, deterioration in the transistor can be suppressed.

Note that although p-channel transistors are used as the first to fifth transistors 251 to 255 in FIG. 25, n-channel transistors may be used. Further, the wiring 262a and the wiring 262b may be electrically connected to each other. Furthermore, in FIG. 25, signals which are input to the wirings are not limited to these signals, and signals can be selected as appropriate.

Figure 26:
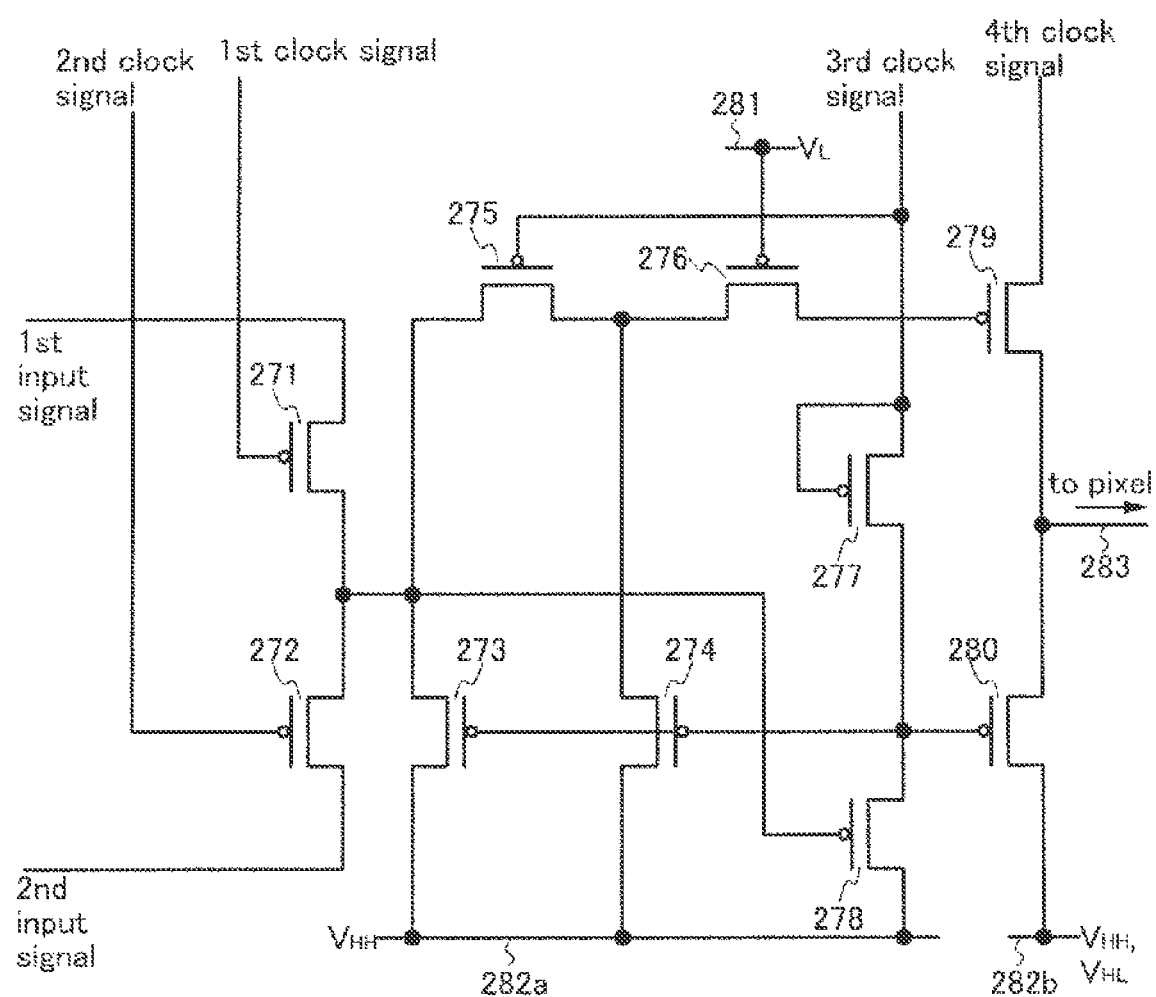
FIG. 26 illustrates an example of a semiconductor device.

Further, as illustrated in FIG. 26, a structure may be used in which first to tenth transistors 271 to 280 are provided in respective stages (here, n pieces of stages).

In FIG. 26, a first clock signal is input to agate of the first transistor 271. A first input signal is input to one of a source and a drain of the first transistor 271. The other of the source and the drain of the first transistor 271 is electrically connected to a gate of the eighth transistor 278. A second clock signal is input to a gate of the second transistor 272. A second input signal is input to one of a source and a drain of the second transistor 272. The other of the source and the drain of the second transistor 272 is electrically connected to the gate of the eighth transistor 278. One of a source and a drain of the third transistor 273 is electrically connected to a wiring 282a. The other of the source and the drain of the third transistor 273 is electrically connected to the gate of the eighth transistor 278. One of a source and a drain of the fourth transistor 274 is electrically connected to the wiring 282a. The other of the source and the drain of the fourth transistor 274 is electrically connected to one of a source and a drain of the fifth transistor 275 and one of a source and a drain of the sixth transistor 276. A third clock signal is input to agate of the fifth transistor 275. The one of the source and the drain of the fifth transistor 275 is electrically connected to the other of the source and the drain of the fourth transistor 274. The other of the source and the drain of the fifth transistor 275 is electrically connected to the gate of the eighth transistor 278.

A gate of the sixth transistor 276 is electrically connected to a wiring 281. The one of the source and the drain of the sixth transistor 276 is electrically connected to the other of the source and the drain of the fourth transistor 274. The other of the source and the drain of the sixth transistor 276 is electrically connected to a gate of the ninth transistor 279. A gate of the seventh transistor 277 is electrically connected to a drain of the seventh transistor 277 (the seventh transistor 277 is diode-connected). A source of the seventh transistor 277 is electrically connected to the gate of the third transistor 273, the gate of the fourth transistor 274, and a gate of the tenth transistor 280. The third clock signal is input to the drain of the seventh transistor 277. One of a source and a drain of the eighth transistor 278 is electrically connected to the wiring 282a. The other of the source and the drain of the eighth transistor 278 is electrically connected to the gate of the third transistor 273, the gate of the fourth transistor 274, and the gate of the tenth transistor 280. A fourth clock signal is input to one of a source and a drain of the ninth transistor 279. The other of the source and the drain of the ninth transistor 279 is electrically connected to a wiring 283. One of a source and a drain of the tenth transistor 280 is electrically connected to a wiring 282b. The other of the source and the drain of the tenth transistor 280 is electrically connected to the wiring 283.

In the structure illustrated in FIG. 26, in a non-selection period, the tenth transistor 280 is kept on. Therefore, by inputting an H-level signal whose potential is changed to the wiring 282b and by changing the direction of current flowing through the tenth transistor 280 (switching the source and the drain), concentration of an electric field on a source side or a drain side is suppressed. Thus, deterioration in the transistor can be suppressed.

Note that although p-channel transistors are used as the first to tenth transistors 271 to 280 in FIC 26, n-channel transistors may be used. Further, the wiring 282a and the wiring 282b may be electrically connected to each other. Furthermore, in FIG. 26, signals which are input to the wirings are not limited to these signals, and signals can be selected as appropriate.

Note that although the case where any of the structures described in the above embodiments is used for a driver circuit such as a gate driver or a source driver is described in this embodiment, this embodiment is not limited to this. Any of the structures described in the above embodiments can also be used in the case where a potential of a capacitor line is controlled or a potential of a common electrode is controlled.

Note that the structure described in this embodiment can be combined with a different structure described in this specification (including a structure described in any of the other embodiments) as appropriate.

Embodiment 5

In this embodiment, structures of transistors which can be used for the circuit described in any of the above embodiments are described. Transistors can be broadly classified according to materials used for semiconductor layers included in the transistors. The materials used for semiconductor layers can be classified into two categories: a silicon based material which contains silicon as its main component, and a non-silicon based material which does not contain silicon as its main component. Examples of the silicon based material are amorphous silicon (a-Si:H), microcrystal silicon (μc-Si), polysilicon (p-Si), single crystalline silicon (c-Si), and the like. Examples of the non-silicon based material are compound semiconductors such as gallium arsenide (GaAs), oxide semiconductors such as zinc oxide (ZnO) and an oxide containing indium, gallium, and zinc (InGaZnO), and the like.

The use of amorphous silicon or microcrystal silicon for semiconductor layers of transistors has advantages of high uniformity of characteristics of the transistors and low manufacturing cost, and is particularly effective in manufacturing transistors over a large substrate with a diagonal of more than 500 mm. Examples of a structure of a capacitor and a structure of a transistor in which amorphous silicon or microcrystal silicon is used for a semiconductor layer are described below.

Figure 27A:
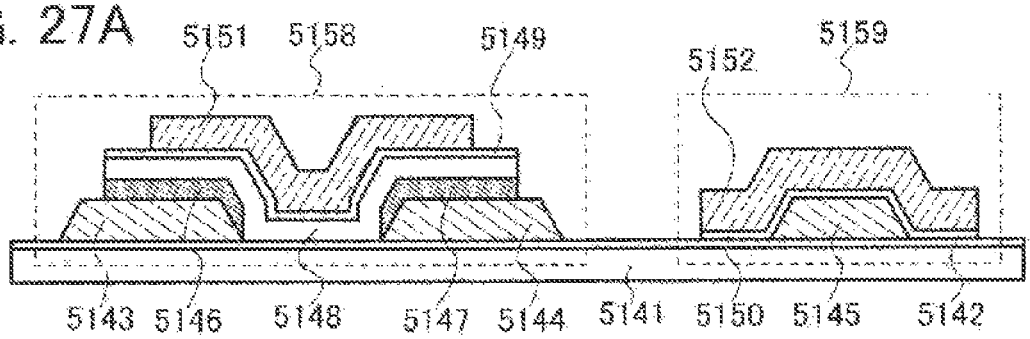
FIGS. 27A to 27D illustrate an example of a semiconductor device.

FIG. 27A illustrates cross-sectional structures of a top-gate transistor and a capacitor.

A first insulating film (an insulating film 5142) is formed over a substrate 5141. The first insulating film can have a function of a base film which prevents impurities from a substrate side from adversely affecting a semiconductor layer and changing characteristics of the transistor. Note that as the first insulating film, a single layer or a stacked layer of a silicon oxide film, a silicon nitride film, a silicon oxynitride film (SiO$_x$N$_y$), or the like can be used. In particular, the silicon nitride film is dense and has high barrier properties, so that the first insulating film preferably contains silicon nitride. Note that the first insulating film is not necessarily formed. When the first insulating film is not formed, reduction in the number of steps and manufacturing cost and increase in yield can be realized.

A first conductive layer (a conductive layer 5143, a conductive layer 5144, and a conductive layer 5145) is formed over the first insulating film. The conductive layer 5143 includes a portion which serves as one of a source and a drain of a transistor 5158. The conductive layer 5144 includes a portion which serves as the other of the source and the drain of the transistor 5158. The conductive layer 5145 includes a portion which serves as a first electrode of a capacitor 5159. Note that for the first conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer of any of these elements (including the alloy thereof) can be used.

A first semiconductor layer (a semiconductor layer 5146 and a semiconductor layer 5147) is formed over the conductive layers 5143 and 5144. The semiconductor layer 5146 includes a portion which serves as one of a source and a drain. The semiconductor layer 5147 includes a portion which serves as the other of the source and the drain. Note that for the first semiconductor layer, silicon containing phosphorus or the like can be used, for example.

A second semiconductor layer (a semiconductor layer 5148) is formed between the conductive layer 5143 and the conductive layer 5144 and over the first insulating film. In addition, part of the semiconductor layer 5148 extends over the conductive layer 5143 and the conductive layer 5144. The semiconductor layer 5148 includes a portion which serves as a channel region of the transistor 5158. Note that as the second semiconductor layer, a semiconductor layer having non-crystallinity, such as an amorphous silicon (a-Si: H) layer, or a semiconductor layer such as a microcrystalline silicon (μc-Si) layer, or the like can be used.

A second insulating film (an insulating film 5149 and an insulating film 5150) is formed so as to cover at least the semiconductor layer 5148 and the conductive layer 5145. The second insulating film serves as a gate insulating film. Note that as the second insulating film, a single layer or a stacked layer of a silicon oxide film, a silicon nitride film, a silicon oxynitride film (SiO$_x$N$_y$), or the like can be used.

Note that as the second insulating film which is in contact with the second semiconductor layer, a silicon oxide film is preferably used. This is because trap levels at an interface between the second semiconductor layer and the second insulating film is decreased.

Note that in the case where the second insulating film is in contact with Mo, a silicon oxide film is preferably used as the second insulating film which is in contact with Mo. This is because the silicon oxide film does not oxidize Mo.

A second conductive layer (a conductive layer 5151 and a conductive layer 5152) is formed over the second insulating film. The conductive layer 5151 includes a portion which serves as a gate electrode of the transistor 5158. The conductive layer 5152 serves as a second electrode of the capacitor 5159 or a wiring. Note that for the second conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

Note that in steps after forming the second conductive layer, a variety of insulating films or a variety of conductive films may be formed.

Figure 27B:
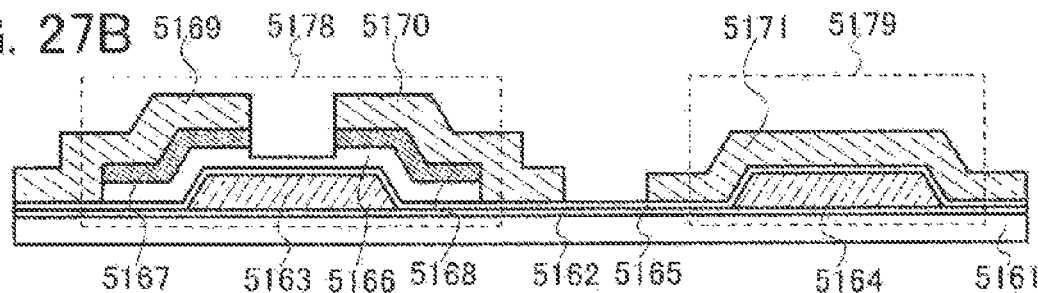

FIG. 27B illustrates cross-sectional structures of an inverted-staggered (bottom-gate) transistor and a capacitor. In particular, the transistor illustrated in FIG. 27B has a channel-etched structure.

A first insulating film (an insulating film 5162) is formed over a substrate 5161. The first insulating film can have a function of a base film which prevents impurities from a substrate side from adversely affecting a semiconductor layer and changing characteristics of the transistor. Note that as the first insulating film, a single layer or a stacked layer of a silicon oxide film, a silicon nitride film, a silicon oxynitride film (SiO$_x$N$_y$), or the like can be used. In particular, the silicon nitride film is dense and has high barrier properties, so that the first insulating film preferably contains silicon nitride. Note that the first insulating film is not necessarily formed. When the first insulating film is not formed, reduction in the number of steps and manufacturing cost and increase in yield can be realized.

A first conductive layer (a conductive layer 5163 and a conductive layer 5164) is formed over the first insulating film. The conductive layer 5163 includes a portion which serves as a gate electrode of a transistor 5178. The conductive layer 5164 includes a portion which serves as a first electrode of a capacitor 5179. Note that for the first conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

A second insulating film (an insulating film 5165) is formed so as to cover at least the first conductive layer. The second insulating film serves as a gate insulating film. Note that as the second insulating film, a single layer or a stacked layer of a silicon oxide film, a silicon nitride film, a silicon oxynitride film (SiO$_x$N$_y$), or the like can be used.

Note that as the second insulating film which is in contact with a semiconductor layer, a silicon oxide film is preferably used. This is because trap levels at an interface between the semiconductor layer and the second insulating film is decreased.

Note that in the case where the second insulating film is in contact with Mo, a silicon oxide film is preferably used as the second insulating film which is in contact with Mo. This is because the silicon oxide film does not oxidize Mo.

A first semiconductor layer (a semiconductor layer 5166) is formed in part of a portion over the second insulating film, which overlaps with the first conductive layer, by photolithography, an inkjet method, a printing method, or the like. In addition, part of the semiconductor layer 5166 extends to a portion over the second insulating film, which does not overlap with the first conductive layer. The semiconductor layer 5166 includes a portion which serves as a channel region of the transistor 5178. Note that as the semiconductor layer 5166, a semiconductor layer having non-crystallinity, such as an amorphous silicon (a-Si:H) layer, or a semiconductor layer such as a microcrystalline silicon (μc-Si) layer, or the like can be used.

A second semiconductor layer (a semiconductor layer 5167 and a semiconductor layer 5168) is formed over part of the first semiconductor layer. The semiconductor layer 5167 includes a portion which serves as one of a source and a drain. The semiconductor layer 5168 includes a portion which serves as the other of the source and the drain. Note that for the second semiconductor layer, silicon containing phosphorus or the like can be used, for example.

A second conductive layer (a conductive layer 5169, a conductive layer 5170, and a conductive layer 5171) is formed over the second semiconductor layer and the second insulating film. The conductive layer 5169 includes a portion which serves as one of a source and a drain of the transistor 5178. The conductive layer 5170 includes a portion which serves as the other of the source and the drain of the transistor 5178. The conductive layer 5171 includes a portion which serves as a second electrode of the capacitor 5179. Note that for the second conductive layer, Ti, Mo, Ta, Cr, W, Al, Nd, Cu, Ag, Au, Pt. Nb, Si, Zn, Fe, Sa, Ge, or the like; or an alloy of any of these elements can be used. Alternatively, a stacked layer including any of these elements (including the alloy thereof) can be used.

Note that in steps after forming the second conductive layer, a variety of insulating films or a variety of conductive films may be formed.

Note that in steps of manufacturing a channel-etched transistor, the first semiconductor layer and the second semiconductor layer can be successively formed. Further, the first semiconductor layer and the second semiconductor layer can be formed using the same mask.

After the second conductive layer is formed, part of the second semiconductor layer can be removed by using the second conductive layer as a mask. Alternatively, by removing part of the second semiconductor layer by using the same mask used for the second conductive layer, the channel region of the transistor can be formed. Accordingly, it is not necessary to use an additional mask which is used only for removing part of the second semiconductor layer. Thus, a manufacturing process can be simplified, so that manufacturing cost can be reduced. Here, part of the first semiconductor layer below a region where the second semiconductor layer is removed serves as the channel region of the transistor.

Figure 27C:
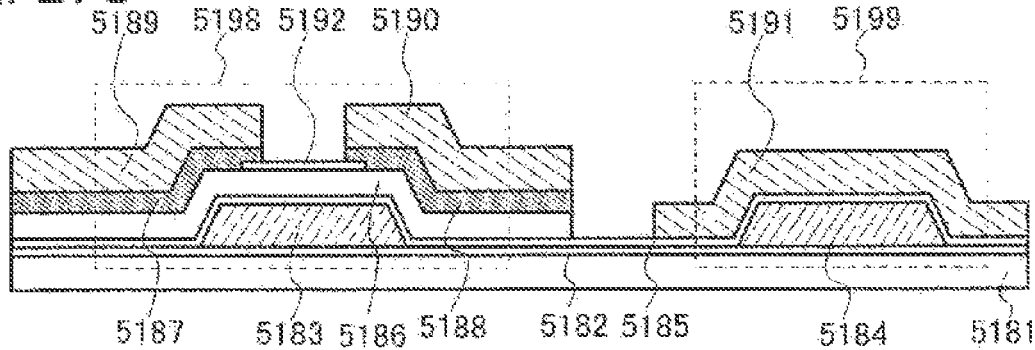

FIG. 27C illustrates cross-sectional structures of an inverted-staggered (bottom-gate) transistor and a capacitor. In particular, the transistor illustrated in FIG. 27C has a channel protection (etch stop) structure.

A first insulating film (an insulating film 5182) is formed over a substrate 5181. The first insulating film can have a function of a base film which prevents impurities from a substrate side from adversely affecting a semiconductor layer and changing characteristics of the transistor. Note that as the first insulating film, a single layer or a stacked layer of a silicon oxide film, a silicon nitride film, a silicon oxynitride film ($SiO_xN_y$), or the like can be used. In particular, the silicon nitride film is dense and has high barrier properties, so that the first insulating film preferably contains silicon nitride. Note that the first insulating film is not necessarily formed. When the first insulating film is not formed, reduction in the number of steps and manufacturing cost and increase in yield can be realized.

A first conductive layer (a conductive layer 5183 and a conductive layer 5184) is formed over the first insulating film. The conductive layer 5183 includes a portion which serves as a gate electrode of a transistor 5198. The conductive layer 5184 includes a portion which serves as a first electrode of a capacitor 5199. Note that for the first conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

A second insulating film (an insulating film 5185) is formed so as to cover at least the first conductive layer. The second insulating film serves as a gate insulating film. Note that as the second insulating film, a single layer or a stacked layer of a silicon oxide film, a silicon nitride film, a silicon oxynitride film ($SiO_xN_y$), or the like can be used.

Note that as the second insulating film which is in contact with a semiconductor layer, a silicon oxide film is preferably used. This is because trap levels at an interface between the semiconductor layer and the second insulating film is decreased.

Note that in the case where the second insulating film is in contact with Mo, a silicon oxide film is preferably used as the second insulating film which is in contact with Mo. This is because the silicon oxide film does not oxidize Mo.

A first semiconductor layer (a semiconductor layer 5186) is formed in part of a portion over the second insulating film, which overlaps with the first conductive layer, by photolithography, an inkjet method, a printing method, or the like. In addition, part of the semiconductor layer 5186 extends to a portion over the second insulating film, which does not overlap with the first conductive layer. The semiconductor layer 5186 includes a portion which serves as a channel region of the transistor 5198. Note that as the semiconductor layer 5186, a semiconductor layer having non-crystallinity, such as an amorphous silicon (a-Si:H) layer, or a semiconductor layer such as a microcrystalline silicon (μc-Si) layer, or the like can be used.

A third insulating film (an insulating film 5192) is formed over part of the first semiconductor layer. The insulating film 5192 prevents the channel region of the transistor 5198 from being etched away. That is, the insulating film 5192 serves as a channel protective film (an etch stop film). Note that as the third insulating film, a single layer or a stacked layer of a silicon oxide film, a silicon nitride film, a silicon oxynitride film ($SiO_xN_y$), or the like can be used.

A second semiconductor layer (a semiconductor layer 5187 and a semiconductor layer 5188) is formed over par of the first semiconductor layer and part of the third insulating film. The semiconductor layer 5187 includes a portion which serves as one of a source and a drain. The semiconductor layer 5188 includes a portion which serves as the other of the source and the drain. Note that for the second semiconductor layer, silicon containing phosphorus or the like can be used, for example.

A second conductive layer (a conductive layer 5189, a conductive layer 5190, and a conductive layer 5191) is formed over the second semiconductor layer. The conductive layer 5189 includes a portion which serves as one of a source and a drain of the transistor 5198. The conductive layer 5190 includes a portion which serves as the other of the source and the drain of the transistor 5198. The conductive layer 5191 includes a portion which serves as a second electrode of the capacitor 5199. Note that for the second conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

Note that in steps after forming the second conductive layer, a variety of insulating films or a variety of conductive films may be formed.

The use of polysilicon for semiconductor layers of transistors has advantages of high mobility of the transistors and low manufacturing cost. Moreover, since little deterioration in characteristics over time occurs, a highly reliable device can be obtained. Examples of a structure of a capacitor and a structure of a transistor in which polysilicon is used for a semiconductor layer are described below.

Figure 27D:
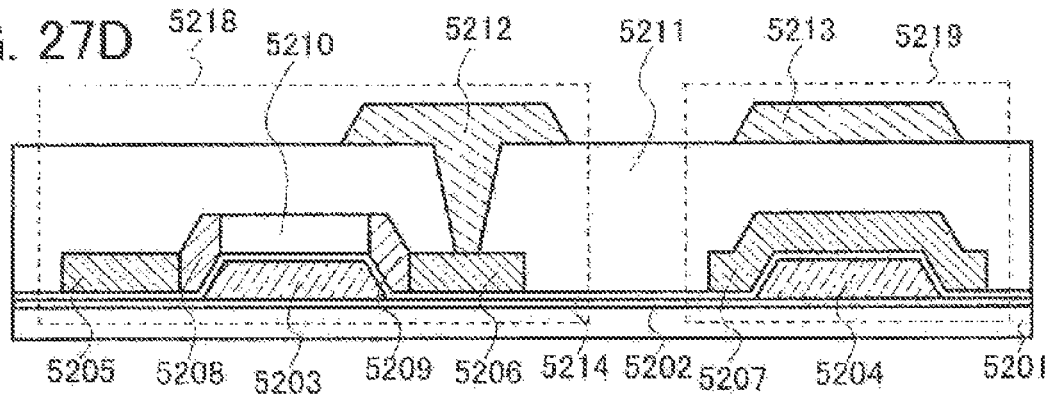

FIG. 27D illustrates cross-sectional structures of a bottom-gate transistor and a capacitor.

A first insulating film (an insulating film 5202) is formed over a substrate 5201. The first insulating film can have a function of a base film which prevents impurities from a substrate side from adversely affecting a semiconductor layer and changing characteristics of the transistor. Note that as the first insulating film, a single layer or a stacked layer of a silicon oxide film, a silicon nitride film, a silicon oxynitride film ($SiO_xN_y$), or the like can be used. In particular, the silicon nitride film is dense and has high barrier properties, so that the first insulating film preferably contains silicon nitride. Note that the first insulating film is not necessarily formed. When the first insulating film is not formed, reduction in the number of steps and manufacturing cost and increase in yield can be realized.

A first conductive layer (a conductive layer 5203 and a conductive layer 5204) is formed over the first insulating film. The conductive layer 5203 includes a portion which serves as a gate electrode of a transistor 5218. The conductive layer 5204 includes a portion which serves as a first electrode of a capacitor 5219. Note that for the first conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

A second insulating film (an insulating film 5214) is formed so as to cover at least the first conductive layer. The second insulating film serves as a gate insulating film. Note that as the second insulating film, a single layer or a stacked layer of a silicon oxide film, a silicon nitride film, a silicon oxynitride film ($SiO_xN_y$), or the like can be used.

Note that as the second insulating film which is in contact with the semiconductor layer, a silicon oxide film is preferably used. This is because trap levels at an interface between the semiconductor layer and the second insulating film is decreased.

Note that in the case where the second insulating film is in contact with Mo, a silicon oxide film is preferably used as the second insulating film which is in contact with Mo. This is because the silicon oxide film does not oxidize Mo.

A semiconductor layer is formed in part of a portion over the second insulating film, which overlaps with the first conductive layer, by photolithography, an inkjet method, a printing method, or the like. In addition, part of the semiconductor layer extends to a portion over the second insulating film, which does not overlap with the first conductive layer. The semiconductor layer includes a channel formation region (a channel formation region 5210), lightly doped drain (LDD) regions (LDD regions 5208 and 5209), and impurity regions (impurity regions 5205, 5206, and 5207). The channel formation region 5210 serves as a channel formation region of the transistor 5218. The LDD regions 5208 and 5209 serve as LDD regions of the transistor 5218. Note that formation of the LDD regions 5208 and 5209 can prevent application of a high electric field to a drain of the transistor, so that reliability of the transistor can be improved. Note that the LDD region is not necessarily formed. In this case, a manufacturing process can be simplified, so that manufacturing cost can be reduced. The impurity region 5205 includes a portion which serves as one of a source and a drain of the transistor 5218. The impurity region 5206 includes a portion which serves as the other of the source and the drain of the transistor 5218. The impurity region 5207 includes a portion which serves as a second electrode of the capacitor 5219.

A contact hole is selectively formed in pail of a third insulating film (an insulating film 5211). The insulating film 5211 serves as an interlayer film. For the third insulating film, an inorganic material (e.g., silicon oxide, silicon nitride, or silicon oxynitride), an organic compound material having a low dielectric constant (e.g., a photosensitive or non-photosensitive organic resin material), or the like can be used. Alternatively, a material including siloxane can be used. Note that siloxane is a material having a skeleton structure by the bond of silicon (Si) and oxygen (O). An organic group (e.g., an alkyl group or aromatic hydrocarbon) or a fluoro group may be used as a substituent. A fluoro group may be contained in the organic group.

A second conductive layer (a conductive layer 5212 and a conductive layer 5213) is formed over the third insulating film. The conductive layer 5212 is electrically connected to the other of the source and the drain of the transistor 5218 through the contact hole formed in the third insulating film. Therefore, the conductive layer 5212 includes a portion which serves as the other of the source or the drain of the transistor 5218. In the case where the conductive layer 5213 and the conductive layer 5204 are electrically connected to each other in a portion which is not illustrated, the conductive layer 5213 includes a portion which serves as the first electrode of the capacitor 5219. Alternatively, in the case where the conductive layer 5213 is electrically connected to the impurity region 5207 in a portion which is not illustrated, the conductive layer 5213 includes the portion which serves as the second electrode of the capacitor 5219. Alternatively, in the case where the conductive layer 5213 is not electrically connected to the conductive layer 5204 and the impurity region 5207, a capacitor which is different from the capacitor 5219 is formed. In this capacitor, the conductive layer 5213, the impurity region 5207, and the insulating film 5211 are used as a first electrode, a second electrode, and an insulating film, respectively. Note that for the second conductive layer, Ti, Mo, Ta, Cr, W, Al, Nd, Cu, Ag, Au, Pt, Nb, Si, Zn, Fe, Ba, Ge, or the like; or an alloy of any of these elements can be used. Alternatively, a stacked layer including any of these elements (including the alloy thereof) can be used.

Note that in steps after forming the second conductive layer, a variety of insulating films or a variety of conductive films may be formed.

Note that the transistor in which polysilicon is used for a semiconductor layer can have a top-gate structure.

Note that the structure described in this embodiment can be combined with a different structure described in this specification (including a structure described in any of the other embodiments) as appropriate.

Embodiment 6

In this embodiment, a variety of electronic devices including the semiconductor device described in any of the above embodiments are described with reference to drawings.

Examples of electronic devices including the semiconductor device described in any of the above embodiments are television sets, cameras such as video cameras and digital cameras, goggle-type displays (head-mounted displays), navigation systems, audio reproducing devices (e.g., car audio equipment or audio component sets), laptops, game machines, portable information terminals (e.g., mobile computers, mobile phones, portable game machines, or e-book readers), image reproducing devices provided with recording media (specifically devices which reproduce the content of recording media such as DVDs (digital versatile disc) and have displays for displaying the reproduced images), and the like. Specific examples of such electronic devices are described in FIGS. 28A to 28E.

Figure 28A:
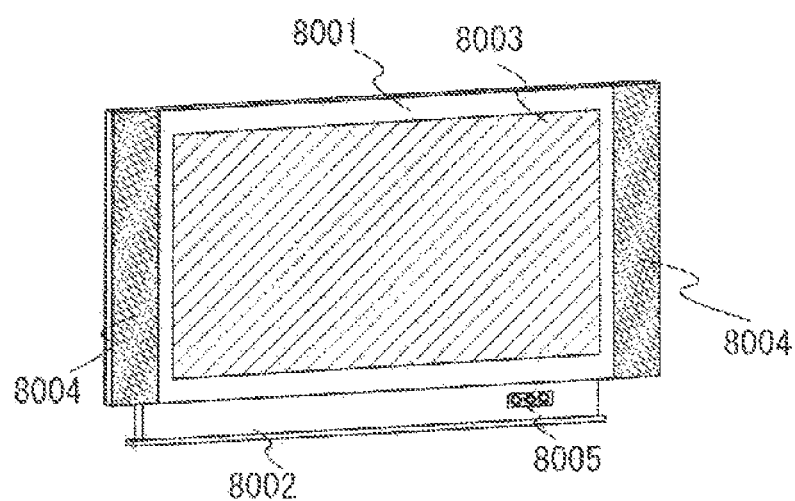
FIGS. 28A to 28E illustrate applications of a semiconductor device.

FIG. 28A illustrates a display device, which includes a housing 8001, a support base 8002, a display portion 8003, speaker portions 8004, video input terminals 8005, and the like. The display device is manufactured by using the structure described in any of the above embodiments for the display portion 8003. Note that the display device includes in its category all devices for displaying information, for example, devices for a personal computer, for receiving TV broadcasting, and for displaying an advertisement. By using the display device described in any of the above embodiments, a display device having high reliability can be provided.

Figure 28B:
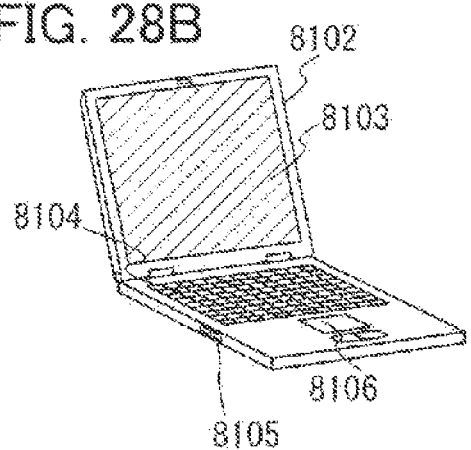

FIG. 28B illustrates a computer, which includes a main body 8101, a housing 8102, a display portion 8103, a keyboard 8104, an external connection port 8105, a pointing device 8106, and the like. Note that the computer is manufactured by using the structure described in any of the above embodiments for the display portion 8103. By using the display device described in any of the above embodiments, a computer having high reliability can be provided.

Figure 28C:
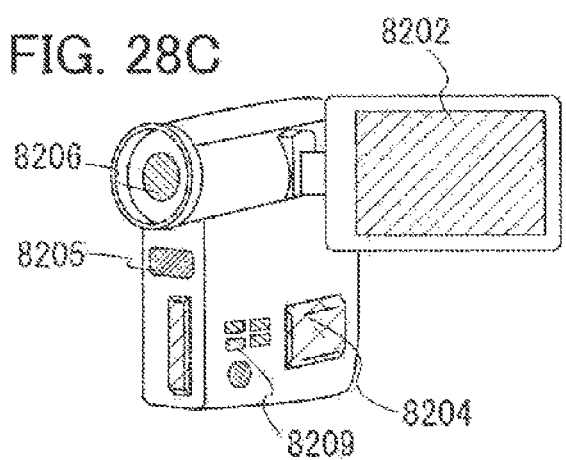

FIG. 28C illustrates a video camera, which includes a display portion 8202, an external connection port 8204, a remote control receiving portion 8205, an image receiving portion 8206, operation keys 8209, and the like. Note that the video camera is manufactured by using the structure described in any of the above embodiments for the display portion 8202. By using the display device described in any of the above embodiments, a video camera having high reliability can be provided.

Figure 28D:
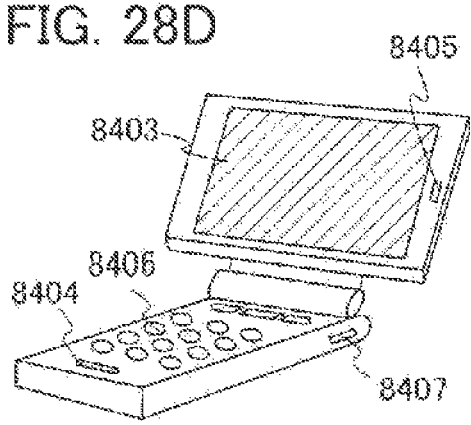

FIG. 28D illustrates a mobile phone, which includes a display portion 8403, an audio input portion 8404, an audio output portion 8405, operation keys 8406, an external connection port 8407, and the like. Note that the mobile phone is manufactured by using the structure described in any of the above embodiments for the display portion 8403. Further, the mobile phone may have an infrared communication function, a television receiving function, or the like. By using the display device described in any of the above embodiments, a mobile phone having high reliability can be provided.

Figure 28E:
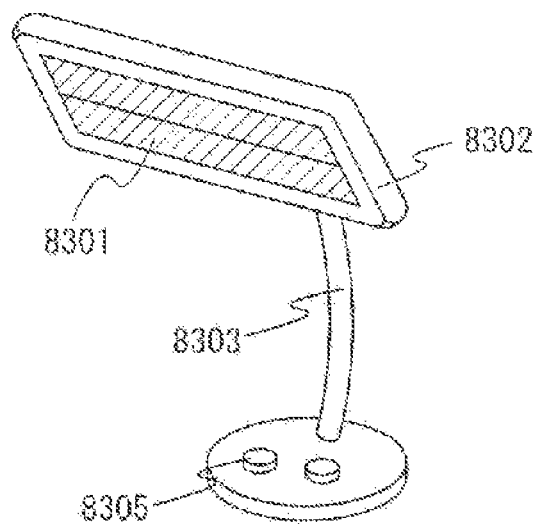

FIG. 28E illustrates a table lamp, which includes a lighting portion 8301, a shade 8302, an adjustable arm 8303, a switch 8305, and the like. Note that the table lamp is manufactured by using the structure described in any of the above embodiments for the lighting portion 8301. Note that the lamp includes ceiling lights, wall lights, and the like in its category. By using the display device described in any of the above embodiments, a table lamp having high reliability can be provided.

As described above, electronic devices and lamps can be obtained by using the display device described in any of the above embodiments. The application range of the display device described in any of the above embodiments is extremely wide and the display device described in any of the above embodiments can be used for electronic devices in all fields.

Note that the structure described in this embodiment can be combined with a different structure described in this specification (including a structure described in any of the other embodiments) as appropriate.

This application is based on Japanese Patent Application serial no. 2008-292197 filed with Japan Patent Office on Nov. 14, 2008, the entire contents of which are hereby incorporated by reference.

What is claimed is:

1. A semiconductor device comprising:
 a first circuit, a second circuit and a third circuit,
 wherein each of the first circuit, the second circuit and the third circuit comprises a first transistor to a twelfth transistor,
 wherein in the second circuit,
  one of a source and a drain of the first transistor, one of a source and a drain of the second transistor, a gate of the fourth transistor, one of a source and a drain of the seventh transistor, a gate of the eighth transistor, a gate of the ninth transistor, and a gate of the eleventh transistor are directly connected to each other;
  a gate of the first transistor and a gate of the sixth transistor are directly connected to the first circuit;
  a gate of the second transistor is electrically connected to the third circuit;
  one of a source and a drain of the third transistor and a gate of the third transistor are electrically connected to each other;
  the other of the source and the drain of the third transistor, one of a source and a drain of the fourth transistor, and a gate of the fifth transistor are electrically connected to each other;
  one of a source and a drain of the fifth transistor, one of a source and a drain of the sixth transistor, a gate of the seventh transistor, one of a source and a drain of the eighth transistor, a gate of the tenth transistor, and a gate of the twelfth transistor are electrically connected to each other;
  one of a source and a drain of the ninth transistor and one of a source and a drain of the tenth transistor are directly connected to the first circuit and the third circuit;
  one of a source and a drain of the eleventh transistor and one of a source and a drain of the twelfth transistor are directly connected to an output terminal;
  the other of the source and the drain of the ninth transistor and the other of the source and the drain of the eleventh transistor are electrically connected to a first wiring;
  the other of the source and the drain of the second transistor is electrically connected to a second wiring; and
  the other of the source and the drain of the twelfth transistor is electrically connected to a third wiring; and
 wherein the first wiring has a function of supplying a clock signal to the second circuit.

2. The semiconductor device according to claim 1, wherein each of the first transistor to the twelfth transistor comprises an amorphous silicon.

3. A semiconductor device comprising:
a first circuit, a second circuit and a third circuit,
wherein each of the first circuit, the second circuit and the third circuit comprises a first transistor to a twelfth transistor,
wherein in the second circuit,
  one of a source and a drain of the first transistor, one of a source and a drain of the second transistor, a gate of the fourth transistor, one of a source and a drain of the seventh transistor, a gate of the eighth transistor, a gate of the ninth transistor, and a gate of the eleventh transistor are directly connected to each other;
  a gate of the first transistor and a gate of the sixth transistor are electrically connected to the first circuit;
  a gate of the second transistor is electrically connected to the third circuit;
  one of a source and a drain of the third transistor and a gate of the third transistor are electrically connected to each other;
  the other of the source and the drain of the third transistor, one of a source and a drain of the fourth transistor, and a gate of the fifth transistor are electrically connected to each other;
  one of a source and a drain of the fifth transistor, one of a source and a drain of the sixth transistor, a gate of the seventh transistor, one of a source and a drain of the eighth transistor, a gate of the tenth transistor and a gate of the twelfth transistor are electrically connected to each other;
  one of a source and a drain of the ninth transistor and one of a source and a drain of the tenth transistor are directly connected to the first circuit and the third circuit;
  one of a source and a drain of the eleventh transistor and one of a source and a drain of the twelfth transistor are directly connected to an output terminal;
  the other of the source and the drain of the ninth transistor and the other of the source and the drain of the eleventh transistor are electrically connected to a first wiring;
  the other of the source and the drain of the second transistor is electrically connected to a second wiring;
  the other of the source and the drain of the twelfth transistor is electrically connected to a third wiring; and
  the other of the source and the drain of the fifth transistor and a gate of the third transistor are electrically connected to each other.

4. The semiconductor device according to claim 3, wherein the first wiring has a function of supplying a clock signal to the second circuit.

5. The semiconductor device according to claim 3, wherein each of the first transistor to the twelfth transistor comprises an amorphous silicon.

6. A semiconductor device comprising:
a first circuit, a second circuit and a third circuit,
wherein each of the first circuit, the second circuit and the third circuit comprises a first transistor to a twelfth transistor,
wherein in the second circuit,
  one of a source and a drain of the first transistor, one of a source and a drain of the second transistor, a gate of the fourth transistor, one of a source and a drain of the seventh transistor, a gate of the eighth transistor, a gate of the ninth transistor, and a gate of the eleventh transistor are electrically connected to each other;
  a gate of the first transistor and a gate of the sixth transistor are electrically connected to the first circuit;
  a signal is directly input into the gate of the first transistor and the gate of the sixth transistor from the first circuit;
  a gate of the second transistor is electrically connected to the third circuit;
  one of a source and a drain of the third transistor and a gate of the third transistor are electrically connected to each other;
  the other of the source and the drain of the third transistor, one of a source and a drain of the fourth transistor, and a gate of the fifth transistor are directly connected to each other;
  one of a source and a drain of the fifth transistor, one of a source and a drain of the sixth transistor, a gate of the seventh transistor, one of a source and a drain of the eighth transistor, a gate of the tenth transistor and a gate of the twelfth transistor are electrically connected to each other;
  one of a source and a drain of the ninth transistor and one of a source and a drain of the tenth transistor are electrically connected to the first circuit and the third circuit;
  one of a source and a drain of the eleventh transistor and one of a source and a drain of the twelfth transistor are electrically connected to an output terminal;
  the other of the source and the drain of the ninth transistor and the other of the source and the drain of the eleventh transistor are electrically connected to a first wiring;
  the other of the source and the drain of the second transistor, the other of the source and the drain of the fourth transistor, the other of the source and the drain of the sixth transistor, the other of the source and the drain of the seventh transistor, and the other of the source and the drain of the eighth transistor are electrically connected to a second wiring; and
  the other of the source and the drain of the twelfth transistor is electrically connected to a third wiring.

7. The semiconductor device according to claim 6, wherein the first wiring has a function of supplying a clock signal to the second circuit.

8. The semiconductor device according to claim 6, wherein each of the first transistor to the twelfth transistor comprises an amorphous silicon.

9. A semiconductor device comprising:
a first circuit, a second circuit and a third circuit,
wherein each of the first circuit, the second circuit and the third circuit comprises a first transistor to a twelfth transistor,
wherein in the second circuit,
  one of a source and a drain of the first transistor, one of a source and a drain of the second transistor, a gate of the fourth transistor, one of a source and a drain of the seventh transistor, a gate of the eighth transistor, a gate of the ninth transistor, and a gate of the eleventh transistor are electrically connected to each other;
  a gate of the first transistor and a gate of the sixth transistor are directly connected to the first circuit;

a gate of the second transistor is electrically connected to the third circuit;

one of a source and a drain of the third transistor and a gate of the third transistor are electrically connected to each other;

the other of the source and the drain of the third transistor, one of a source and a drain of the fourth transistor, and a gate of the fifth transistor are directly connected to each other;

one of a source and a drain of the fifth transistor, one of a source and a drain of the sixth transistor, a gate of the seventh transistor, one of a source and a drain of the eighth transistor, a gate of the tenth transistor and a gate of the twelfth transistor are electrically connected to each other;

one of a source and a drain of the ninth transistor and one of a source and a drain of the tenth transistor are electrically connected to the first circuit and the third circuit;

one of a source and a drain of the eleventh transistor and one of a source and a drain of the twelfth transistor are electrically connected to an output terminal;

the other of the source and the drain of the ninth transistor and the other of the source and the drain of the eleventh transistor are electrically connected to a first wiring;

the other of the source and the drain of the second transistor, the other of the source and the drain of the fourth transistor, the other of the source and the drain of the sixth transistor, the other of the source and the drain of the seventh transistor, and the other of the source and the drain of the eighth transistor are electrically connected to a second wiring;

the other of the source and the drain of the twelfth transistor is electrically connected to a third wiring; and the other of the source and the drain of the fifth transistor and a gate of the third transistor are electrically connected to each other.

10. The semiconductor device according to claim 9, wherein the first wiring has a function of supplying a clock signal to the second circuit.

11. The semiconductor device according to claim 9, wherein each of the first transistor to the twelfth transistor comprises an amorphous silicon.

* * * * *